United States Patent
Liang et al.

(10) Patent No.: US 12,404,166 B2
(45) Date of Patent: Sep. 2, 2025

(54) MANUFACTURING METHOD OF DEVICE

(71) Applicant: xMEMS Labs, Inc., Santa Clara, CA (US)

(72) Inventors: Jemm Yue Liang, Sunnyvale, CA (US); Chiung C. Lo, San Jose, CA (US); Martin George Lim, Hillsborough, CA (US); Wen-Chien Chen, New Taipei (TW); Michael David Housholder, San Jose, CA (US); David Hong, Los Altos, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 503 days.

(21) Appl. No.: 17/955,562

(22) Filed: Sep. 29, 2022

(65) Prior Publication Data

US 2023/0023306 A1    Jan. 26, 2023

Related U.S. Application Data

(60) Division of application No. 17/842,810, filed on Jun. 17, 2022, now Pat. No. 11,884,535, which is a
(Continued)

(51) Int. Cl.
*H04R 31/00* (2006.01)
*B81B 3/00* (2006.01)

(52) U.S. Cl.
CPC .......... *B81B 3/0021* (2013.01); *B81B 3/0051* (2013.01); *B81B 3/0072* (2013.01);
(Continued)

(58) Field of Classification Search
CPC ... B81B 3/0021; B81B 3/0051; B81B 3/0072; B81B 2201/0257; B81B 2203/0127; B81B 2203/0163; B81B 2207/03; H04R 31/00
See application file for complete search history.

(56) References Cited

U.S. PATENT DOCUMENTS

| 5,970,998 A | 10/1999 | Talbot |
| 8,532,320 B2 | 9/2013 | Nordahn |

(Continued)

FOREIGN PATENT DOCUMENTS

| CN | 101785327 A | 7/2010 |
| CN | 104540776 A | 4/2015 |

(Continued)

OTHER PUBLICATIONS

Wang Zhicheng, Stylish structure and innovative features of new generation speakers, Household Electric Appliances, Issue 12, 2003, p. 38-40, China Academic Journal Electronic Publishing House ,2003.

(Continued)

*Primary Examiner* — Paul D Kim
(74) *Attorney, Agent, or Firm* — Winston Hsu

(57) ABSTRACT

A manufacturing method for a device includes: providing a wafer including a first layer and a second layer; forming and patterning an actuating material formed on the wafer; patterning the first layer of the wafer to form a trench line; and removing a first part of the second layer. The first layer forms a film structure including a membrane. A slit is formed within and penetrates through the membrane because of the trench line. The film structure is actuated to form a vent temporarily because of the slit. An ear canal and an ambient of a wearable sound device are to be connected via the vent temporarily opened. The slit divides the membrane into a first membrane portion and a second membrane portion. A difference between the displacements of these two membrane portions is larger than a thickness of the membrane when the vent is formed.

10 Claims, 52 Drawing Sheets

Related U.S. Application Data continuation-in-part of application No. 17/344,980, filed on Jun. 11, 2021, now Pat. No. 11,399,228.

(60) Provisional application No. 63/050,763, filed on Jul. 11, 2020, provisional application No. 63/051,885, filed on Jul. 14, 2020, provisional application No. 63/171,919, filed on Apr. 7, 2021, provisional application No. 63/320,703, filed on Mar. 17, 2022.

(52) U.S. Cl.
CPC ...... H04R 31/00 (2013.01); *B81B 2201/0257* (2013.01); *B81B 2203/0127* (2013.01); *B81B 2203/0163* (2013.01); *B81B 2207/03* (2013.01)

(56) References Cited

U.S. PATENT DOCUMENTS

| | | | |
|---|---|---|---|
| 8,724,200 B1 | 5/2014 | Wu | |
| 10,067,734 B2 | 9/2018 | Watson | |
| 10,367,540 B1 | 7/2019 | Medapalli | |
| 10,433,068 B2 * | 10/2019 | Perletti | B81B 3/0021 |
| 11,122,360 B2 * | 9/2021 | Pedersen | H04R 1/283 |
| 11,197,088 B2 * | 12/2021 | Naderyan | H04R 19/04 |
| 11,323,797 B2 | 5/2022 | Liang | |
| 11,399,228 B2 | 7/2022 | Liang | |
| 11,865,581 B2 * | 1/2024 | Gattere | B81B 7/0016 |
| 2003/0029705 A1 | 2/2003 | Qiu | |
| 2006/0131163 A1 | 6/2006 | Mei | |
| 2007/0007858 A1 | 1/2007 | Sorensen | |
| 2008/0267416 A1 | 10/2008 | Goldstein | |
| 2010/0020991 A1 | 1/2010 | Chen | |
| 2011/0013300 A1 | 1/2011 | Wu | |
| 2011/0051985 A1 | 3/2011 | Hwang | |
| 2011/0103616 A1 | 5/2011 | Kwon | |
| 2011/0181150 A1 | 7/2011 | Mahameed | |
| 2012/0053393 A1 | 3/2012 | Kaltenbacher | |
| 2012/0082335 A1 | 4/2012 | Duisters | |
| 2013/0121509 A1 | 5/2013 | Hsu | |
| 2013/0223023 A1 | 8/2013 | Dehe | |
| 2014/0140558 A1 | 5/2014 | Kwong | |
| 2015/0163599 A1 | 6/2015 | Shim | |
| 2015/0204940 A1 | 7/2015 | Teeter | |
| 2015/0237438 A1 | 8/2015 | Lee | |
| 2016/0176704 A1 | 6/2016 | Cargill | |
| 2016/0381464 A1 | 12/2016 | Elyada | |
| 2017/0011600 A1 | 1/2017 | Joung | |
| 2017/0021391 A1 | 1/2017 | Guedes | |
| 2017/0040012 A1 | 2/2017 | Goldstein | |
| 2017/0041708 A1 | 2/2017 | Barzen | |
| 2017/0164115 A1 | 6/2017 | van Halteren | |
| 2017/0201192 A1 | 7/2017 | Tumpold | |
| 2017/0217761 A1 | 8/2017 | Chung | |
| 2017/0260044 A1 | 9/2017 | Cargill | |
| 2017/0325030 A1 | 11/2017 | Stoppel | |
| 2018/0002168 A1 | 1/2018 | Cargill | |
| 2018/0020194 A1 | 1/2018 | Kim | |
| 2018/0120938 A1 | 5/2018 | Frescas | |
| 2019/0039880 A1 | 2/2019 | Paci | |
| 2019/0098390 A1 | 3/2019 | Carino | |
| 2019/0181776 A1 | 6/2019 | Tumpold | |
| 2019/0208343 A1 | 7/2019 | Monti | |
| 2019/0215599 A1 | 7/2019 | Na | |
| 2019/0215620 A1 | 7/2019 | Albahri | |
| 2019/0349665 A1 | 11/2019 | Grinker | |
| 2020/0100033 A1 | 3/2020 | Stoppel | |
| 2020/0178000 A1 | 6/2020 | Niekiel | |
| 2020/0178003 A1 | 6/2020 | Zurbruegg | |
| 2020/0193973 A1 | 6/2020 | Tolomei | |
| 2020/0196067 A1 | 6/2020 | Rusconi Clerici Beltrami | |
| 2020/0211521 A1 | 7/2020 | Voss | |
| 2020/0213770 A1 | 7/2020 | Duan | |
| 2020/0244275 A1 | 7/2020 | Marzin | |
| 2020/0352788 A1 | 11/2020 | Van 'T Hof | |
| 2021/0281940 A1 | 9/2021 | Zhao | |
| 2022/0014836 A1 | 1/2022 | Liang | |
| 2022/0225031 A1 | 7/2022 | Liang | |

FOREIGN PATENT DOCUMENTS

| | | | |
|---|---|---|---|
| CN | 105009604 A | 10/2015 | |
| CN | 106937193 A | 7/2017 | |
| CN | 107223346 A | 9/2017 | |
| CN | 108702575 A | 10/2018 | |
| CN | 110022506 A | 7/2019 | |
| CN | 209402687 U | 9/2019 | |
| CN | 111063790 A | 4/2020 | |
| CN | 215773542 U | 2/2022 | |
| CN | 114788300 A | 7/2022 | |
| EP | 3 896 990 A1 | 10/2021 | |
| JP | 11-307441 A | 11/1999 | |
| JP | 2003-153586 A | 5/2003 | |
| JP | 2009-512375 A | 3/2009 | |
| JP | 2009-525629 A | 7/2009 | |
| JP | 2012-249184 A | 12/2012 | |
| JP | 2012-249187 A | 12/2012 | |
| JP | 2016-51915 A | 4/2016 | |
| JP | 2017-112531 A | 6/2017 | |
| JP | 2020-31444 A | 2/2020 | |
| JP | 2022-16392 A | 1/2022 | |
| KR | 10-2010-0002351 A | 1/2010 | |
| KR | 10-2012-0034085 A | 4/2012 | |
| KR | 10-2015-0030691 A | 3/2015 | |
| KR | 10-2015-0097292 A | 8/2015 | |
| KR | 10-2017-0139320 A | 12/2017 | |
| KR | 10-2022-0007717 A | 1/2022 | |
| KR | 10-2022-0103042 A | 7/2022 | |
| TW | 201711484 A | 3/2017 | |
| TW | 1650025 B | 2/2019 | |
| TW | 202203662 A | 1/2022 | |
| WO | 2015/076006 A1 | 5/2015 | |
| WO | 2019/177324 A1 | 9/2019 | |
| WO | 2021/202023 A1 | 10/2021 | |

OTHER PUBLICATIONS

Zhou Xiao-wei et al., Preliminary evaluation of predicative performance of BAHA softband in the conductive or mixed hearing loss patients, Journal of Otolaryngology and Ophthalmology of Shandong University, vol. 29, Issue No. 2, 2015, p. 28-30, China Academic Journal Electronic Publishing House. ,Apr. 16, 2015.

Stefan Liebich et al., active occlusion cancellation with hear-through equalization for headphones, Institute of Communication Systems, 2018 IEEE international conference on acoustics, speech and signal processing. Canada ,Apr. 2018.

Liang, the specification, including the claims, and drawings in the U.S. Appl. No. 17/344,983, filed Jun. 11, 2021.

Hyonse Kim et al, A slim type microvalve driven by PZT films, Sensors and Actuators A: Physical, Jan. 18, 2005, pp. 162-171, vol. 121, Elsevier B. V., XP027806904.

Shen Guohao et al., Structure optimization design for capacitive silicon-based MEMS microphone, Semiconductor Devices, vol. 43, No. 12, p. 912-917, China Academic Journal Electronic Publishing House. ,Dec. 3, 2018.

Hua Qing et al., Acoustoeletric model of piezoelectric microphone with package structure, Transducer and Microsystem Technologies, 2018 vol. 37, No. 11, p. 42-44, China Academic Journal Electronic Publishing House. ,Nov. 30, 2018.

Chen Guidong et al., Highly sensitive MEMS humidity sensor based on candle-soot nanoparticle layer , Micronanoelectronic Technology, vol. 57, No. 1, p. 36-40, p. 48, China Academic Journal Electronic Publishing House ,Jan. 2020.

* cited by examiner

MANUFACTURING METHOD OF DEVICE

CROSS REFERENCE TO RELATED APPLICATIONS

This application is a division of U.S. application Ser. No. 17/842,810, filed on Jun. 17, 2022, now U.S. Pat. No. 11,884,535, which is a continuation-in-part of U.S. application Ser. No. 17/344,980, filed on Jun. 11, 2021, now U.S. Pat. No. 11,399,228, which claims the benefit of U.S. Provisional Application No. 63/050,763, filed on Jul. 11, 2020, and claims the benefit of U.S. Provisional Application No. 63/051,885, filed on Jul. 14, 2020, and claims the benefit of U.S. Provisional Application No. 63/171,919, filed on Apr. 7, 2021. Besides, U.S. application Ser. No. 17/842,810 claims the benefit of U.S. Provisional Application No. 63/320,703, filed on Mar. 17, 2022. The contents of these applications are incorporated herein by reference.

BACKGROUND OF THE INVENTION

1. Field of the Invention

The present application relates to a manufacturing method of a device, and more particularly, to a manufacturing method of a device capable of suppressing an occlusion effect.

2. Description of the Prior Art

Nowadays, wearable sound devices, such as in-ear (insert into ear canal) earbuds, on-ear or over-ear earphones, etc. are generally used for producing sound or receiving sound. Magnet and moving coil (MMC) based microspeaker have been developed for decades and widely used in many such devices. Recently, MEMS (Micro Electro Mechanical System) acoustic transducers which make use of a semiconductor fabrication process can be sound producing/receiving components in the wearable sound devices.

Occlusion effect is due to the sealed volume of ear canal causing loud perceived sound pressure by the listener. For example, the occlusion effect occurs while the listener does specific motion(s) generating a bone-conducted sound (such as walking, jogging, talking, eating, touching the acoustic transducer, etc.) and uses the wearable sound device (e.g., the wearable sound device is filled in his/her ear canal). The occlusion effect is particularly strong toward bass due to the difference of acceleration based SPL (sound pressure level) generation ($SPL \propto a = dD^2/dt^2$) and compression based SPL generation ($SPL \propto D$). For instance, a displacement of merely 1 μm at 20 Hz will cause a SPL=1 μm/25 mm atm=106 dB in occluded ear canal (25 mm is average length of adult ear canals). Therefore, if the occlusion effect occurs, listener hears the occlusion noise, and the quality of listener experience is bad.

In the traditional technology, the wearable sound device has an airflow channel existing between the ear canal and the ambient external to the device, such that the pressure caused by the occlusion effect can be released from this airflow channel to suppress the occlusion effect. However, because the airflow channel always exists, in the frequency response, the SPL in the lower frequency (e.g., lower than 500 Hz) has a significant drop. For example, if the traditional wearable sound device uses a typical 115 dB speaker driver, the SPL in 20 Hz is much lower than 110 dB. In addition, if a size of a fixed vent configured to form the airflow channel is greater, the SPL drop will be greater, and the water and dust protection will become more difficult.

In some cases, the traditional wearable sound device may use a speaker driver stronger than the typical 115 dB speaker driver to compensate for the loss of SPL in lower frequency due to the existence of the airflow channel. For example, assuming the loss of SPL is 20 dB, then the required speaker driver to maintain the same 115 dB SPL in the presence of the airflow channel will be 135 dB SPL, were it to be used in a sealed ear canal. However, the 10× stronger bass output requires the speaker membrane travel to also increase by 10× which implies the heights of both the coil and the magnet flux gap of the speaker driver need to be increased by 10×. Thus, it is difficult to make the traditional wearable sound device having the strong speaker driver have the small size and light weight.

Therefore, it is necessary to improve the prior art, so as to suppress the occlusion effect.

SUMMARY OF THE INVENTION

It is therefore a primary objective of the present invention to provide a manufacturing method of a device capable of suppressing an occlusion effect.

An embodiment of the present invention provides a manufacturing method for a device. The method includes: providing a wafer, wherein the wafer includes a first layer and a second layer; forming and patterning an actuating material formed on a first side of the wafer; patterning the first layer of the wafer, so as to form a trench line; and removing a first part of the second layer of the wafer. A second part of the second layer forms at least one anchor structure, the patterned first layer forms a film structure anchored by the anchor structure, and the film structure includes a membrane. A slit is formed within and penetrates through the membrane because of the trench line. The film structure is configured to be actuated to form a vent temporarily, and the vent is formed because of the slit. The device is disposed within a wearable sound device or to be disposed within the wearable sound device, and the film structure partitions a space into a first volume to be connected to an ear canal of a wearable sound device user and a second volume to be connected to an ambient of the wearable sound device. The ear canal and the ambient are to be connected via the vent temporarily opened. The slit divides the membrane into a first membrane portion and a second membrane portion, the first membrane portion is actuated to have a first displacement, and the second membrane portion is actuated to have a second displacement. Over a segment of the slit, a difference between the first displacement of the first membrane portion and the second displacement of the second membrane portion is larger than a thickness of the membrane, and the vent is formed over the segment of the slit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
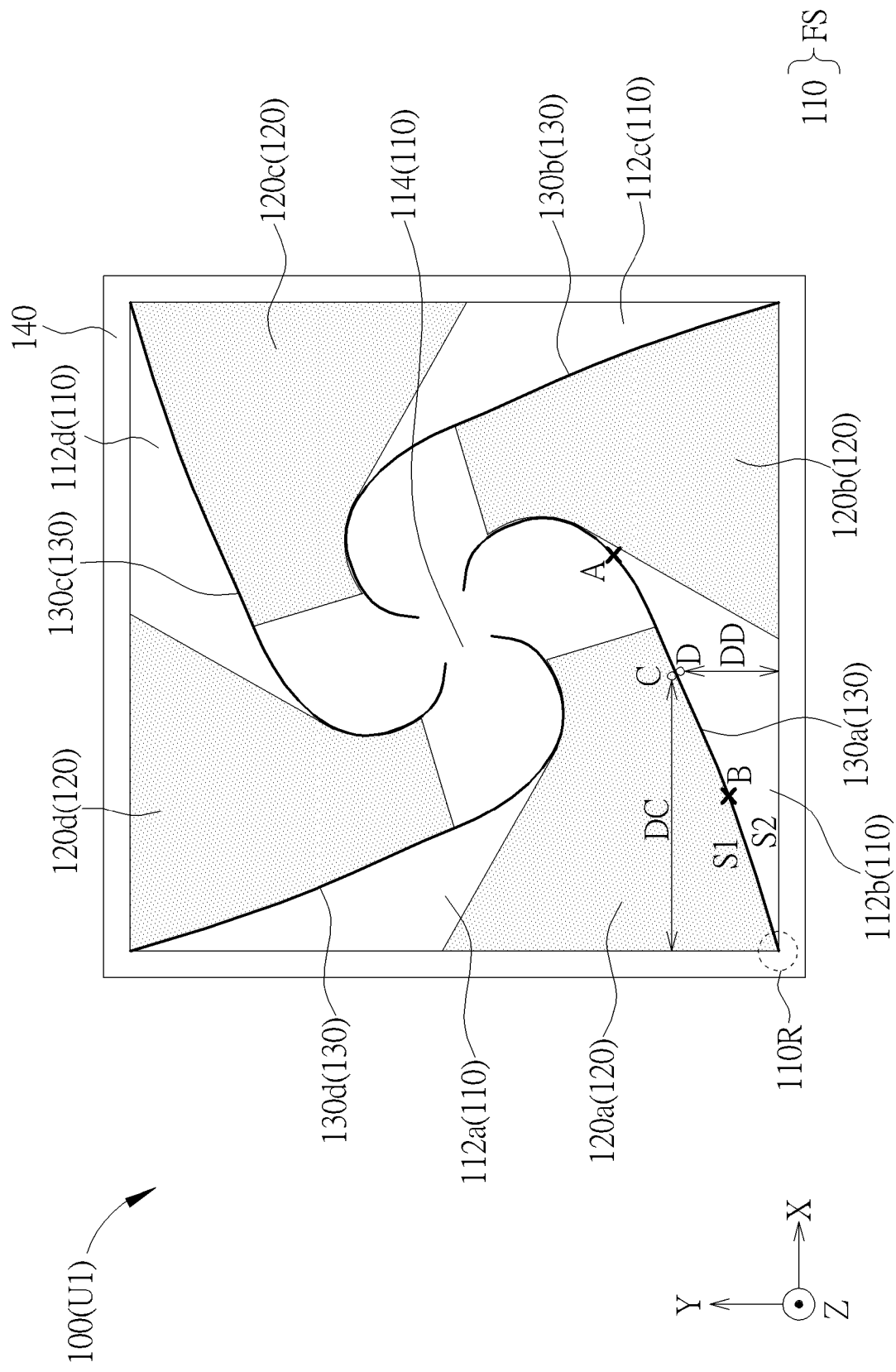
FIG. 1 is a schematic diagram of a top view illustrating a device according to a first embodiment of the present invention.

To provide a better understanding of the present invention to those skilled in the art, preferred embodiments and typical material or range parameters for key components will be detailed in the follow description. These preferred embodiments of the present invention are illustrated in the accompanying drawings with numbered elements to elaborate on the contents and effects to be achieved. It should be noted that the drawings are simplified schematics, and the material and parameter ranges of key components are illustrative based on the present day technology, and therefore show only the components and combinations associated with the present invention, so as to provide a clearer description for the basic structure, implementing or operation method of the present invention. The components would be more complex in reality and the ranges of parameters or material used may evolve as technology progresses in the future. In addition, for ease of explanation, the components shown in the drawings may not represent their actual number, shape, and dimensions; details may be adjusted according to design requirements.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present invention, the corresponding features, areas, steps, operations and/or components would be pointed to existence, but not limited to the existence of one or a plurality of the corresponding features, areas, steps, operations and/or components.

In the following description and in the claims, when "a A1 component is formed by/of B1", B1 exist in the formation of A1 component or B1 is used in the formation of A1 component, and the existence and use of one or a plurality of other features, areas, steps, operations and/or components are not excluded in the formation of A1 component.

In the following description and in the claims, the term "substantially" generally means a small deviation may exist or not exist. For instance, the terms "substantially parallel" and "substantially along" means that an angle between two components may be less than or equal to a certain degree threshold, e.g., 10 degrees, 5 degrees, 3 degrees or 1 degree. For instance, the term "substantially aligned" means that a deviation between two components may be less than or equal to a certain difference threshold, e.g., 2 μm or 1 μm. For instance, the term "substantially the same" means that a deviation is within, e.g., 10% of a given value or range, or mean within 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification, and the terms do not relate to the sequence of the manufacture if the specification do not describe. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present invention.

In the present invention, the (MEMS, Micro Electro Mechanical System) device capable of suppressing an occlusion effect may be related to an acoustic apparatus and/or disposed within an acoustic apparatus (such as a wearable sound device). For instance, the device may be disposed within the wearable sound device (e.g., an in-ear device), but not limited thereto.

The device may or may not perform an acoustic transformation based on requirement(s), wherein the acoustic transformation may convert signals (e.g. electric signals or signals with other suitable type) into an acoustic wave, or may convert an acoustic wave into signals with other suitable type (e.g. electric signals). In some embodiments, the device may perform the acoustic transformation to serve as an acoustic transducer, wherein the acoustic transducer may be a sound producing device, a speaker, a micro speaker or other suitable device, so as to convert the electric signals into the acoustic wave, but not limited thereto. In some embodiments, the device performing the acoustic transformation serves as an acoustic transducer, wherein the acoustic transducer may be a sound measuring device, a microphone or other suitable device, so as to convert the acoustic wave into the electric signals, but not limited thereto. In this case, the device may perform the acoustic transformation and suppress the occlusion effect.

In some embodiments, the device may not perform the acoustic transformation, so as to be a component in the acoustic apparatus (e.g., the wearable sound device), wherein the device is configured to suppress the occlusion effect.

In the following, the device of the present invention may be related to and disposed in the acoustic apparatus configured to produce the acoustic wave, and the following explanation is configured to make those skilled in the art better understand the present invention. Note that an operation of the device means that the acoustic transformation (e.g., the acoustic wave is produced according to electrical driving signal) and/or the function of suppressing the occlusion effect is performed by the device.

Figure 2:
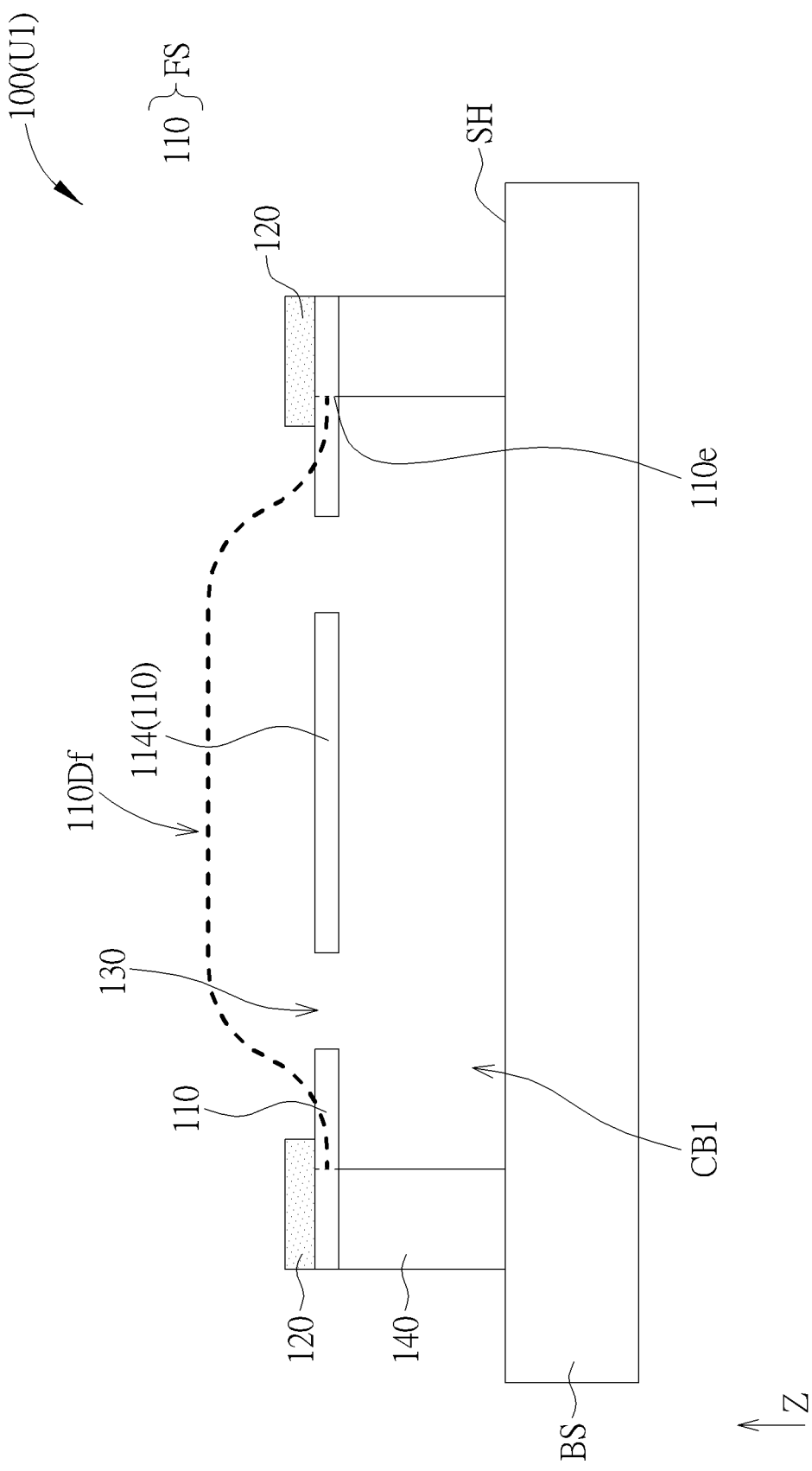
FIG. 2 is a schematic diagram of a cross sectional view illustrating a device according to the first embodiment of the present invention.
Figure 3A:
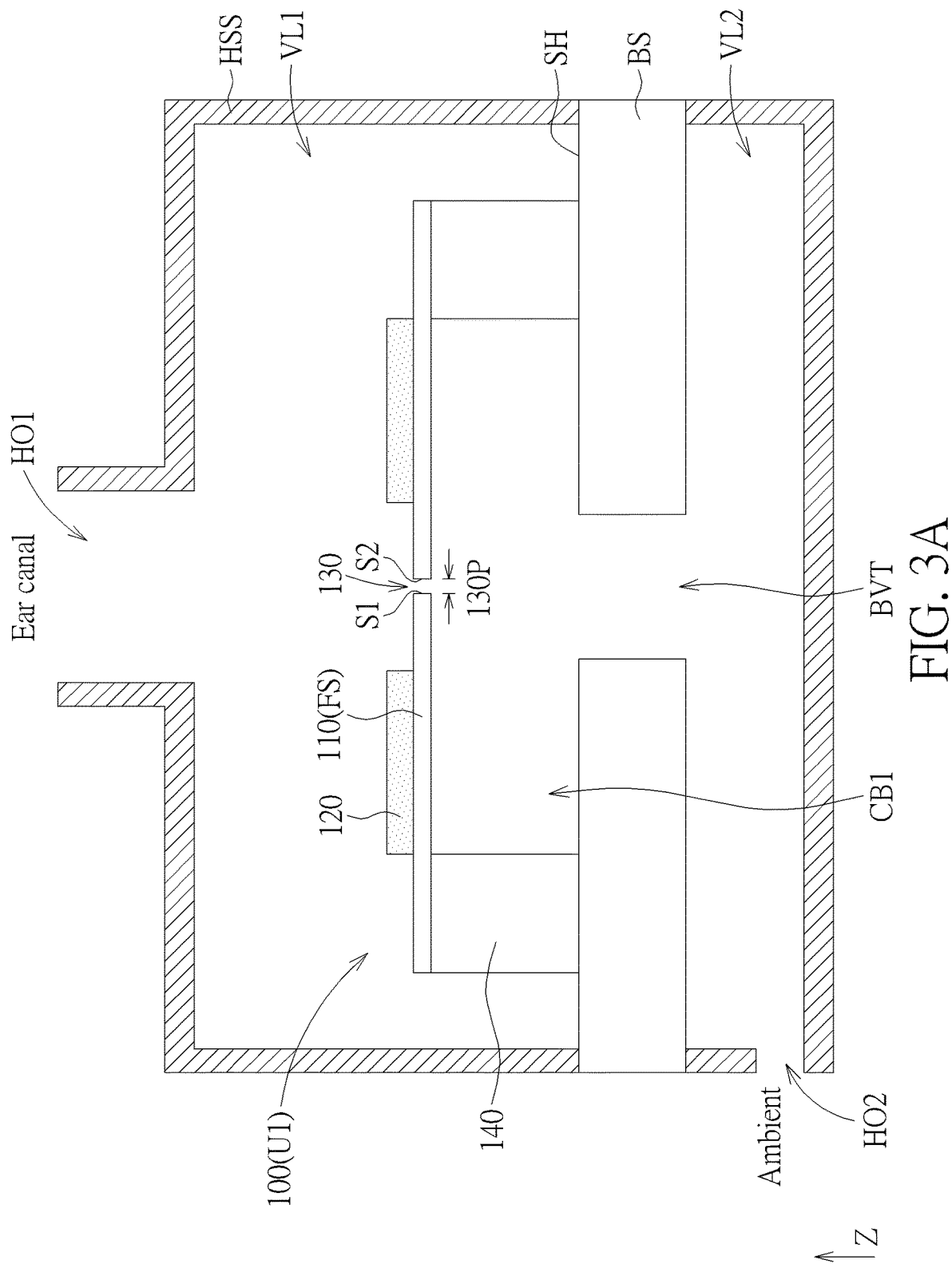
FIG. 3A is a schematic diagram of a cross sectional view illustrating a device and a housing structure according to the first embodiment of the present invention.

Referring to FIG. 1 to FIG. 3A, FIG. 1 is a schematic diagram of a top view illustrating a device according to a first embodiment of the present invention, FIG. 2 is a schematic diagram of a cross sectional view illustrating a device according to the first embodiment of the present invention, and FIG. 3A is a schematic diagram of a cross sectional view illustrating a device and a housing structure according to the first embodiment of the present invention. As shown in FIG. 1 and FIG. 2, the device 100 includes a base BS. The base BS may be hard or flexible, wherein the base BS may include silicon, germanium, glass, plastic, quartz, sapphire, metal, polymer (e.g., polyimide (PI), polyethylene terephthalate (PET)), any other suitable material or a combination thereof. As an example, the base BS may be a circuit board including a laminate (e.g., copper clad laminate, CCL), a land grid array (LGA) board or any other suitable board containing conductive material, but not limited thereto. In some embodiments, the base BS may be a substrate.

In FIG. 1 and FIG. 2, the base BS has a horizontal surface SH parallel to a direction X and a direction Y, wherein the direction Y is not parallel to the direction X (e.g., the direction X may be perpendicular to the direction Y). Note that the direction X and the direction Y of the present invention may be considered as horizontal directions.

The device 100 includes a film structure FS and at least one anchor structure 140 disposed on the horizontal surface SH of the base BS, wherein the film structure FS is anchored by the anchor structure 140. As shown in FIG. 1, the device 100 may include four anchor structures 140, and the film structure FS includes a first membrane 110. The anchor structure 140 is disposed outside the first membrane 110 and connected to at least one of outer edges 110e of the first membrane 110, wherein the outer edges 110e of the first membrane 110 define a boundary of the first membrane 110. For example, the anchor structures 140 may surround the first membrane 110 and be connected to all outer edges 110e of the first membrane 110, but not limited thereto.

In the operation of the device 100, the first membrane 110 can be actuated to have a movement. In this embodiment, the first membrane 110 may be actuated to move upwardly and downwardly, but not limited thereto. For example, in FIG. 2, when the first membrane 110 is actuated, the first membrane 110 may deform into a deformed type 110Df, but not limited thereto. Note that, in the present invention, the terms "move upwardly" and "move downwardly" represent that the membrane moves substantially along a direction Z parallel to a normal direction of the first membrane 110 or parallel to a normal direction of the horizontal surface SH of the base BS (i.e., the direction Z may be perpendicular to the direction X and the direction Y).

During the operation of the device 100, the anchor structure 140 may be immobilized. Namely, the anchor structure 140 may be a fixed end (or fixed edge) respecting the first membrane 110 during the operation of the device 100.

The first membrane 110 (the film structure FS) and the anchor structure 140 may include any suitable material(s). In some embodiments, the first membrane 110 (the film structure FS) and the anchor structure 140 may individually include silicon (e.g., single crystalline silicon or poly-crystalline silicon), silicon compound (e.g., silicon carbide, silicon oxide), germanium, germanium compound (e.g., gallium nitride or gallium arsenide), gallium, gallium compound, stainless steel or a combination thereof, but not limited thereto. The first membrane 110 and the anchor structure 140 may have the same material or different materials.

In addition, owing to the existence of the first membrane 110 and the anchor structure 140, a chamber CB1 may exist between the base BS and the first membrane 110. In this embodiment, the base BS may further include a back vent BVT (e.g., the back vent BVT shown in FIG. 3A), and the chamber CB1 may be connected to the rear outside of the device 100 (i.e., a space back of the base BS) through the back vent BVT.

The device 100 includes a first actuator 120 disposed on the first membrane 110 (the film structure FS) and configured to actuate the first membrane 110 (the film structure FS). For instance, in FIG. 1 and FIG. 2, the first actuator 120 may be in contact with the first membrane 110, but not limited thereto. Furthermore, in this embodiment, as shown in FIG. 1 and FIG. 2, the first actuator 120 may not totally overlap the first membrane 110, as shown in the direction Z perspective of FIG. 1, but not limited thereto. Optionally, in FIG. 2, the first actuator 120 may be disposed on and overlap the anchor structure 140, but not limited thereto. In another embodiment, the first actuator 120 may not overlap the anchor structure 140, as shown in the direction Z perspective of FIG. 1, but not limited thereto.

The first actuator 120 has a monotonic electromechanical converting function with respect to the movement of the first membrane 110 along the direction Z. In some embodiments, the first actuator 120 may include a piezoelectric actuator, an electrostatic actuator, a nanoscopic-electrostatic-drive (NED) actuator, an electromagnetic actuator or any other suitable actuator, but not limited thereto. For example, in an embodiment, the first actuator 120 may include a piezoelectric actuator, the piezoelectric actuator may contain such as two electrodes and a piezoelectric material layer (e.g., lead zirconate titanate, PZT) disposed between the electrodes, wherein the piezoelectric material layer may actuate the first membrane 110 based on driving signals (e.g., driving voltages) received by the electrodes, but not limited thereto. For example, in another embodiment, the first actuator 120 may include an electromagnetic actuator (such as a planar coil), wherein the electromagnetic actuator may actuate the first membrane 110 based on a received driving signals (e.g., driving current) and a magnetic field (i.e. the first membrane 110 may be actuated by the electromagnetic force), but not limited thereto. For example, in still another embodiment, the first actuator 120 may include an electrostatic actuator (such as conducting plate) or a NED actuator, wherein the electrostatic actuator or the NED actuator may actuate the first membrane 110 based on a received driving signals (e.g., driving voltage) and an electrostatic field (i.e. the first membrane 110 may be actuated by the electrostatic force), but not limited thereto.

In this embodiment, the first membrane 110 and the first actuator 120 may be configured to perform an acoustic transformation. That is to say, the acoustic wave is produced due to the movement of the first membrane 110 actuated by the first actuator 120, and the movement of the first membrane 110 is related to a sound pressure level (SPL) of the acoustic wave.

The first actuator 120 may actuate the first membrane 110 to produce the acoustic wave based on received driving signal(s). The acoustic wave is corresponding to an input audio signal, and the driving signal is corresponding to (related to) the input audio signal.

In some embodiments, the acoustic wave, the input audio signal and the driving signal have the same frequency, but not limited thereto. That is to say, the device 100 produces a sound at the frequency of sound (i.e., the device 100 generates the acoustic wave complying with the zero-mean-flow assumption of classic acoustic wave theorems), but not limited thereto.

As shown in FIG. 1 to FIG. 3A, the film structure FS of the device 100 includes at least one slit 130, wherein the slit 130 may have a first sidewall S1 and a second sidewall S2 opposite to the first sidewall S1. In the present invention, an gap 130P of the slit 130 exists between the first sidewall S1 and the second sidewall S2 in a plane parallel to the direction X and the direction Y (i.e., the gap 130P of the slit 130 is parallel to the horizontal surface SH of the base BS), wherein the width of the gap 130P of the slit 130 may be designed based on requirement(s) (e.g., the width may be, but not limited to, around 1 μm). In the present invention, based on the driving signal received by the first actuator 120, the slit 130 may generate a vent 130T (not shown in FIG. 1 to FIG. 3A but will be shown later on) between the first sidewall S1 and the second sidewall S2 temporarily (i.e., the film structure FS is configured to be actuated to form the vent 130T temporarily, and the first actuator 120 control the film structure FS to form the vent 130T temporarily), wherein the opening of vent 130T is in the direction Z, such the opening of vent 130T forms surfaces that are substantially perpendicular to the direction X and the direction Y. Note that, in the description and claims of the present application, "gap 130P" is in a plane parallel to the direction X and the direction Y, and shall refer to a space widthwise along the slit 130 (i.e., the space between the first sidewall S1 and the second sidewall S2 in the plane parallel to the direction X and the direction Y); "vent 130T" shall refer to a space between the first sidewall S1 and the second sidewall S2 in the direction Z (the normal direction of the horizontal surface SH of the base B S) perpendicular to the direction X and the direction Y.

In this embodiment, the first membrane 110 (the film structure FS) may be configured to be actuated to form the vent 130T, and the vent 130T is formed because of the slit 130. Furthermore, in some embodiment, the first membrane 110 may be configured to be actuated to perform the acoustic transformation and form the vent 130T, but not limited thereto. In some embodiment, the first membrane 110 may be configured to be actuated to form the vent 130T, and not to be actuated to perform the acoustic transformation, but not limited thereto.

The slit 130 may be any suitable type as long as it can generate a vent 130T between the first sidewall S1 and the second sidewall S2 based on the driving signal received by the first actuator 120.

The slit 130 may be disposed at any suitable position. In this embodiment, as shown in FIG. 1, the first membrane 110 may have the slit 130 (i.e., the slit 130 is a cut through the first membrane 110, so as to be formed within the first membrane 110), such that the first membrane 110 may include the first sidewall S1 and the second sidewall S2 of the slit 130, but not limited thereto.

In another embodiment (e.g., FIG. 10), the slit 130 may be a boundary of the first membrane 110, such that the first membrane 110 may include the first sidewall S1 of the slit 130 and not include the second sidewall S2 of the slit 130, and the first sidewall S1 of the slit 130 may be one of the outer edges 110e of the first membrane 110, but not limited thereto.

In the present invention, the number of the slit(s) 130 included in the device 100 may be adjusted based on requirement(s). For instance, as shown in FIG. 1, the device 100 may include four slits 130a, 130b, 130c and 130d, such that the first membrane 110 may include four membrane portions 112a, 112b, 112c and 112d divided by the slits 130a, 130b, 130c and 130d (i.e., each slit 130 divides the first membrane 110 into two membrane portions), but not limited thereto. In FIG. 1, the membrane portion 112a is between the slits 130a and 130d, the membrane portion 112b is between the slits 130a and 130b, and so on and so forth. Correspondingly, the first actuator 120 includes four actuating portions 120a, 120b, 120c and 120d disposed on the membrane portions 112a, 112b, 112c and 112d, respectively.

Therefore, the first sidewall S1 and second sidewall S2 of the slit 130 may respectively belong to different membrane portions of the first membrane 110. Taking the slit 130a as an example, the slit 130a is formed between the membrane portions 112a and 112b, such that the first sidewall S1 and second sidewall S2 of the slit 130a respectively belong to the membrane portions 112a and 112b. In other words, the membrane portion 112a and the actuating portion 120a are at one side of the slit 130a, and the membrane portion 112b and the actuating portion 120b are at another side of the slit 130a. For instance, a point C is on the first sidewall S1 of the slit 130a, and a point D is on the second sidewall S2 of the slit 130a, such that the point C and the point D respectively belong to membrane portions 112a and 112b and form a pair of points separated by the gap 130P of the slit 130a.

In the present invention, the shape/pattern of the slit 130 is not limited. For example, the slit 130 may be a straight slit, a curved slit, a combination of straight slits, a combination of curved slits or a combination of straight slit(s) and curved slit(s). In this embodiment, as shown in FIG. 1 and FIG. 2, the slit 130 may be a curved slit, but not limited thereto. In this embodiment, as shown in FIG. 1 and FIG. 2, the slit 130 may extend toward a central portion of the first membrane 110 e.g., from a corner 110R of the first membrane 110. In this embodiment, a curvature of the slit 130 may increase as the slit 130 extending from the corner 110R of the first membrane 110 toward the central portion of the first membrane 110, such that the slit 130 may form as a hook pattern, but not limited thereto. Specifically, taking the slit 130a as an example, a first radius of curvature at a point A on the slit 130a is smaller than a second radius of curvature at a point B on the slit 130a, where the point A is farther away from the corner 110R compared to the point B (i.e., a first length along the slit 130a between the point A and the corner 110R is larger than a second length along the slit 130a between the point B and the corner 110R), but not limited thereto. Moreover, as shown in FIG. 1, the slits 130 may extend inward on the first membrane 110 and form a vortex pattern, but not limited thereto.

In another aspect, as illustrated in FIG. 3A, the slit 130 may divide the first membrane 110 (the film structure FS) into two flaps opposite to each other. Namely, two membrane portions of the first membrane 110 divided by the slit 130 may be a first flap and a second flap respectively, such that the first sidewall S1 may belong to the first flap, and the second sidewall S2 may belong to the second flap. The first flap may include a first end and a second end (also referred as a free end), the first end may be anchored by one anchor structure 140, and the second end (i.e., the free end) may be configured to perform a first up-and-down movement (i.e., the second end of the first flap may move upwardly and downwardly) to form the vent 130T. The second flap may include a first end and a second end (also referred as a free end), the first end may be anchored by one anchor structure 140, and the second end (i.e., the free end) may be configured to perform a second up-and-down movement (i.e., the second end of the second flap may move upwardly and downwardly) to form the vent 130T. The movement of the free end of the second flap may be different from (e.g., in the embodiment of FIG. 4) or opposite to (e.g., in the embodiment of FIG. 8A) the movement of the free end of the first flap.

Taking the slit 130a formed between the membrane portions 112a and 112b in FIG. 1 as an example, the first sidewall S1 of the slit 130a may be on the free end of the first flap (i.e., the point C may be on the second end of the first flap), and the second sidewall S2 of the slit 130a may be on the free end of the second flap (i.e., the point D may be on the second end of the second flap), but not limited thereto.

Moreover, the slit 130 may release the residual stress of the first membrane 110, wherein the residual stress is generated during the manufacturing process of the first membrane 110 or originally exist in the first membrane 110.

As shown in FIG. 1 and FIG. 2, because of the arrangement of the slits 130, the first membrane 110 may optionally include a coupling plate 114 connected to the membrane portions 112a, 112b, 112c and 112d. In this embodiment, all membrane portions 112a, 112b, 112c and 112d are connected to the coupling plate 114, and the coupling plate 114 is surrounded by the membrane portions 112a, 112b, 112c and 112d (i.e., the coupling plate 114 is the central portion of the first membrane 110) and/or the slits 130, but not limited thereto. For instance, the coupling plate 114 is only connected to the membrane portions 112a, 112b, 112c and 112d, but not limited thereto. For instance, in FIG. 1, the first actuator 120 may not overlap the coupling plate 114 in the direction Z (the normal direction of the horizontal surface SH of the base BS), but not limited thereto. In this embodiment, since the coupling plate 114 exists, even if the structural strength of the first membrane 110 is weakened due to the formation of the slit 130, the breaking possibility of the first membrane 110 may be decreased and/or the break of the first membrane 110 may be prevented during the manufacture. In other words, the coupling plate 114 may maintain the structural strength of the first membrane 110 in a certain level.

Owing to the existence of the slit(s) 130, it may be considered that the first membrane 110 includes a plurality of spring structures which are formed because of the slit(s) 130. In FIG. 1 and FIG. 2, the spring structure is considered to be connected between the coupling plate 114 and a part of the first membrane 110 overlapping the first actuator 120.

Because of the existence of the spring structure, the displacement of the first membrane 110 may be increased and/or the first membrane 110 may deform elastically during the operation of the device 100.

In this embodiment, the device 100 may optionally include a chip disposed on the horizontal surface SH of the base BS, wherein the chip may include the film structure FS (including the first membrane 110 and the slit(s) 130), the anchor structure(s) 140 and the first actuator 120 at least. The manufacturing method of the chip is not limited. For example, in this embodiment, the chip may be formed by at least one semiconductor process to be a MEMS (Micro Electro Mechanical System) chip, but not limited thereto.

Note that the first membrane 110, the slit(s) 130, the first actuator 120 and the anchor structure 140 of the present invention may be considered as a first unit U1.

As shown in FIG. 3A, the device 100 is disposed within a housing structure HSS inside the wearable sound device. In FIG. 3A, the housing structure HSS may have a first housing opening HO1 and a second housing opening HO2, wherein the first housing opening HO1 may be connected to an ear canal of a wearable sound device user, the second housing opening HO2 may be connected to an ambient of the wearable sound device, and the film structure FS is between the first housing opening HO1 and the second housing opening HO2. Note that the ambient of the wearable sound device may not inside the ear canal (e.g., the ambient of the wearable sound device may be directly connected to the space outside the ear). Furthermore, in FIG. 3A, since the chamber CB1 may exist between the base BS and the first membrane 110 (the film structure FS), the chamber CB1 may be connected to the ambient of the wearable sound device through the back vent BVT of the base BS and the second housing opening HO2 of the housing structure HSS.

As shown in FIG. 3A, the first membrane 110 (the film structure FS including the first flap and the second flap) may partition a space formed within the housing structure HSS into a first volume VL1 to be connected to the ear canal of the wearable sound device user and a second volume VL2 to be connected to the ambient of the wearable sound device. Thus, when the vent 130T is temporarily formed/opened between the first sidewall S1 (i.e., the free/second end of the first flap) and the second sidewall S2 (i.e., the free/second end of the second flap) of the slit 130 in the direction Z (the normal direction of the horizontal surface SH of the base BS) by the actuation of the first actuator 120, the first volume VL1 is to be connected to the second volume VL2 through the vent 130T, such that the ambient of the wearable sound device and the ear canal of the wearable sound device user are connected to each other. That is to say, the ambient of the wearable sound device and the ear canal are to be connected via the temporarily opened vent 130T when the first membrane 110 is actuated. On the contrary, when the vent 130T is not formed between the first sidewall S1 (i.e., the free/second end of the first flap) and the second sidewall S2 (i.e., the free/second end of the second flap) of the slit 130 in the direction Z, the first volume VL1 is substantially disconnected from the second volume VL2, such that the ambient of the wearable sound device and the ear canal of the wearable sound device user are substantially separated from each other. That is to say, the ambient of the wearable sound device and the ear canal of the wearable sound device user are substantially separated (isolated) from each other when the vent 130T is not formed and/or the vent 130T is closed.

The condition "the vent 130T is closed" means the first sidewall S1 of the slit 130, (i.e. the free/second end of the first flap) overlaps partially or fully with the second sidewall S2 of the slit 130 (i.e. the free/second end of the second flap) in the horizontal direction, and the condition "the vent 130T is opened", or equivalently "the vent 130T is formed", means that the first sidewall S1 of the slit 130, (i.e. the free/second end of the first flap) does not overlap with the second sidewall S2 of the slit 130 (i.e. the free/second end of the second flap) in the horizontal direction. Note that the heights of first sidewall S1 and the second sidewall S2 are defined by the thickness of the first membrane 110.

In FIG. 3A, the first volume VL1 is connected to the first housing opening HO1 of the housing structure HSS, and the second volume VL2 is connected to the second housing opening HO2 of the housing structure HSS. Thus, the first volume VL1 is to be connected to the ear canal of the wearable sound device user through the first housing opening HO1, and the second volume VL2 is to be connected to the ambient of the wearable sound device through the second housing opening HO2. Note that the chamber CB1 is a portion of the second volume VL2.

Figure 4:
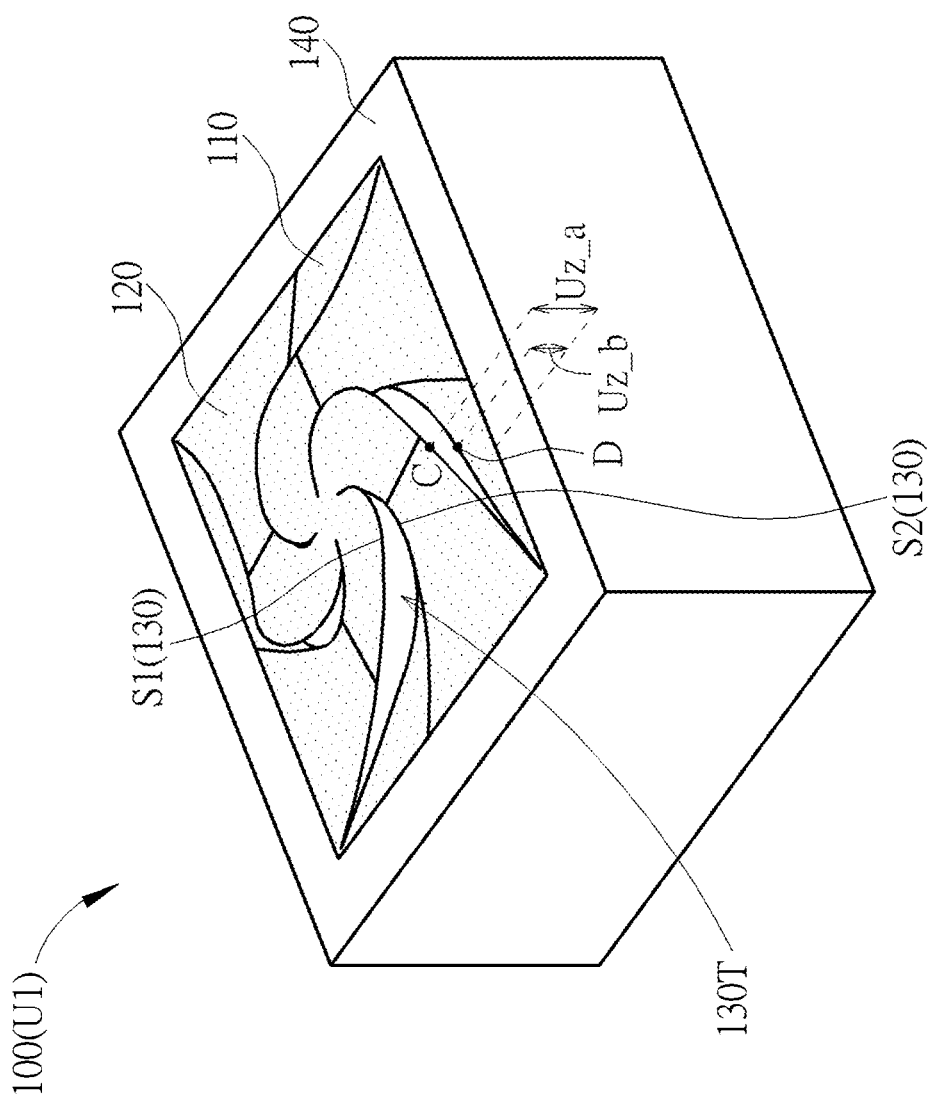
FIG. 4 is a schematic diagram illustrating a first membrane in a first mode according to the first embodiment of the present invention.

Further referring to FIG. 4, FIG. 4 is a schematic diagram illustrating a first membrane in a first mode according to the first embodiment of the present invention. As shown in FIG. 2 and FIG. 4, when the first membrane 110 is actuated, the first membrane 110 deforms into a deformed type 110Df. In the present invention, the device 100 may include a first mode and a second mode, wherein the first actuator 120 receives first driving signal(s) in the first mode to generate a vent 130T formed between the first sidewall S1 (i.e., the free/second end of the first flap) and the second sidewall S2 (i.e., the free/second end of the second flap) of the slit 130 in the direction Z (the normal direction of the horizontal surface SH of the base BS), and the first actuator 120 receives second driving signal(s) in the second mode to not generate the vent 130T between the first sidewall S1 and the second sidewall S2 of the slit 130 in the direction Z.

As shown in FIG. 4, in the first mode, the first sidewall S1 and the second sidewall S2 of the slit 130 may have different displacements, causing the overlapping across the gap 130P of slit 103 between the first sidewall S1 and the second sidewall S2 to change. When the difference between these displacements in direction Z is greater than the thickness of the first membrane 110 (the film structure FS), the first sidewall S1 is no longer overlapped with the second sidewall S2, an opening between the first sidewall S1 and the second sidewall S2 is formed and the vent 130T is said to be opened. Taking the points C and D on the two side of slit 130a of FIG. 1 as an example, when the first membrane 110 is actuated in the first mode, point C of the first sidewall S1 on the membrane portion 112a is actuated according to the first driving signal (e.g., a voltage) to have a first displacement $Uz\_a$ along the direction Z, point D on the second sidewall S2 on the membrane portion 112b is actuated according to the first driving signal to have a second displacement $Uz\_b$ along the direction Z, and the first displacement $Uz\_a$ of point C is significantly larger than the second displacement $Uz\_b$ of pint D, such that the segment of the first sidewall S1 near point C and the segment of the second sidewall S2 near point D become non-overlapping and the vent 130T is formed (or "opened"). The opening size $U_{ZO}$ of the vent 130T is determined by a membrane displacement difference $\Delta Uz$, between the first displacement $Uz\_a$ and the second displacement $Uz\_b$, and the thickness of the first membrane 110: $U_{ZO}=\Delta Uz-T110$, where $\Delta Uz=Uz\_a-Uz\_b$ T110 is the thickness of the first membrane 110 and T110 may be 5-7 μm in practice, but not limited thereto. When the membrane displacement difference $\Delta Uz$ is larger than the thickness T110 of the first membrane 110 (the film structure FS) in the first mode, it is said that the vent 130T will be "temporarily opened" (i.e., the vent 130T is opened by controlling the membrane portions). The larger is opening size $U_{ZO}$ of the vent 130T, the wider will the vent 130T opens.

When the vent 130T is temporarily opened, as illustrated in FIG. 4, the air may start to flow between the volumes (i.e., the first volume VL1 and the second volume VL2) due to the pressure difference between the two sides of the first membrane 110, such that the pressure caused by the occlusion effect may be released (i.e., the pressure difference between the ear canal and the ambient of the wearable sound device may be released through the airflow flowing through the vent 130T), so as to suppress the occlusion effect.

Rationale of forming the vent 130T is described below. Refer to points C and D of the slit 130a illustrated in FIG. 1. The point C is located on the first sidewall S1 on the membrane portion 112a, the point D is located on the second sidewall S2 on the membrane portion 112b, and the point D is opposite to the point C, across the gap 130P of the slit 130. The displacement of the membrane portion 112a at the point C is driven by the actuating portion 120a, and the displacement of the membrane portion 112b at the point D is driven by the actuating portion 120b. A distance DC from the point C to an anchor edge of the membrane portion 112a is longer than a distance DD from the point D to an anchor edge of the membrane portion 112b. Since less distance implies higher stiffness, deformation at the point D would be less than deformation of the point C, even applying the same driving force. In addition, the arrow DC overlaps with the region of the actuating portion while the arrow DD does not, which implies that the driving force applied by the actuating portion 120a at the point C is stronger than which applied by the actuating portion 120b at the point D. Combining those factors, the displacement of the membrane portion 112a at the point C, where driving force strength is stronger while stiffness is lower, would be larger than the displacement of the membrane portion 112b at the point D.

Figure 5A:
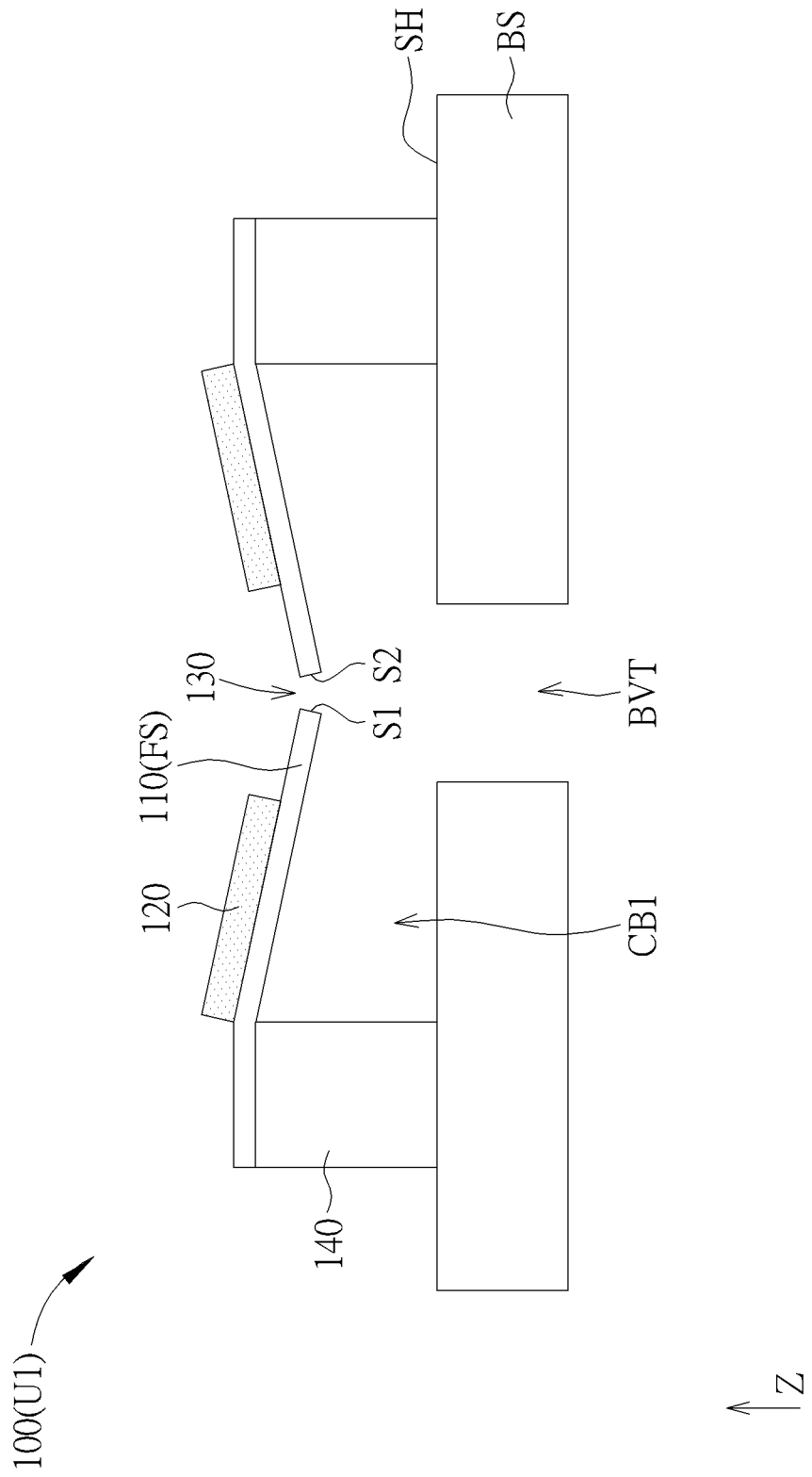
FIG. 5A is a schematic diagram of a cross sectional view illustrating a first membrane in a second mode or a third mode according to another embodiment of the present invention.

In the second mode, the membrane displacement difference is less than the thickness of the first membrane 110, namely $\Delta Uz \leq T110$, in other words, the sidewall at point C of the first sidewall S1 and the sidewall at point D of the second sidewall S2 may partially or fully overlap in the horizontal direction. For example, two membrane portions related to the slit 130 (i.e., the first flap and the second flap) in the second mode are shown in FIG. 3A, these two membrane portions (two flaps) may be substantially parallel to each other and be substantially parallel to the horizontal surface SH of the base BS, but not limited thereto. In another example, two membrane portions related to the slit 130 (e.g., the first flap and the second flap) in the second mode are shown in FIG. 5A, these two membrane portions (two flaps) may not be parallel to the horizontal surface SH of the base BS, the free/second end of the first flap (the first sidewall S1) may be closer to the base BS than the anchored/first end of the first flap, and the free/second end of the second flap (the second sidewall S2) may be closer to the base BS than the anchored/first end of the second flap, but not limited thereto, and $\Delta Uz \leq T110$. Thus, in either case where the slit 130 and its associated membrane portions is in the second mode, namely $\Delta Uz \leq T110$, the vent 130T is not opened/generated, and/or the vent 130T is closed.

In another embodiment, the device 100 may include a first mode, a second mode and a third mode, wherein the vent 130T is opened in the first mode (as shown in FIG. 4), the vent 130T is closed in the second mode (as shown in FIG. 3A) and the third mode (as shown in FIG. 5A), two membrane portions (two flaps) may be substantially parallel to the horizontal surface SH of the base BS in the second mode (as shown in FIG. 3A), and the free/second end of the two membrane portions (two flaps) may move/bend towards the base BS in the third mode (as shown in FIG. 5A).

The width of the gap 130P of the slit 130 should be sufficiently small, e.g., 1 μm~2 μm in practice. Airflow through narrow channels can be highly damped due to viscous forces/resistance along the walls of the airflow pathways, known as boundary layer effect within field of fluid mechanics. So, the airflow through the gap 130P of the slit 130 in the second mode may be much smaller compared to the airflow through the vent 130T of the slit 130 in the first mode (e.g., the airflow through the gap 130P of the slit 130 in the second mode may be negligible or 10 times lower than the airflow through the vent 130T of the slit 130 in the first mode). In other words, the width of the gap 130P of the slit 130 is sufficiently small such that, the airflow/leakage through the gap 130P of the slit 130 in the second mode is negligible compared to (e.g., less than 10% of) the airflow through the vent 130T in the first mode.

According to the above, in the first mode and the second mode (and the third mode), the first sidewall S1 serving as the free/second end of the first flap may perform the first up-and-down movement, and the second sidewall S2 serving as the free/second end of the second flap may perform the second up-and-down movement. In particular, as shown in FIG. 3A to FIG. 5A, when the first sidewall S1 (the free/second end of the first flap) performs the first up-and-down movement, the first sidewall S1 makes no physical contact with any other component within the device 100; when the second sidewall S2 (the free/second end of the second flap) performs the second up-and-down movement, the second sidewall S2 makes no physical contact with any other component within the device 100.

Figure 6:
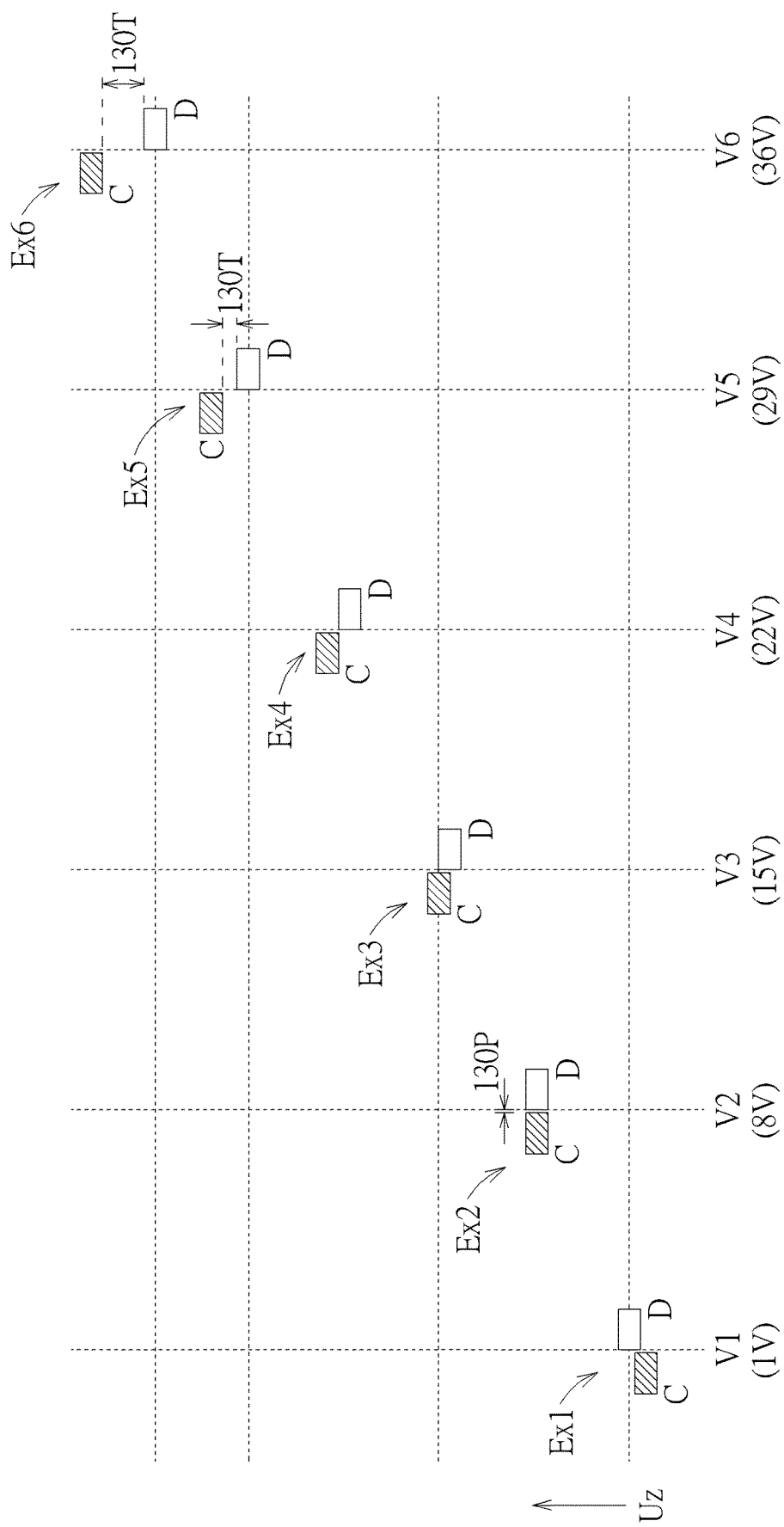
FIG. 6 is a schematic diagram illustrating multiple examples of relative position pairs on different sides of a slit according to the first embodiment of the present invention.
Figure 7:
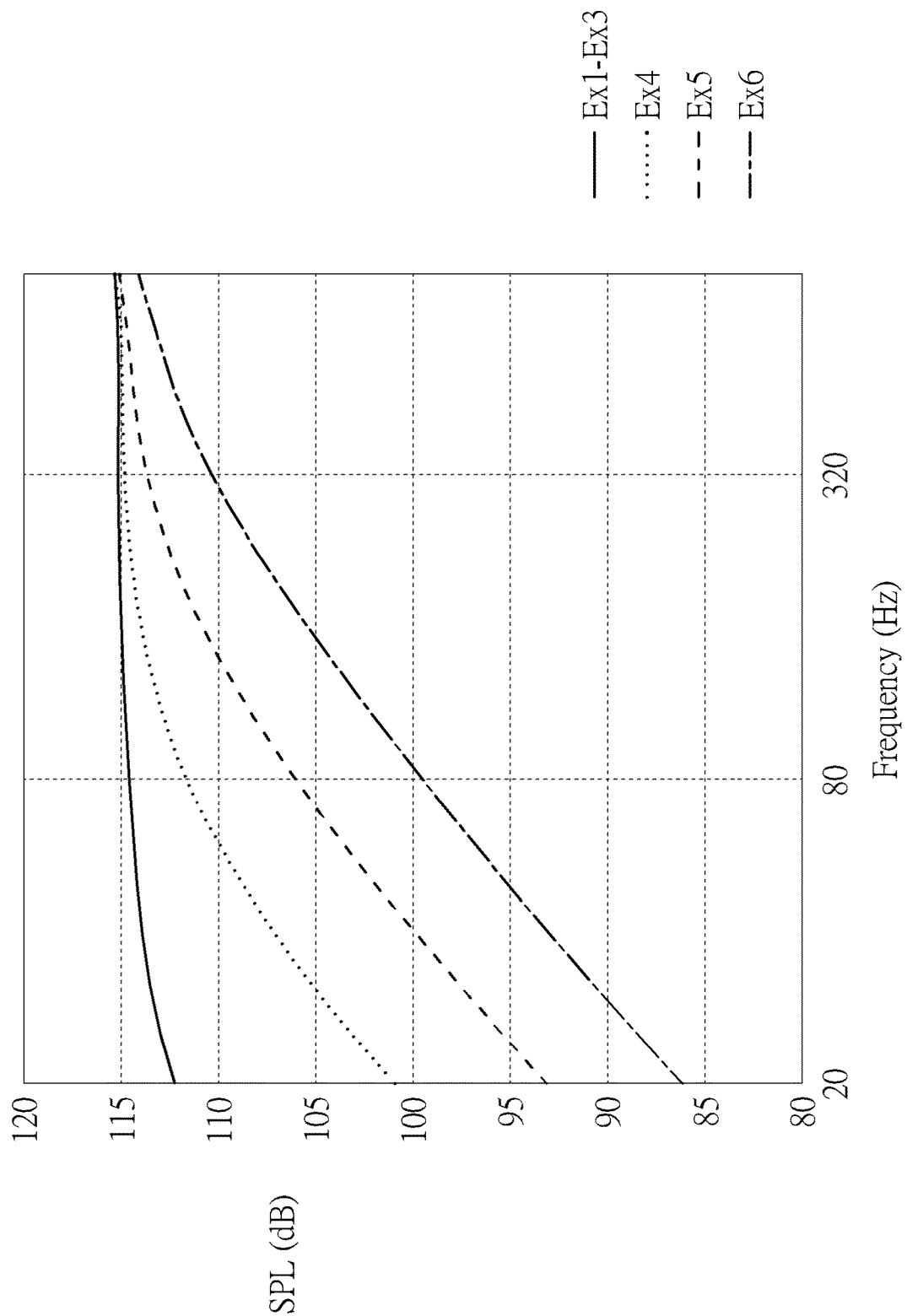
FIG. 7 is a schematic diagram illustrating frequency responses of multiple examples according to the first embodiment of the present invention.

Referring to FIG. 6 and FIG. 7, FIG. 6 is a schematic diagram illustrating multiple examples of relative position pairs on different sides of a slit according to the first embodiment of the present invention, and FIG. 7 is a schematic diagram illustrating frequency responses of multiple examples according to the first embodiment of the present invention. FIG. 6 illustrates six examples Ex1-Ex6 of relative position pairs of the point C (or a free/second end) on the membrane portion 112a (or a first flap) and the point D (or a free/second end) on the membrane portion 112b (or a second flap), corresponding to six progressively higher actuator driving voltage V1-V6, as labeled on the horizontal axis of FIG. 6. Vertical axis of FIG. 6 represents displacements (Uz) of the point C and the point D in the direction Z. Note that the height of blocks representing the points C and D shown in FIG. 6 corresponds to the thickness of the first membrane 110. FIG. 7 illustrates the frequency responses of the device 100 when the first membrane 110 actuated by the driving voltage V1-V6 (examples Ex1-Ex6) shown in FIG. 6. Note that, the numerical values shown in FIG. 6 and FIG. 7 are for illustrative purpose, practical applied voltage may be adjusted according to practical circumstance.

As shown in FIG. 4 and FIG. 6, in this case (a first driving method), the point C of the first sidewall S1 (i.e., the second end of the first flap) and the point D of the second sidewall S2 (i.e. the second end of the second flap) of the slit 130 moves in the same direction, i.e., both the first sidewall S1 and the second sidewall S2 moves upward in the positive direction Z as the voltage applied to the first actuator 120 increases, and the voltage is raised above a threshold voltage, such as to voltage V5 or V6, to generate/open the vent 130T; inversely, both the first sidewall S1 and the second sidewall S2 moves downward in the positive direction Z as the voltage applied to the first actuator 120 decrease, and the voltage is lowered below a threshold voltage, such as to V1~V3, to close the vent 130T.

As shown in FIG. 6, the point C is lower the point D when the voltage V1 (e.g., 1V) is applied on the first actuator 120 (e.g., the voltage V1 is applied on all actuating portions 120*a*, 120*b*, 120*c* and 120*d*); the point C is substantially aligned to the point D when the voltage V2 (e.g., 8V) is applied on the first actuator 120 (e.g., the voltage V2 is applied on all actuating portions 120*a*, 120*b*, 120*c* and 120*d*); the point C is higher than the point D by exactly the thickness of the first membrane 110 when the threshold voltage V4 (e.g., 22V) is applied on the first actuator 120 (e.g., the voltage V4 is applied on all actuating portions 120*a*, 120*b*, 120*c* and 120*d*); and the point C is higher than the point D by more than the thickness of the first membrane 110 when the voltage V5 or V6 is applied on the first actuator 120 (e.g., the voltage V5 or V6 is applied on all actuating portions 120*a*, 120*b*, 120*c* and 120*d*). Therefore, in FIG. 6, when the first actuator 120 receives the voltage higher than the threshold voltage V4, such as voltage V5~V6, the vent 130T is created, where the vent 130T will be opened; and conversely, when the first actuator 120 receives the voltage lower than the threshold voltage V4, such as voltage V1~V3, the vent 130T will not be created, and the vent 130T is said to be closed.

In other words, the membrane portion 112*a* at point C is partially below the membrane portion 112*b* at point D when the voltage V1 is applied on the first actuator 120. The membrane portion 112*a* at point C is substantially aligned to the membrane portion 112*b* at point D, in the horizontal direction, when the voltage V2 is applied on the first actuator 120. The membrane portion 112*a* at point C is partially above the membrane portion 112*b* at point D when the voltage V3 is applied on the first actuator 120. The lower edge of the membrane portion 112*a* at point C is substantially aligned to the top edge of the membrane portion 112*b* at point D, in the horizontal direction, when the voltage V4 is applied on the first actuator 120. The membrane portion 112*a* at point C is completely above the membrane portion 112*b* at point D, in the direction Z, when a voltage greater than the threshold voltage V4, such as the voltage V5 or V6, is applied on the first actuator 120, such that the vent 130T is generated and opened.

As shown in FIG. 6, in this embodiment, the voltage V5 or V6 is applied on the first actuator 120 in the first mode (e.g., the voltage V5 or V6 is applied on all actuating portions 120*a*, 120*b*, 120*c* and 120*d*), and the voltage V1, V2 or V3 is applied on the first actuator 120 in the second mode (e.g., the voltage V1, V2 or V3 is applied on all actuating portions 120*a*, 120*b*, 120*c* and 120*d*). In other words, an absolute value of the first driving signal applied on the first actuator 120 in the first mode may be greater than or equal to a threshold value, and an absolute value of the second driving signal applied on the first actuator 120 in the second mode may be less than the threshold value, wherein the threshold value is illustrated as voltage V4 (22V) in FIG. 6, but not limited thereto.

According to the above, in the second mode, the membrane portion 112*a* may be partially below, partially above or substantially aligned to the membrane portion 112*b*. That is to say, the first actuator 120 receives the second driving signal in the second mode to make the first sidewall S1 be corresponding to (or overlapping with) the second sidewall S2 in the horizontal direction parallel to the horizontal surface SH of the base B S (i.e., the vent 130T is closed and/or is not generated). In this embodiment, the entire first sidewall S1 is corresponding to the second sidewall S2 in the horizontal direction in the second mode.

On the other hand, in the first mode, the first actuator 120 receives the first driving signal to make at least a part of the first sidewall S1 be not corresponding to, or not overlapping with, the second sidewall S2 in the horizontal direction, such that the vent 130T is formed by the non-overlapping region between the first sidewall S1 and the second sidewall S2.

As shown in FIG. 7, since the width of the gap 130P of the slit 130 should be sufficiently small, in the frequency response of the device 100, the low frequency roll-off (LFRO) corner frequency of the SPL in the second mode is low, typically 35 Hz or lower. Conversely, when the vent 130T opens/exists in the first mode, the air will flow through the vent 130T with an airflow impedance inversely proportional to the opening size of the vent 130T, and therefore, in the frequency response of the device 100, the LFRO corner frequency in the first mode will be significantly higher than the LFRO corner frequency in the second mode. For instance, the LFRO corner frequency in the first mode may fall between 80 to 400 Hz, depends on the opening size of the vent 130T, but not limited thereto.

In the first driving method of the device 100, when the occlusion effect occurs, the first driving signal may be applied on the first actuator 120 to make the device 100 in the first mode, such that the vent 130T is generated/opened to allow the occlusion induced pressure to be released by the airflow through the vent 130T, so as to suppress the occlusion effect. For example, in this embodiment, the first driving signal may include a vent generating signal (e.g., the voltage V5 or V6) and a common signal (e.g., the common signal plus the vent generating signal), but not limited thereto. When the occlusion effect does not occur, the second driving signal may be applied on the first actuator 120 to make the device 100 in the second mode, such that the vent 130T is not generated. For example, in this embodiment, the second driving signal may include a vent restraining signal (e.g., the voltage V1, V2 or V3) and a common signal (e.g., the common signal plus the vent restraining signal), but not limited thereto. For example, in this embodiment, the first actuator 120 in the third mode may be grounded or floating.

The common signal may be designed based on requirement(s). In some embodiments, the common signal may include a constant (DC) bias voltage, an input audio (AC) signal or a combination thereof. For example, when the common signal includes the input audio signal, the common signal includes a signal corresponding to (related to) the value(s) of the input audio signal, such that the first membrane 110 may generate the acoustic wave while forming the vent 130T in the first mode, or alternatively, the first membrane 110 may generate the acoustic wave while restraining (close) the vent 130T. In an embodiment, the common signal may include a constant bias voltage, so as to maintain the first membrane 110 in a certain position. For example, the constant bias voltage, applied on the first actuator 120, may cause the first membrane 110 (e.g., the first flap and the second flap) to be substantially parallel to the horizontal surface SH of the base BS.

Note that, the embodiments and examples shown in FIG. 4, FIG. 5A, FIG. 6 and FIG. 7 belong to the first driving method which the first sidewall S1 and the second sidewall S2 of the slit 130 moves in the same direction for generating/opening and closing the vent 130T. A second driving method for generating the vent 130T may involve making the first sidewall S1 and the second sidewall S2 move in the different directions, and a third driving method for generating the vent 130T may involve only the one of the sidewalls, such as the first sidewall S1, moves while the other sidewall, such as the second sidewall S2, is stationary.

Figure 8A:
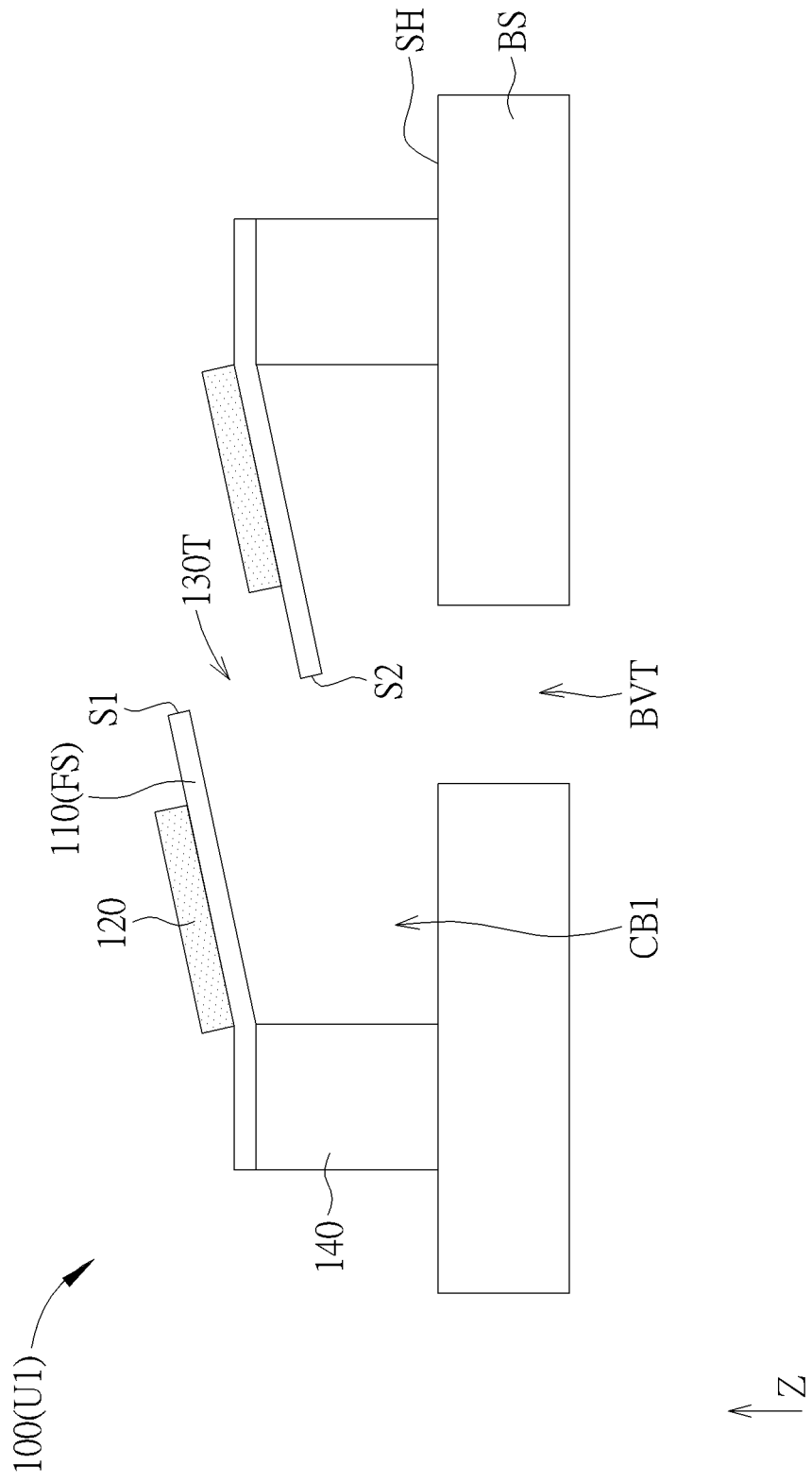
FIG. 8A is a schematic diagram of a cross sectional view illustrating a first membrane in a first mode according to another embodiment of the present invention.

Referring to FIG. 8A, FIG. 8A is a schematic diagram of a cross sectional view illustrating a first membrane in a first mode according to another embodiment of the present invention, wherein FIG. 8A shows that the first membrane 110 of the device 100 is actuated in the first mode according to the second driving method. As shown in FIG. 8A, regarding one slit 130, the first flap (one membrane portion containing the first sidewall S1 of the slit 130) may be actuated to move toward a first direction, and the second flap (one membrane portion containing the second sidewall S2 of the slit 130) may be actuated to move toward a second direction opposite to the first direction, such that the vent 130T is formed. Namely, the first up-and-down movement of the first sidewall S1 (the free/second end of the first flap) is opposite to the second up-and-down movement of the second sidewall S2 (the free/second end of the second flap). For example, the first direction and the second direction may be substantially parallel to the direction Z, and in transition from a second, such as the one illustrated in FIG. 3A, to a first mode, such as the one shown in FIG. 8A, the free/second end of the first flap (the first sidewall S1) may move upwards while the free/second end of the second flap (the second sidewall S2) may move downwards. Conversely, in transition from the first mode as shown in FIG. 8A back to the second mode as shown in FIG. 3A, the free/second end of the first flap (the first sidewall S1) may move downwards, and the free/second end of the second flap (the second sidewall S2) may move upwards. In either transition discussed above, the first sidewall S1 of the first flap and the second sidewall S2 of the second flap move in opposite directions.

In addition, the free/second end of the first flap (the first sidewall S1) may be actuated to have a first displacement Uz_a toward the first direction, and the free/second end of the second flap (the second sidewall S2) may be actuated to have a second displacement Uz_b toward the second direction. In an embodiment, the first displacement of the first sidewall S1 and the second displacement of the second sidewall S2 may be of substantially equal in distance, but opposite in direction.

Furthermore, the first displacement of the first sidewall S1 and the second displacement of the second sidewall S2 may be (temporarily) symmetrical, i.e. the movements of the first sidewall S1 and the second sidewall S2 are substantially equal length wise, but opposite in direction over any period of time. Namely, if the positions of the first flap (e.g., membrane portion 112a) and the second flap (e.g., membrane portion 112b) in the second mode are their initial positions (as shown in FIG. 3A), when the first membrane 110 is actuated in the first mode or in the transition between the first mode and the second mode (e.g., transition from the second mode to the first mode) according to the second driving method, a moving distance of the first flap respecting an initial position of the first flap may be equal to a moving distance of the second flap respecting an initial position of the second flap (as shown in FIG. 8A). Note that the moving distance of the first flap may be a moving distance of the first sidewall S1 (i.e., the free/second end) of the first flap, and the moving distance of the second flap may be a moving distance of the second sidewall S2 (i.e., the free/second end) of the second flap. Note that the first displacement of the first sidewall S1 and the second displacement of the second sidewall S2 which are temporarily symmetrical may occur when the first membrane 110 forms or closes the vent 130T and/or the first membrane 110 perform the acoustic transformation.

When the movements of the first sidewall S1 and the second sidewall S2 of FIG. 8A is temporarily symmetrical, regarding one slit 130, a first air movement is produced because the first flap (one membrane portion containing the first sidewall S1 of the slit 130) is actuated to move toward the first direction, a direction of the first air movement is related to the first direction, a second air movement is produced because the second flap (one membrane portion containing the second sidewall S2 of the slit 130) is actuated to move toward the second direction opposite to the first direction, and a direction of the second air movement is related to the second direction. Since the first air movement and the second air movement may be respectively related to the opposite directions, at least a portion of the first air movement and at least a portion of the second air movement may cancel each other when the first flap (one membrane portion containing the first sidewall S1 of the slit 130) and the second flap (one membrane portion containing the second sidewall S2 of the slit 130) are simultaneously actuated to open/close the vent 130T.

In some embodiments, the first air movement and the second air movement may substantially cancel each other when the first flap and the second flap are simultaneously actuated to open/close the vent 130T (for example, the first displacement toward the first direction and the second displacement toward the second direction may be equal in distance but opposite in direction). Namely, a net air movement produced due to opening/closing the vent 130T, which contains the first air movement and the second air movement, is substantially zero. As the result, since the net air movement is substantially zero during the opening and/or closing operation of the vent 130T, the operations of the vent 130T produces no acoustic disturbance perceivable to the user of the device 100, and the opening and/or closing operation of the vent 130T is said to be "concealed".

In the embodiment related to FIG. 1, FIG. 2, FIG. 4, FIG. 6 and FIG. 7, one driving signal, refer to as the first driving method herein, is applied to the first actuator 120 (i.e., all actuating portions 120a, 120b, 120c and 120d is driven by the same driving signal). In a second driving method, such as the driving signal for embodiment of FIG. 8A and FIG. 8B, the driving signal applied on the actuating portion of the first actuator 120 on the first flap (the portion containing the first sidewall S1) may be different from the driving signal applied on the actuating portion of the first actuator 120 on the second flap (the portion containing the second sidewall S2) based on requirement(s).

Figure 8B:
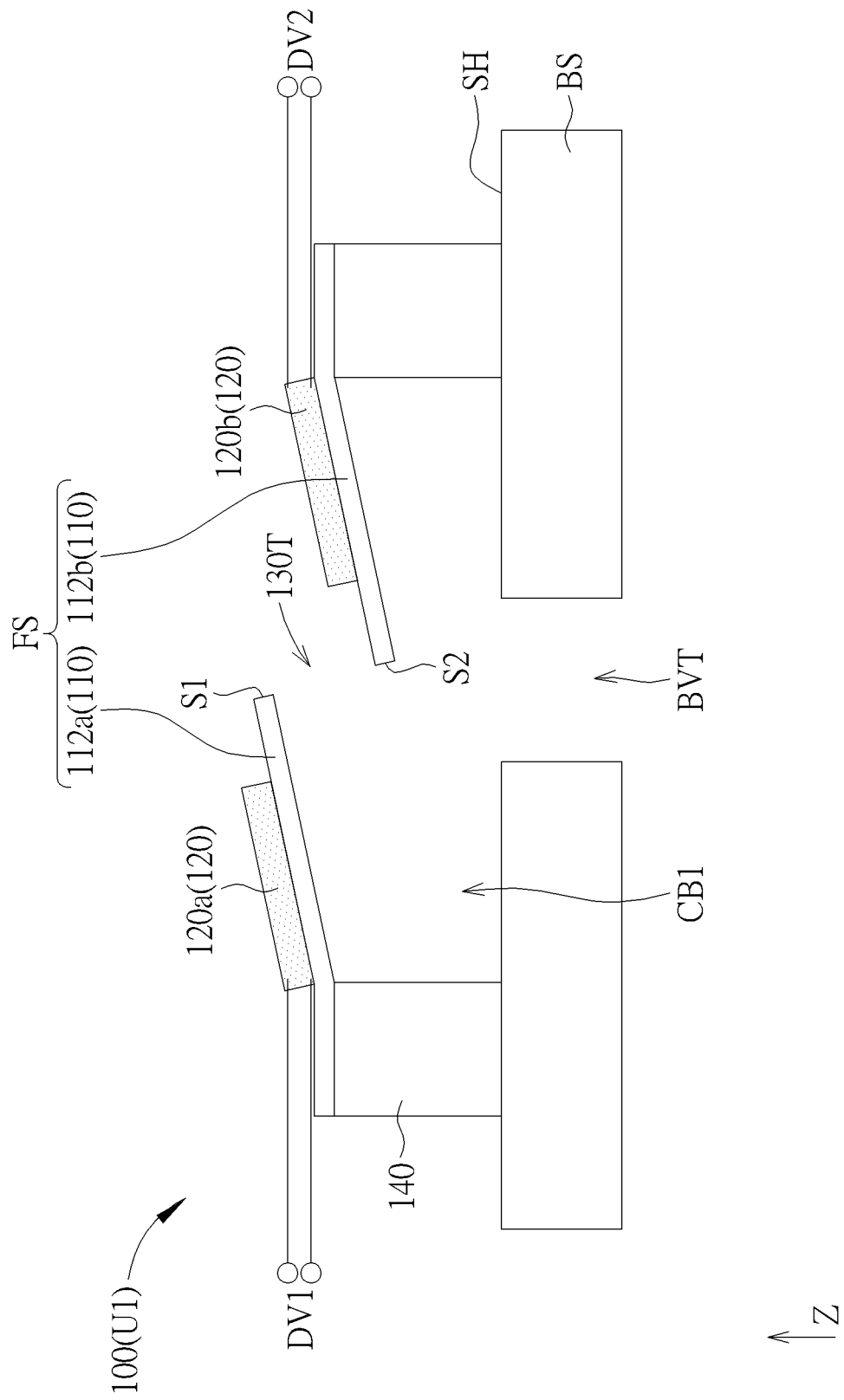
FIG. 8B is a schematic diagram of a cross sectional view illustrating a first membrane in a first mode and its driving signals according to another embodiment of the present invention.

In detail, as shown in FIG. 8B, the actuating portion (e.g., 120a) of the first actuator 120 disposed on the first flap (the membrane portion containing the first sidewall S1, such as the membrane portion 112a) will receive the first signal DV1, and the actuating portion (e.g., 120b) of the first actuator 120 disposed on the second flap (the membrane portion containing the second sidewall S2, such as the membrane portion 112b) will receive the second signal DV2. Thus, the first flap will move according to the first signal DV1, and the second flap will move according to the second signal DV2. For example, the first signal DV1 may be a voltage difference between two electrodes of the actuating portion 120a of the first actuator 120, and the second signal DV2 may be a voltage difference between two electrodes of the actuating portion 120b of the first actuator 120.

The first signal DV1 and the second signal DV2 may contain component signals designed to make the first flap (the membrane portion containing the first sidewall S1) and the second flap (the membrane portion containing the second sidewall S2) to move in the opposite directions respectively (i.e., the first flap may move toward the first direction, and the second flap moves toward the second direction opposite to the first direction). For example, the first signal DV1 may include a common signal/voltage plus a first controlling signal, and the second signal DV2 may include the same common signal/voltage plus a second controlling signal. The common signal/voltage may include the constant bias voltage, the input audio signal or a combination thereof, but not limited thereto. The first controlling signal and the second controlling signal may be direct current (DC) signals or alternating current (AC) signals. In an embodiment, the common signal/voltage may simply be the constant bias voltage.

In some embodiments, the first controlling signal may be an incremental voltage (a DC signal), and the second controlling signal may be a decremental voltage (another DC signal). The values of the incremental voltage and the decremental voltage may be designed based on requirement (s). For instance, the incremental voltage may toggle between 0V and a positive voltage, such as 0V⇔10V or 0V⇔15V, and the decremental voltage may change between 0V and a negative voltage, such as 0V⇔−10V or 0V⇔−15V, but not limited thereto. For instance, the incremental voltage may toggle between 0V and a positive voltage less than or equal to 15V, and the decremental voltage may toggle between 0V and a negative voltage greater than or equal to −15V, but not limited thereto.

In some embodiments, the first controlling signal and the second controlling signal may be AC signals, wherein a phase difference between the first controlling signal and the second controlling signal may be 2nπ+π, and n is an integer. Therefore, the first flap (the membrane portion containing the first sidewall S1) and the second flap (the membrane portion containing the second sidewall S2) may move in the opposite directions respectively according to the first signal DV1 and the second signal DV2. The amplitude of the first controlling signal (i.e., the AC signal) and the amplitude of the second controlling signal (i.e., the AC signal) may be designed based on requirement(s). For instance, the amplitude of the first controlling signal (i.e., the AC signal) and the second controlling signal (i.e., the AC signal) may be less than or equal to 15V, but not limited thereto.

For example, in the first mode of the device 100 in FIG. 8B, in a time segment, the first controlling signal may make the first signal DV1 higher than the common signal, and the second controlling signal may make the second signal DV2 lower than the common signal. Then, the vent 130T will be opened/formed when the delta displacement of the first membrane portion (containing the first sidewall S1) and the second membrane portion (containing the second sidewall S2) is greater than the thickness of the first membrane 110.

Figure 3B:
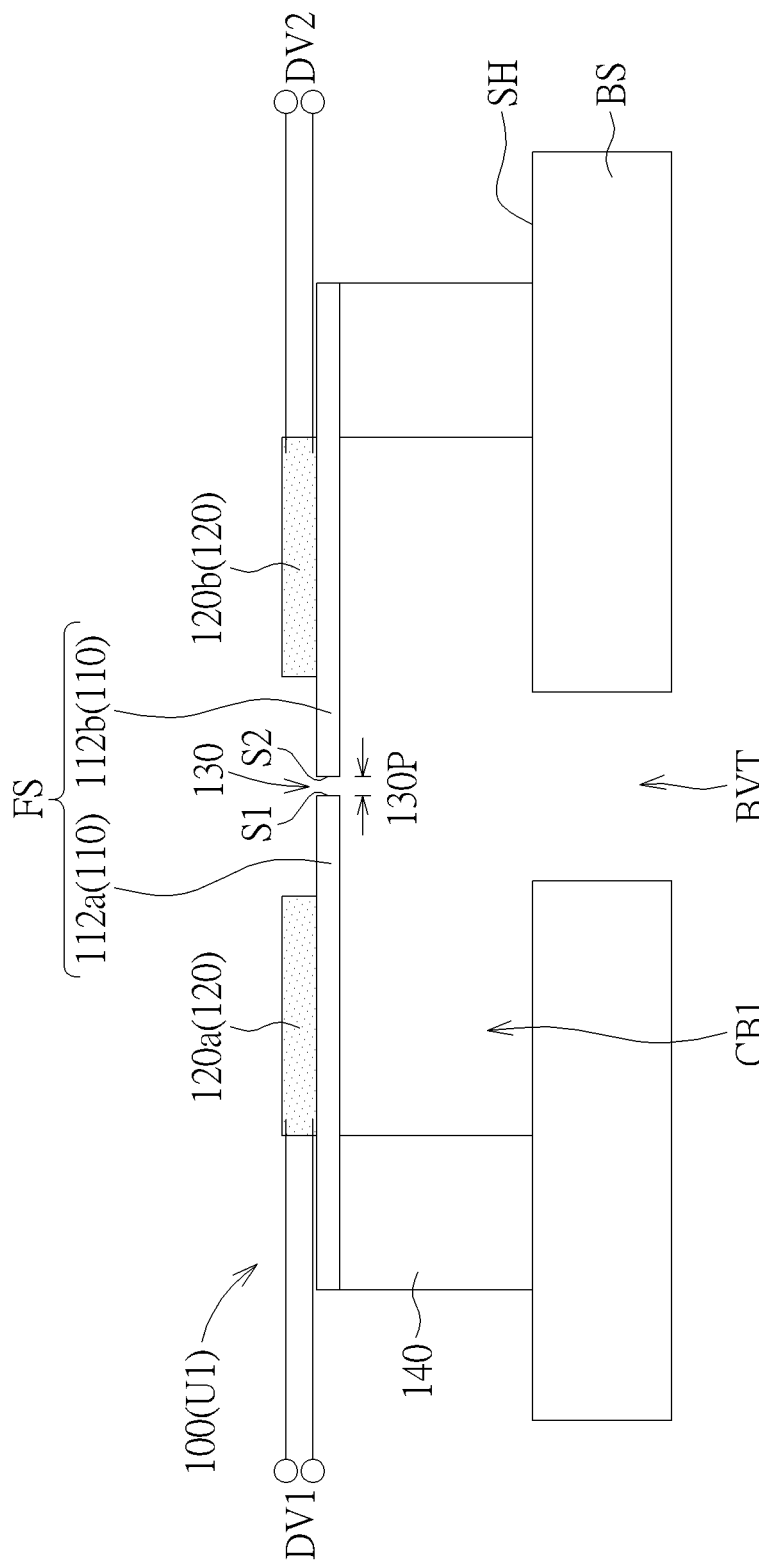
FIG. 3B is a schematic diagram of a cross sectional view illustrating a first membrane in a second mode and its driving signals according to the first embodiment of the present invention.

Conversely, in the second mode of the device 100, such as FIG. 3B, both the first controlling signal of the first signal DV1 and the second controlling signal of the second signal DV2 may be approximately 0V, resulting in substantially the same driving signals being applied to the actuators on both portions of the first membrane 110 (i.e., the first signal DV1 and the second signal DV2 may be the common signal, such as the constant bias voltage), leading to both membrane portions (one containing the first sidewall S1, the other containing the second sidewall S2) producing approximately the same displacement and, as a result, the vent 130T will not be formed/opened, or, will be closed.

That is to say, in an embodiment, the first membrane 110 (the film structure FS) remains a flat position which is parallel to the base BS as shown in FIG. 3B, when the first signal DV1 and the second signal DV2 is the constant bias signal, or equivalently, the constant bias voltage is applied on the first actuator 120 (e.g., the actuating portions 120a, 120b, 120c and 120d). In this circumstance, given the gap 130P or a width of the slit 130 may be designed such that air flow through the gap 130P (or the slit 130) is negligible, the vent 130 is closed.

Therefore, under certain circumstance, the first controlling signal and the second controlling signal may be of substantially the same magnitude, but not limited thereto; under certain circumstance, such as in the first mode where the vent 130T is opened, the first signal DV1 may be higher than or less than the second signal DV2 by a voltage level that is sufficient to cause delta displacement to be larger than the thickness of the membrane, but not limited thereto; under certain circumstances, such as in the second mode where the vent 130T is closed, the first controlling signal and the second controlling signal may both be or be close to 0V, but not limited thereto.

In some embodiments, in the first mode and the second mode of the device 100, the absolute value of the common signal may be greater than the greatest absolute value of the first controlling signal and the greatest absolute value of the second controlling signal, such that the first signal DV1 and the second signal DV2 may be simultaneously greater than 0V or simultaneously less than 0V (i.e., the ground voltage). Namely, the first signal DV1 and the second signal DV2 are unipolar with respect to the ground voltage. For example, the common signal may be 16V, the first controlling signal (e.g., the AC signal) may range from −15V to 15V, and the second controlling signal (e.g., the AC signal) may range from 15V to −15V, such that the first signal DV1 and the second signal DV2 may be simultaneously greater than 0V in the first mode and the second mode (i.e., the first signal DV1 and the second signal DV2 are unipolar with respect to the ground voltage in the first mode and the second mode), but not limited thereto.

In the first mode and the second mode of the device 100 of an embodiment, if the first signal DV1 (i.e., the common signal plus the first controlling signal) and the second signal DV2 (i.e., the common signal plus the second controlling signal) are simultaneously greater than 0V, the first signal DV1 and the second signal DV2 may be less than a breakdown voltage of the device 100 (e.g., the first actuator 120), so as to make the operation of the device 100 stable or to make the device 100 less distorted, but not limited thereto. In the first mode and the second mode of the device 100 of an embodiment, if the first signal DV1 and the second signal DV2 are simultaneously greater than 0V, the first signal DV1 and the second signal DV2 may be less than an maximum voltage output from a driving circuit (e.g., a device driver), but not limited thereto.

Note that the displacement of the membrane portion (the film structure FS) with respect to the flat position may be corresponding to the first controlling signal and the second controlling signal with respect to the ground voltage, such that the displacement of the membrane portion may be precisely controlled. For instance, the displacement of the membrane portion and the first controlling signal (or the second controlling signal) may have a linear relationship, but not limited thereto.

Figure 5B:
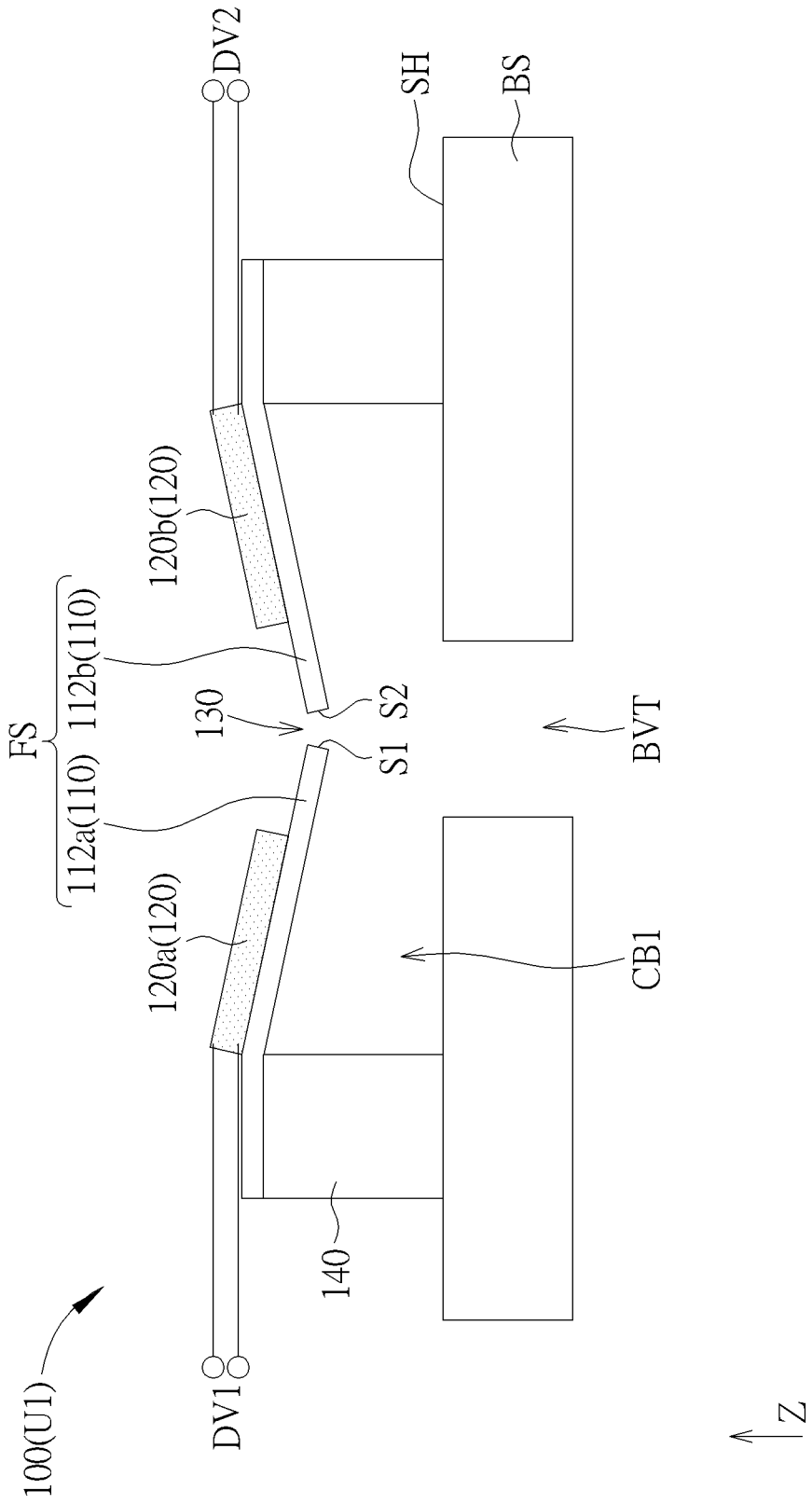
FIG. 5B is a schematic diagram of a cross sectional view illustrating a first membrane in a second mode or a third mode and its driving signals according to another embodiment of the present invention.

In addition, rule of applying unipolar driving signal so as to obtain linear membrane movement may also be applied for sound producing device. For example, the device 100 (shown in FIGS. 1, 3A, 3B, 5A, 5B, 8A and 8B) may function as sound producing device when the driving signal DV1/DV2 includes audio signal or is generated according to input audio signal (which having spectrum within audible band). The first membrane 110 may be designed and fabricated such that the first membrane 110 would hang down/downward and below the flat position when the actuator 120 is floating or receives a ground voltage. Snapshot of the first membrane 110 hanging/bending downward is shown in FIG. 5A or 5B. The first membrane 110 may remain the flat position which is (substantially) parallel to the base BS when a constant bias voltage is applied on the actuator 120, where the constant bias voltage applied on the actuator 120 may be chosen to maintain the first membrane 110 at the flat position. Snapshot of the first membrane 110 holding at the flat position is shown in FIG. 3A or 3B. When the (sound producing) device 100 operates, the driving signal DV1/DV2 is unipolar with respect to the ground voltage (0V) and may regarded as the constant bias voltage plus an AC signal, where the AC may have alternating polarities with respect to the ground voltage (0V). In this case, the membrane movement of the first membrane 110 shall be linear (or symmetric) with the AC signal. This rule shall be applied for sound producing device disclosed in U.S. Pat. No. 11,057,716 B1 and U.S. Pat. No. 11,172,300 B2, but not limited thereto.

Optionally, the device 100 in the second driving method may further include a third mode, wherein the free/second end of the two membrane portions (two flaps) may move/bend toward the base BS in the third mode (as shown in FIG. 5A and FIG. 5B). For example, in the third mode of the device 100, the actuating portions may receive the ground voltage (i.e., the first signal DV1 and the second signal DV2 may be 0V) or just be floating. The gap 130P (or the slit 130) maybe designed, such that the vent 130T is considered as closed in the third mode. Namely, as shown in FIG. 5A and FIG. 5B, the first membrane 110 (the film structure FS) hangs down and the sidewall S1/S2 would be below the flat position when the first actuator 120 (e.g., the actuating portions 120a, 120b, 120c and 120d) receives the ground voltage or is floating.

Figure 8C:
FIG. 8C is a schematic diagram illustrating frequency responses of different modes according to another embodiment of the present invention.

Referring to FIG. 8C, FIG. 8C is a schematic diagram illustrating frequency responses of different modes according to another embodiment of the present invention, wherein the device 100 is driven by the second driving method. FIG. 8C illustrates the frequency responses of the device 100 in the first mode (as shown in FIG. 8A and FIG. 8B), the second mode (as shown in FIG. 3B) and the third mode (as shown in FIG. 5A and FIG. 5B) respectively. As shown in FIG. 8C, since the vent 130T is closed in the second mode and the third mode, the LFRO corner frequencies in the second mode and the third mode are low, and the SPL drop of the low frequency in the second mode and the SPL drop of the low frequency in the third mode are not evident. As shown in FIG. 8C, since the vent 130T is opened in the first mode, the LFRO corner frequency in the first mode is significantly higher than the LFRO corner frequencies in the second mode and the third mode, and the SPL drop of the low frequency in the first mode is evident.

According to the above, the slit 130 of the present invention may be driven by the first driving method or the second driving method to serve as a dynamic front vent of the device 100, wherein the first volume VL1 and the second volume VL2 in the housing structure HSS are connected when the dynamic front vent is opened (i.e., the vent 130T of the slit 130 is opened and/or formed), and the first volume VL1 and the second volume VL2 in the housing structure HSS are separated from each other when the dynamic front vent is closed (i.e., the vent 130T of the slit 130 is closed and/or not formed). The wider is the vent 130T, the greater will be the dynamic front vent. Thus, the size of the front vent can be changed by the driving signal(s) based on requirement(s).

Moreover, the device 100 of the present invention may have the better water protection and the better dust protection due to the dynamic front vent.

In the present invention, the device 100 may use any suitable driver. For instance, the device 100 may use small driver (e.g., a typical 115 dB driver), such that the device 100 of the present invention may be suitable for the small size device.

Figure 9A:
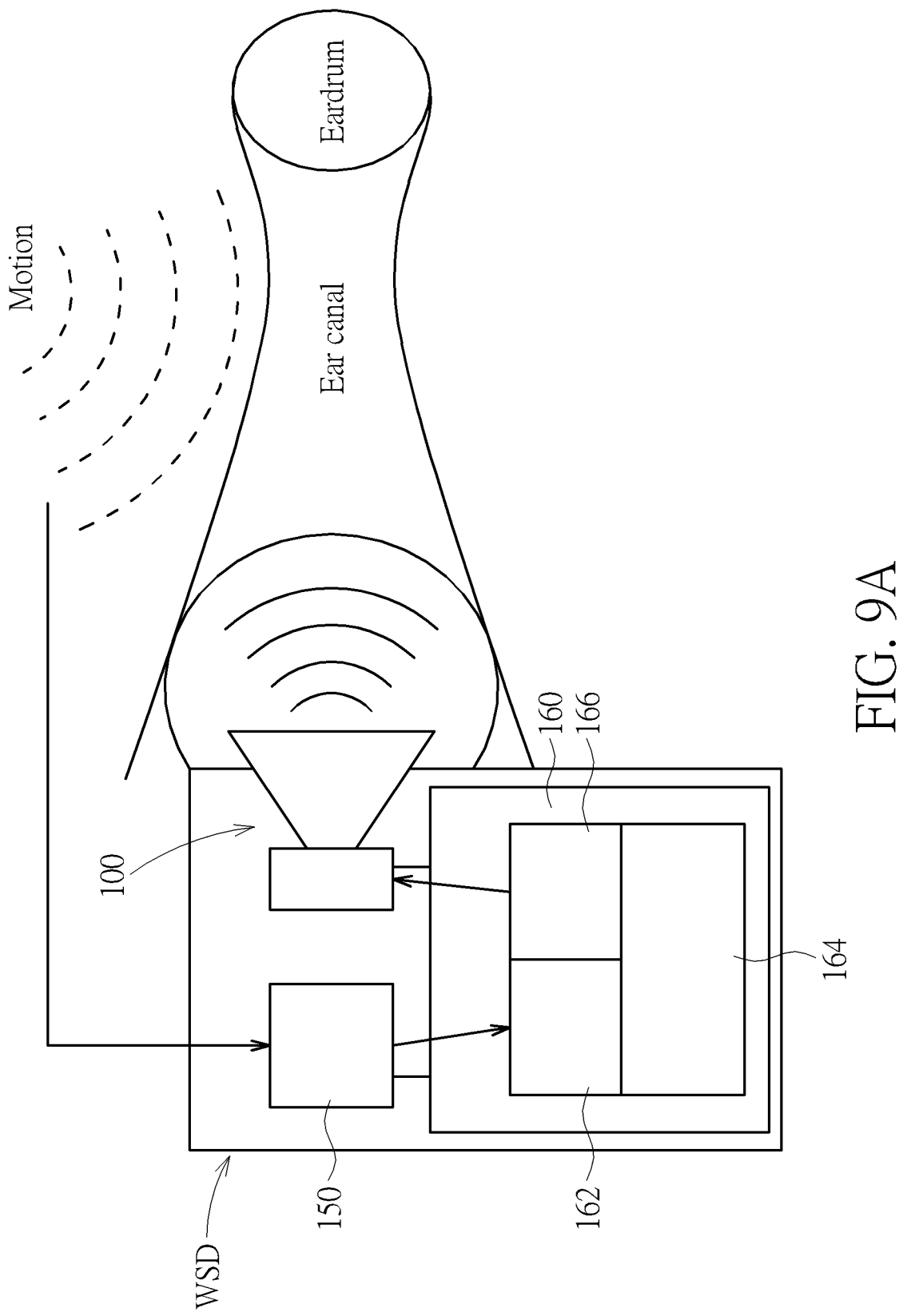
FIG. 9A is a schematic diagram illustrating a wearable sound device with a device according to an embodiment of the present invention.

Referring to FIG. 9A, FIG. 9A is a schematic diagram illustrating a wearable sound device with a device according to an embodiment of the present invention. As shown in FIG. 9A, the wearable sound device WSD may further include a sensing device 150 and a driving circuit 160 electrically connected to the sensing device 150 and the actuator (e.g., the first actuator 120) of the device 100.

The sensing device 150 may be configured to sense any required factor outside the wearable sound device WSD and correspondingly to generate a sensing result. For example, the sensing device 150 may use an infrared (IR) sensing method, an optical sensing method, an acoustic sensing method, an ultrasonic sensing method, a capacitive sensing method or other suitable sensing method to sense any required factor, but not limited thereto.

In some embodiments, whether the vent 130T is formed is determined according to the sensing result. The vent 130T is opened (or formed) when a sensed quantity indicated by the sensing result crosses a certain threshold with a first polarity, and the vent 130T is closed (or not formed) when the sensed quantity crosses the certain threshold with a second polarity opposite to the first polarity. For instance, the first polarity may be from low to high, and the second polarity may be from high to low, such that the vent 130T is opened when the sensed quantity is changed from lower than the certain threshold to higher than the certain threshold, and the vent 130T is closed when the sensed quantity is changed from higher than the certain threshold to lower than the certain threshold, but not limited thereto.

Moreover, in some embodiments, a degree of opening of the vent 130T may be monotonically related to the sensed quantity indicated by the sensing result. Namely, the degree of opening of the vent 130T increases or decreases as the sensed quantity increases or decreases.

In some embodiments, the sensing device 150 may optionally include a motion sensor configured to detect a body motion of the user and/or a motion of the wearable sound device WSD. For example, the sensing device 150 may detect the body motion causing the occlusion effect, such as walking, jogging, talking, eating, etc. In some embodiments, the sensed quantity indicated by the sensing result represents the body motion of the user and/or the motion of the wearable sound device WSD, and the degree of opening of the vent 130T is correlated to the motion sensed. For instance, the degree of opening of the vent 130T increases as the motion increases.

In some embodiments, the sensing device 150 may optionally include a proximity sensor configured to sense a distance between an object and the proximity sensor. In some embodiments, the sensed quantity indicated by the sensing result represents the distance between the object and the proximity sensor, and the degree of opening of the vent 130T is correlated to the distance sensed. For instance, the vent 130T is opened (or formed) when this distance smaller than a predetermined distance, and the degree of opening of the vent 130T increases as this distance decreases. For instance, if the user wants to open (or form) the vent 130T, the user can use any suitable object (e.g., the hand) to approach the wearable sound device WSD, so as to make the proximity sensor sense this object to correspondingly generate the sensing result, thereby open/form the vent 130T.

In addition, the proximity sensor may further have a function for detecting that the user (predictably) taps or touches the wearable sound device WSD having the device 100 because these motions may also cause the occlusion effect.

In some embodiments, the sensing device 150 may optionally include a force sensor configured to sense the force applied on the force sensor of the wearable sound device WSD, the sensed quantity indicated by the sensing result represents the force pressing on the wearable sound device WSD, and the degree of opening of the vent 130T is correlated to the force sensed.

In some embodiments, the sensing device 150 may optionally include a light sensor configured to sense an ambient light of the wearable sound device WSD, the sensed quantity indicated by the sensing result represents the luminance of the ambient light sensed by the light sensor, and the degree of opening of the vent 130T is correlated to the luminance of the ambient light sensed.

In some embodiments, the sensing device 150 may optionally include an acoustic sensor, such as microphone, configured to sense the sound outside the wearable sound device WSD to detect the occlusion event. For example, the sensed quantity indicated by the sensing result represents the SPL of the sound sensed by the acoustic sensor, and the degree of opening of the vent 130T is correlated to the sound sensed by the acoustic sensor, but not limited thereto. For example, the device 100 is actuated to open the vent 130T when the acoustic sensor detects that the occlusion event occur, but not limited thereto.

The driving circuit 160 is configured to generate the driving signal(s) applied on the actuator (e.g., the first actuator 120), so as to actuate the first membrane 110, wherein the driving signal(s) may be based on the sensing result of the sensing device 150 and/or the value of the input audio signal. In FIG. 9A, the driving circuit 160 may be an integrated circuit, but not limited thereto.

For example, in the first driving method, the first driving signal and the second driving signal may be generated by the driving circuit 160, and the vent generating signal of the first driving signal and the vent restraining signal of the second driving signal may be generated according to the sensing result, but not limited thereto.

For example, in the second driving method, the first signal DV1 and the second signal DV2 may be generated by the driving circuit 160, and the first controlling signal of the first signal DV1 and the second controlling signal of the second signal DV2 may be generated according to the sensing result, but not limited thereto.

Similarly, since the degree of opening of the vent 130T may be monotonically related to the sensed quantity indicated by the sensing result, the first controlling signal and/or the second controlling signal in the second driving method (or the vent generating signal in the first driving method) may have a monotonic relationship with the sensed quantity indicated by the sensing result.

Similarly, when the sensing device 150 includes the motion sensor, a magnitude of the first controlling signal and/or a magnitude of the second controlling signal in the second driving method (or the vent generating signal in the first driving method) may increase (or decrease) as the motion increases, but not limited thereto. Similarly, when the sensing device 150 includes the proximity sensor, a magnitude of the first controlling signal and/or a magnitude of the second controlling signal in the second driving method (or the vent generating signal in the first driving method) may increase (or decrease) as the distance decreases or decreases below a threshold, but not limited thereto. Similarly, when the sensing device 150 includes the force sensor, a magnitude of the first controlling signal and/or a magnitude of the second controlling signal in the second driving method (or the vent generating signal in the first driving method) may increase (or decrease) as the force increases, but not limited thereto. Similarly, when the sensing device 150 includes the light sensor, a magnitude of the first controlling signal and/or a magnitude of the second controlling signal in the second driving method (or the vent generating signal in the first driving method) may increase (or decrease) as the luminance of the ambient light decreases, but not limited thereto.

In addition, the driving circuit 160 may include any suitable component. For example, the driving circuit 160 may include an analog-to-digital converter (ADC) 162, a digital signal processing (DSP) unit 164, a digital-to-analog converter (DAC) 166, any other suitable component (e.g., a microphone detecting the SPL of the environmental sound or the SPL of the occlusion noise) or a combination thereof.

In this embodiment, based on the sensing result generated by the sensing device, the driving circuit 160 may correspondingly apply the driving signal(s) on the first actuator 120, so as to make the device 100 in the first mode or in the second mode. In the first mode, the device 100 forms the vent 130T, so as to suppress the occlusion effect. Also, the device 100 in the first mode may optionally generate the acoustic wave, and the device 100 in the second mode may optionally generate the acoustic wave.

Optionally, the driving circuit 160 may further include a frequency response equalizer configured to adjust the driving signal of the device 100 in a specific frequency range. As shown in FIG. 7, four different LFRO corner frequencies in the frequency response of the device 100 corresponding to four different vent 130T conditions are shown. In an embodiment, a signal processing unit containing the frequency response equalizer may be configured to compensate for the differing LFRO corner frequency of the frequency response of the device 100 due to differing degree of opening of vent 130T. For example, the frequency response equalizer may be enabled to compensate for the LFRO frequency response curve of the example Ex5 (or Ex6) when the driving voltage V5 (or V6) is applied to the first actuator 120 and the vent 130T is opened as depicted in FIG. 6. In other words, the frequency response equalizer may be enabled in the first mode (the frequency response equalizer is enabled when the vent 130T is opened), and the frequency response equalizer may be disabled in the second mode (the frequency response equalizer is disabled when the vent 130T is closed). Furthermore, the amount of equalization generated by the frequency response equalizer may be adaptive, varying dynamically according to the opening size of the vent 130T. As the result, the frequency response equalizer may compensate for the varying LFRO of the low-frequency response of the device 100 due to the vent 130T being opened (i.e., the frequency response equalizer may compensate for the degradation of the low-frequency response of the device 100 in the first mode), such that the change in the frequency response of the device 100 may be equalized, the disruption of the sound production characteristics of the device 100 is minimized, and the listener's audio listening experience optimized.

Figure 9B:
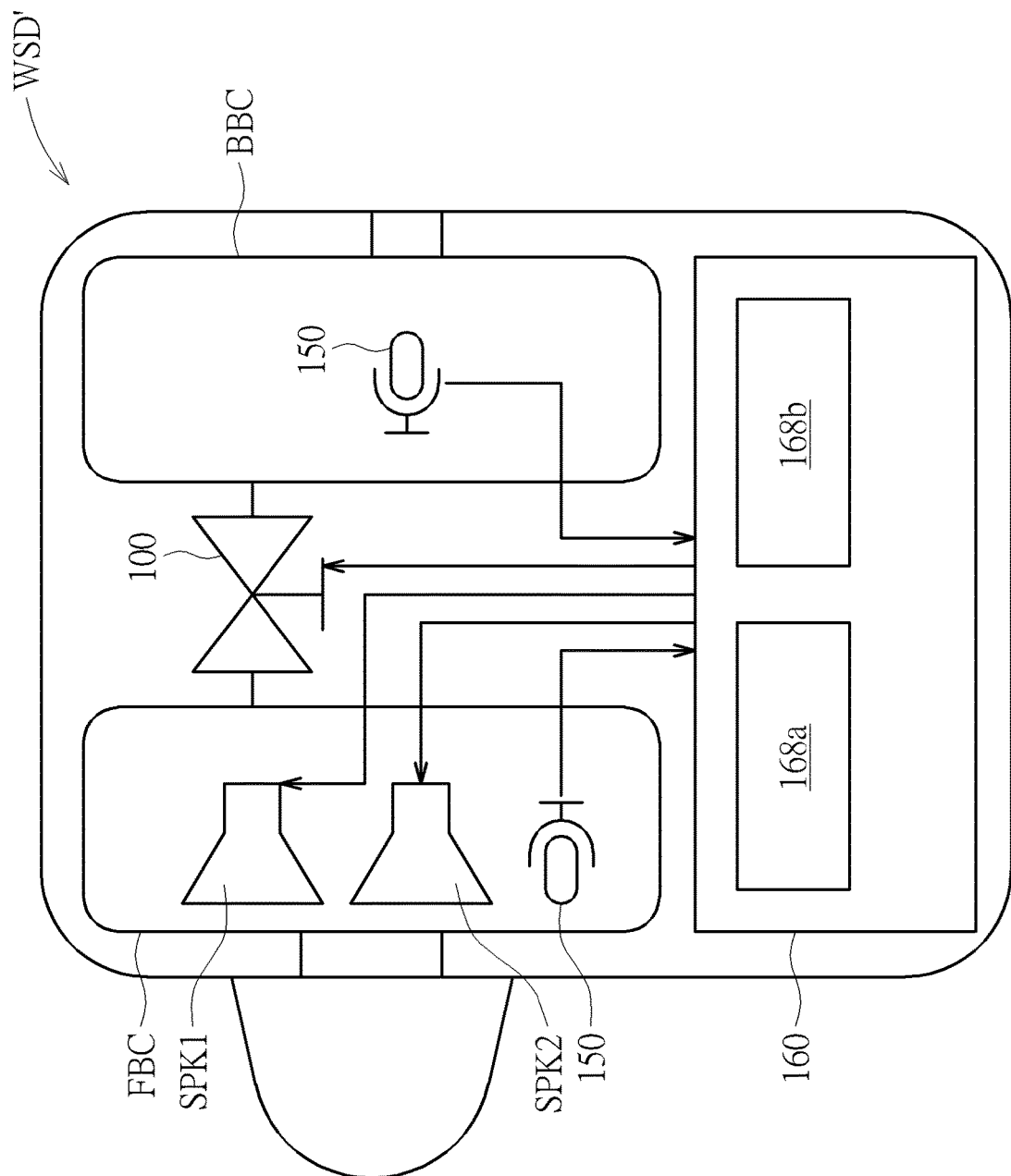
FIG. 9B is a schematic diagram illustrating a wearable sound device with a device according to an embodiment of the present invention.

Referring to FIG. 9B, FIG. 9B is a schematic diagram illustrating a wearable sound device with a device according to an embodiment of the present invention. Compared with the wearable sound device WSD shown in FIG. 9A, the wearable sound device WSD' may further include at least one sound producing unit (e.g., sound producing units SPK1 and SPK2) configured to perform the acoustic transformation. Namely, the acoustic wave is produced by the sound producing units SPK1 and SPK2, and the device 100 is configured to be actuated to open or close the vent 130T for suppressing the occlusion effect. As shown in FIG. 9B, the acoustic wave produced by the sound producing units SPK1 and SPK2 may propagate from a front chamber FBC of the wearable sound device WSD' to the ear canal of the wearable sound device user.

The frequency range of the acoustic wave produced by each sound producing unit may be designed based on requirement(s). For instance, an embodiment of sound producing unit may produce the acoustic wave with the frequency range covering the human audible frequency range (e.g., from 20 Hz to 20 kHz), but not limited thereto. For instance, another embodiment of sound producing unit may produce the acoustic wave with the frequency higher than a specific frequency, such that this sound producing unit may be a high frequency sound unit (tweeter), but not limited thereto. For instance, another embodiment of sound producing unit may produce the acoustic wave with the frequency lower than a specific frequency, such that this sound producing unit may be a low frequency sound unit (woofer), but not limited thereto. Note that the specific frequency may be a value ranging from 800 Hz to 4 kHz (e.g., 1.44 kHz), but not limited thereto. The details of the high frequency sound unit and the low frequency sound unit may be referred to U.S. application Ser. No. 17/153,849 filed by Applicant, which is not narrated herein for brevity.

The sound producing units SPK1 and SPK2 may be the same or different. For example, the sound producing unit SPK1 may be a high frequency sound unit (tweeter), and the sound producing unit SPK2 may be a low frequency sound unit (woofer), but not limited thereto.

The front chamber FBC of the wearable sound device WSD' shown in FIG. 9B may be connected to the first volume VL1 in the housing structure HSS where the device 100 is disposed (shown in FIG. 3A). For example, the front chamber FBC of the wearable sound device WSD' may be directly connected to the first volume VL1 in the housing structure HSS, or be connected to the first volume VL1 in the housing structure HSS through the ear canal of the wearable sound device user. Also, a back chamber BBC of the wearable sound device WSD' shown in FIG. 9B may be connected to the second volume VL2 in the housing structure HSS where the device 100 is disposed (shown in FIG. 3A). For example, the back chamber BBC of the wearable sound device WSD' may be directly connected to the second volume VL2 in the housing structure HSS, or be connected to the second volume VL2 in the housing structure HSS through the ambient of the wearable sound device WSD'.

The sensing devices 150, which may comprise acoustic sensor(s) (e.g., microphone(s)), may be disposed in the front chamber FBC and/or the back chamber BBC of the wearable sound device WSD', wherein the sensing devices 150 is configured to detect the occlusion event.

The device 100, the sound producing units SPK1 and SPK2 and the sensing devices 150 may be electrically connected to the driving circuit 160. The driving circuit 160 may apply acoustic driving signals on the sound producing units SPK1 and SPK2, such that the acoustic wave produced by the sound producing units SPK1 and SPK2 may be corresponding to the acoustic driving signals. The driving circuit 160 may apply the driving signal based on the sensing result of the sensing device 150 on the device 100, so as to open or close the vent 130T for suppressing the occlusion effect. For example, the driving circuit 160 may include a device controller 168a and a device driver 168b, but not limited thereto. For instance, the device controller 168a may determine the voltages applied on or to be applied on the actuating portions of the first actuator 120 according to the sensing result generated by the sensing device 150, but not limited thereto.

The device of the present invention is not limited by the above embodiment(s). Other embodiments of the present invention are described below. For ease of comparison, same components will be labeled with the same symbol in the following. The following descriptions relate the differences between each of the embodiments, and repeated parts will not be redundantly described.

Figure 10:
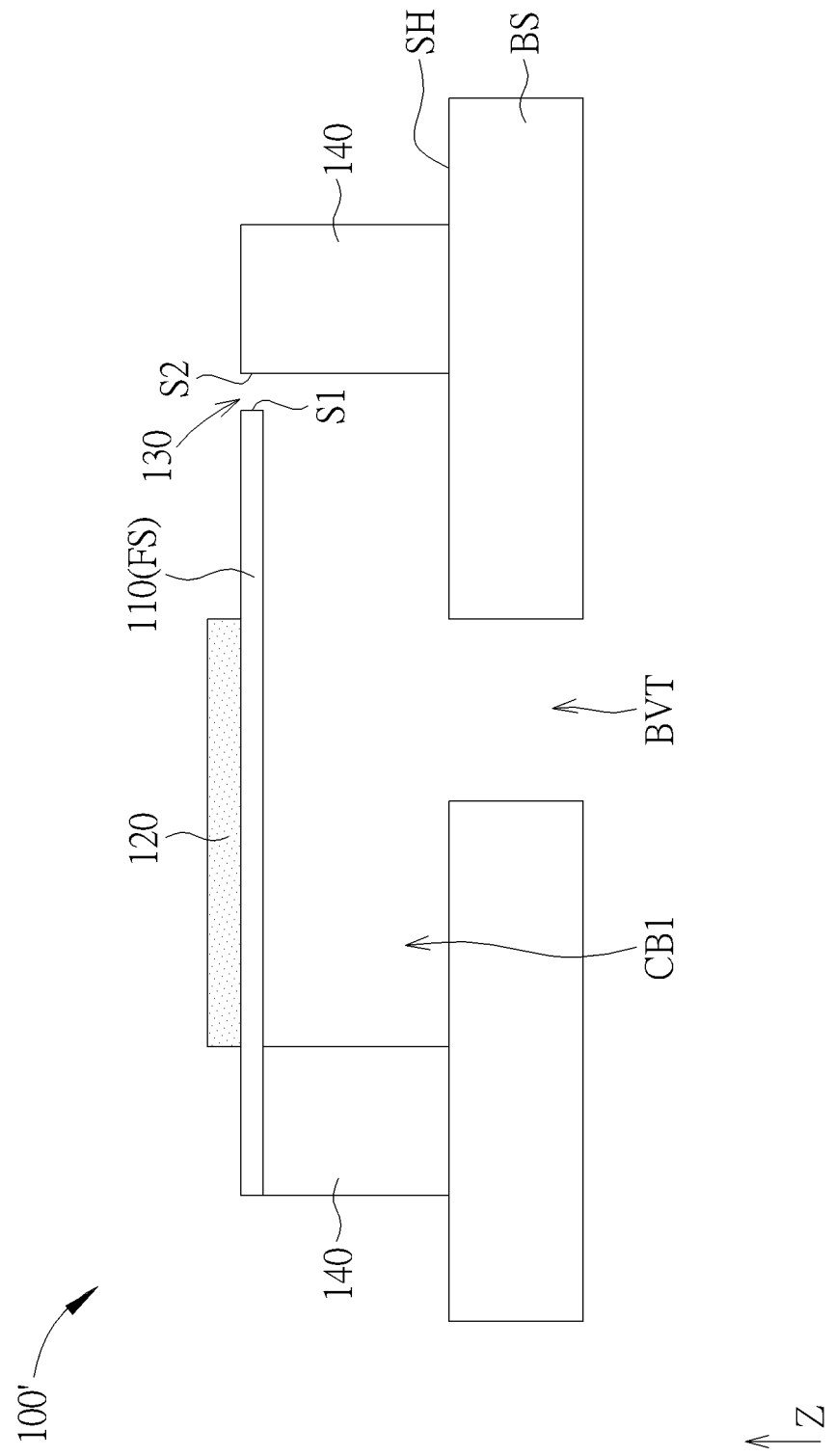
FIG. 10 to FIG. 12 are schematic diagrams of cross sectional views illustrating another type device according to an embodiment of the present invention.
Figure 11:
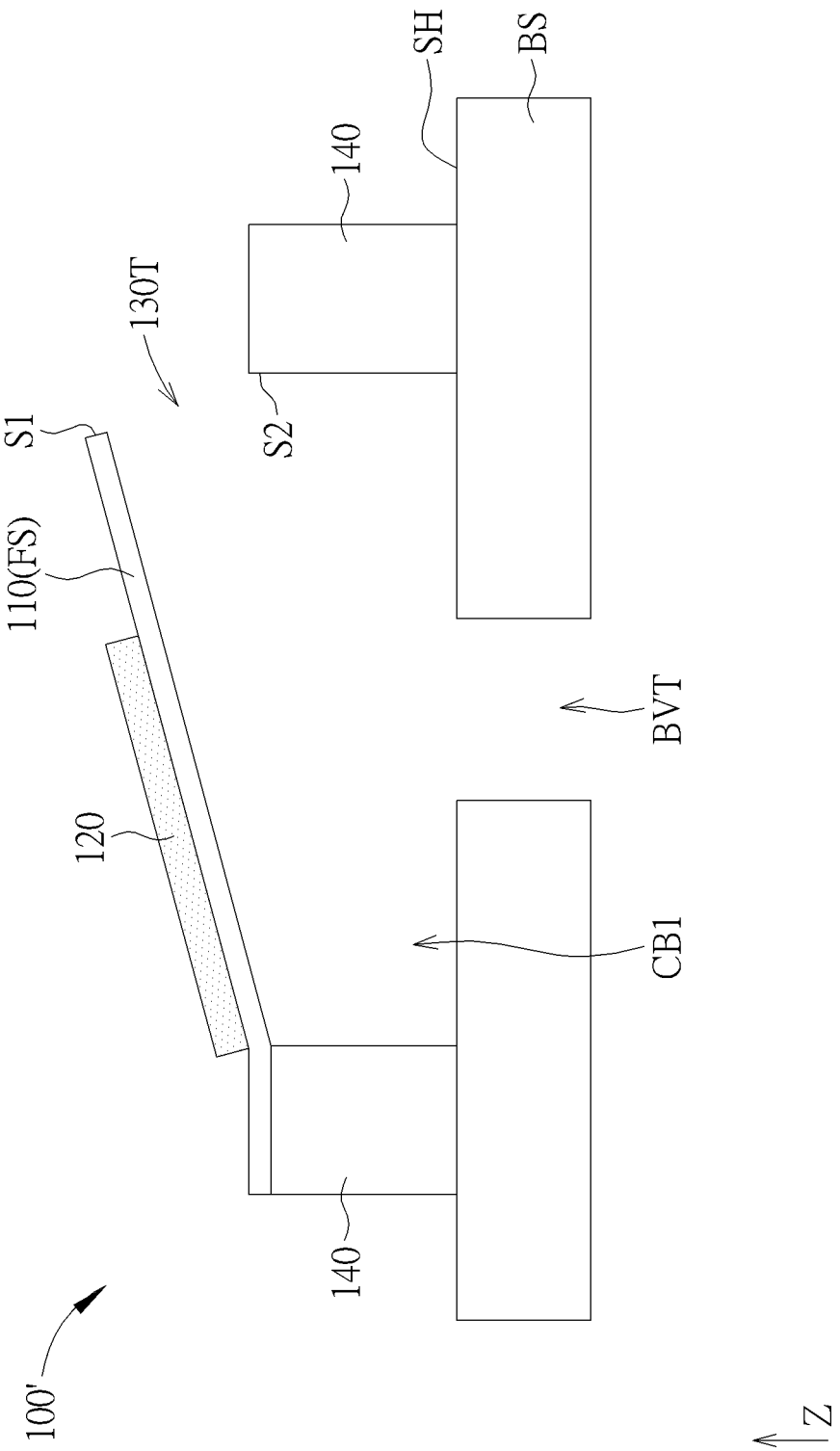
Figure 12:
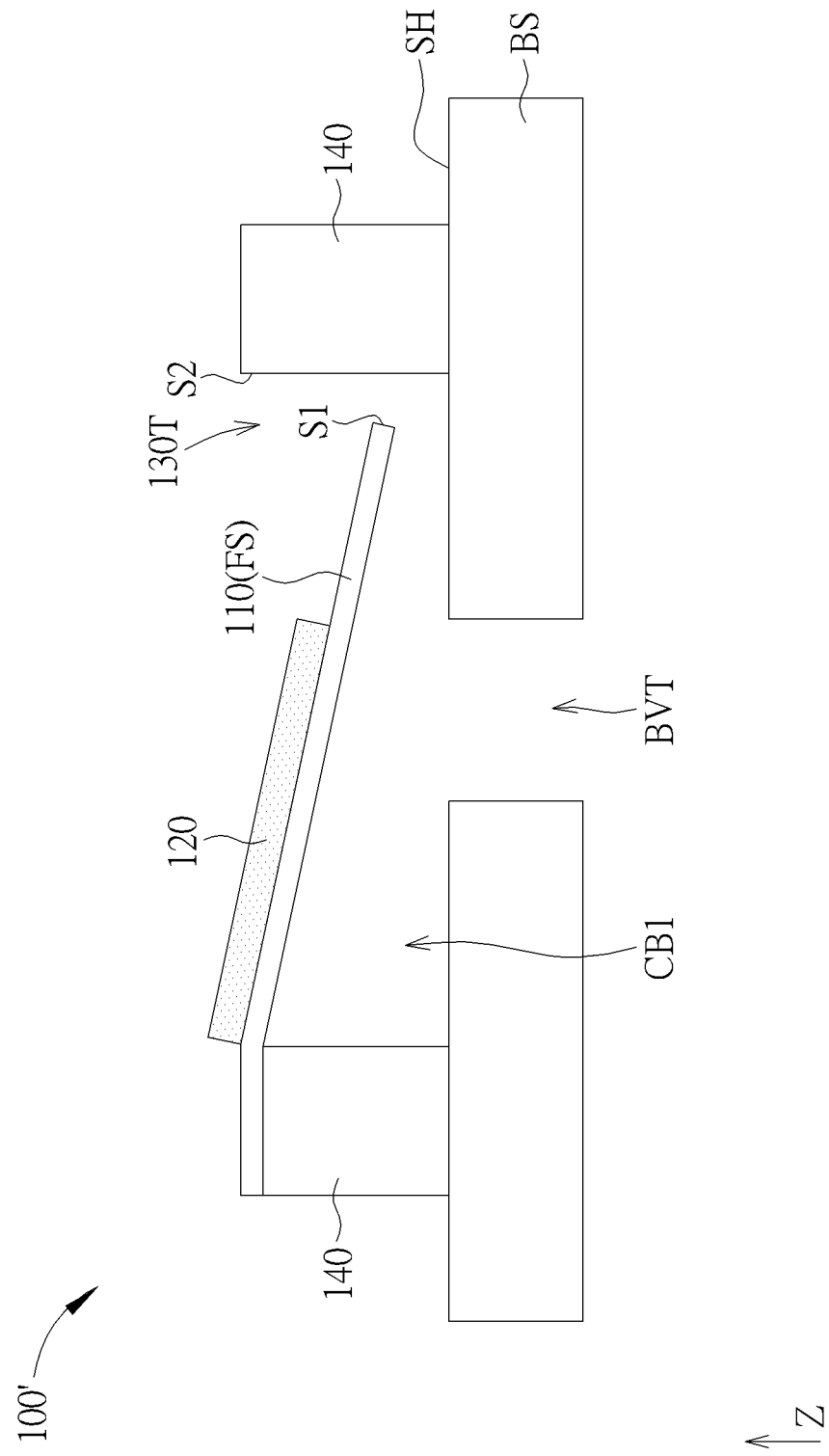

Referring to FIG. 10 to FIG. 12, FIG. 10 to FIG. 12 are schematic diagrams of cross sectional views illustrating another type device according to an embodiment of the present invention, wherein FIG. 10 shows the second mode of the device 100', and FIG. 11 and FIG. 12 show the first mode of the device 100'. As shown in FIG. 10 to FIG. 12, a difference between this device 100' and the device 100 is that the first membrane 110 of the device 100' of this embodiment includes the first sidewall S1 of the slit 130, but the first membrane 110 does not include the second sidewall S2 of the slit 130. Namely, the slit 130 is a part of the boundary of the first membrane 110 (i.e., the first sidewall S1 of the slit 130 may be one of the outer edges 110e of the first membrane 110). In FIG. 10 to FIG. 12, the second sidewall S2 of the slit 130 may be stationary/immobile during the operation of the device 100'. For example, the second sidewall S2 of the slit 130 may belong to the anchor structure 140, but not limited thereto. Because of the design of the slit 130 shown in FIG. 10 to FIG. 12, the anchor structure 140 may be not connected to a portion of the outer edges 110e of the first membrane 110, but not limited thereto.

In another aspect, as shown in FIG. 10 to FIG. 12, the first membrane 110 only include the first flap and does not include the second flap, wherein the first end of the first flap is anchored by one anchor structure 140, the second/free end of the first flap is configured to perform the first up-and-down movement (i.e., the second end of the first flap may move upwardly and downwardly) to form the vent 130T (the vent 130T is shown in FIG. 11 and FIG. 12), and the first sidewall S1 of the slit 130 belongs to the second/free end of the first flap.

In this design, because the second sidewall S2 is stationary/immobile during the operation of the device 100', the vent 130T may be formed by increasing the driving signal applied to first actuator 120 to cause the first sidewall S1 to move upwards in the direction Z, as in the case of FIG. 11. For example, the voltage across the electrodes of the first actuator 120 is 30V, so as to make the first sidewall S1 move upwards in the direction Z, but not limited thereto. Alternatively, in the case of FIG. 12, the first membrane 110 may have a negative initial displacement, i.e. the displacement of the first sidewall S1 in the direction Z may be −18 μm, as an example, when voltage across the electrodes of the first actuator 120 is 0V. Assuming the membrane thickness is 5 μm, as an example, meaning the height of the first sidewall S1 is 5 μm and status of the vent 130T, when 0V is applied to the first actuator 120, is "opened" with the opening size of the vent 130T equals to 18−5=13 μm. As such, in this embodiment, the vent 130T may be put in the second mode by applying a positive driving signal (e.g., 16V) to the first actuator 120 to cause the surface of the first membrane 110 to become substantially parallel to the horizontal surface SH, such as illustrated in FIG. 10; and the vent 130T may be put in the first mode by applying 0V to the first actuator 120.

Figure 13:
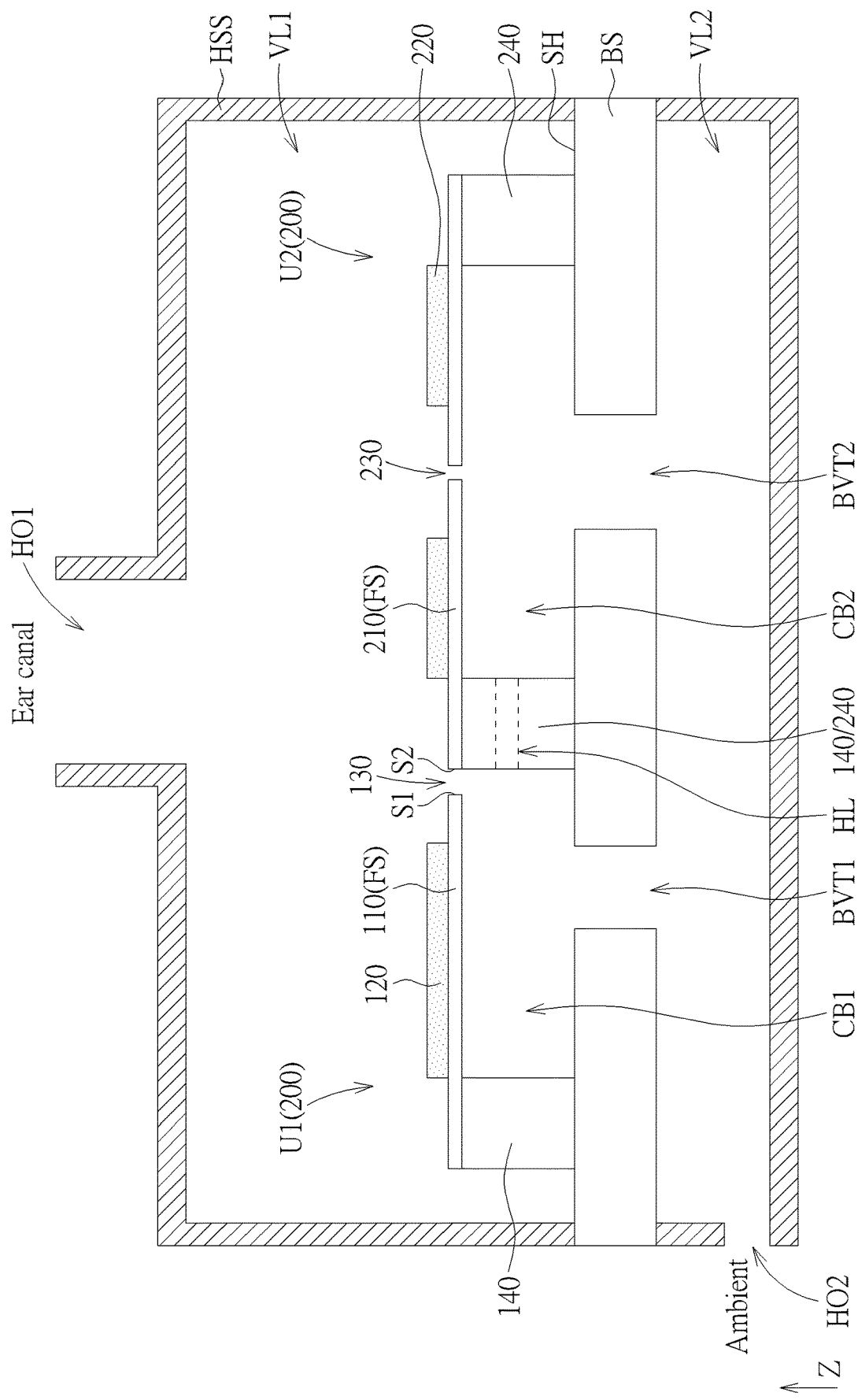
FIG. 13 is a schematic diagram of a cross sectional view illustrating the device according to a second embodiment of the present invention.

Referring to FIG. 13, FIG. 13 is a schematic diagram of a cross sectional view illustrating the device according to a second embodiment of the present invention. As shown in FIG. 13, a difference between this embodiment and the first embodiment is that the device 200 of this embodiment further includes a second membrane 210, a second actuator 220 and an anchor structure 240 which are disposed on the horizontal surface SH of the base BS, wherein the second membrane 210 is anchored by the anchor structure 240, the second actuator 220 is configured to actuate the second membrane 210, and a chamber CB2 exists between the base BS and the second membrane 210. In this embodiment, the film structure FS may include the first membrane 110 and the second membrane 210, but not limited thereto. In this embodiment, the device 200 may optionally include a chip disposed on the horizontal surface SH of the base BS, and the chip may include the film structure FS (including the first membrane 110 and the second membrane 210), the first actuator 120, the second actuator 220 and the anchor structures 140 and 240 at least (i.e., these structures are integrated in one chip), but not limited thereto.

The function provided from the first membrane 110 and the first actuator 120 is different from the function provided from the second membrane 210 and the second actuator 220. In this embodiment, the first membrane 110 and the first actuator 120 may be configured to suppress the occlusion effect, and the second membrane 210 and the second actuator 220 may be configured to perform the acoustic transformation. That is to say, the first membrane 110 and the first actuator 120 do not perform the acoustic transformation.

In detail, in the first mode, the first actuator 120 may generate the vent 130T formed between the first sidewall S1 and the second sidewall S2 of the slit 130 in the direction Z (the normal direction of the horizontal surface SH of the base BS). In the second mode, the first actuator 120 may not generate the vent 130T between the first sidewall S1 and the second sidewall S2 of the slit 130 in the direction Z. Whether the device 200 is in the first mode or the second mode, the second actuator 220 may receive an acoustic driving signal corresponding to (related to) the value(s) of the input audio signal to generate the acoustic wave. Namely, the driving signal(s) applied on the first actuator 120 may not be corresponding to (related to) the value(s) of the input audio signal. For instance, in the first driving method, the first driving signal may include a vent generating signal (e.g., the 30V in discussion associated with FIG. 11 or the 0V in discussion associated with FIG. 12), and the second driving signal may include a vent restraining signal (e.g., the 16V in discussion associated with FIG. 10), but not limited thereto.

The second membrane 210, the second actuator 220 and the anchor structure 240 may be designed based on requirement(s), wherein the design of the second membrane 210, the second actuator 220 and the anchor structure 240 needs to be suitable for generating the acoustic wave. For instance, in this embodiment, the top view of the second membrane 210, the second actuator 220 and the anchor structure 240 may be similar to the first membrane 110, the first actuator 120 and the anchor structure 140 of the first embodiment shown in FIG. 1, but not limited thereto. Note that the second membrane 210 may have at least one slit 230, such that the displacement of the second membrane 210 may be increased and/or the second membrane 210 may deform elastically during the operation of the device 200, but not limited thereto.

The material and the type of the second membrane 210 may be referred to the first membrane 110 described in the first embodiment, and thus, these will not be redundantly described. The material and the type of the second actuator 220 may be referred to the first actuator 120 described in the first embodiment, and thus, these will not be redundantly described. The material of the anchor structure 240 may be referred to the anchor structure 140 described in the first embodiment, and thus, this will not be redundantly described.

Note that the second membrane 210, the slit(s) 230, the second actuator 220 and the anchor structure 240 may be considered as a second unit U2.

The first unit U1 may be designed based on requirement(s), wherein the design of the first membrane 110, the first actuator 120 and the slit(s) 130 needs to be suitable for suppressing the occlusion effect. In this embodiment, the first membrane 110 of the first unit U1 of this embodiment includes the first sidewall S1 of the slit 130 but does not include the second sidewall S2 of the slit 130 (i.e., the first membrane 110 only include the first flap and does not include the second flap). For example, as shown in FIG. 13, the first unit U1 may be similar to the device 100' shown in FIG. 10, but not limited thereto.

Moreover, the chamber CB1 may be connected to the chamber CB2. In this embodiment, the base BS may include a plurality back vents BVT1 and BVT2, the chamber CB1 may be connected to the rear outside of the device 200 (i.e., a space on the back of the base BS) through the back vent BVT1, the chamber CB2 may be connected to the rear outside of the device 200 (i.e., a space on the back of the base BS) through the back vent BVT2, and the chamber CB1 may be connected to the chamber CB2 through the back vent BVT1, the rear outside of the device 200 (i.e., a portion of the second volume VL2) and the back vent BVT2, but not limited thereto.

In another embodiment, an air channel may exist between the first membrane 110 and the base BS, such that the chamber CB1 may be connected to the chamber CB2 through the air channel. For instance, the air channel may be a hole HL passing through the two opposite lateral sides of the anchor structure 140/240, such that the chamber CB1 may be connected to the chamber CB2 through the hole HL, but not limited thereto.

During fabrication, as will be detailed later in the present disclosure, the first membrane 110 and the second membrane 210 may all be fabricated during one single planar thin film fabrication sequence; the first actuator 120 and the second actuator 220 may all be fabricated during another single planar thin film fabrication sequence; and the chamber CB1, the chamber CB2 and the anchor structures 140, 240, 140/240 may be formed during one single bulk silicon etching sequence.

Figure 14:
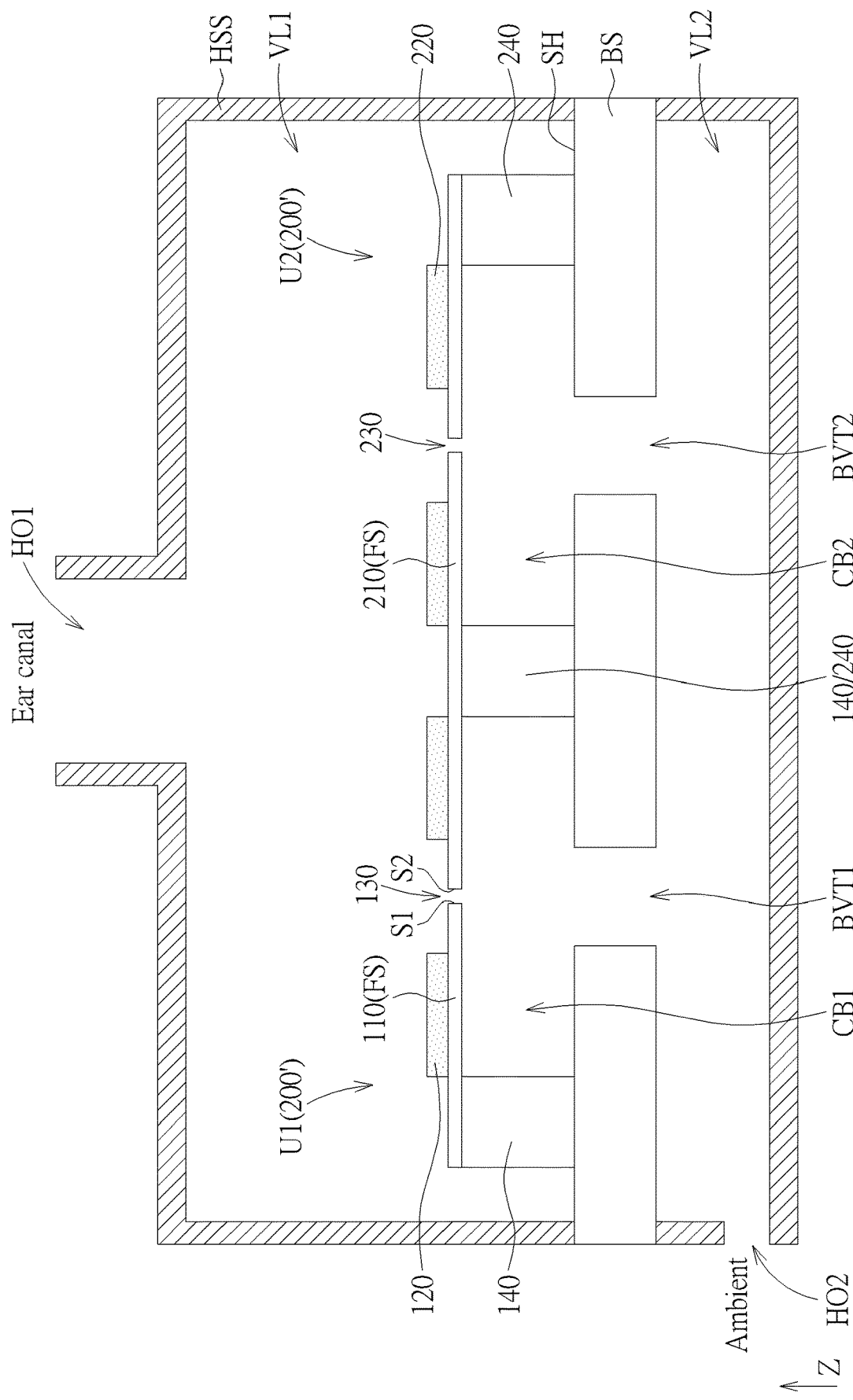
FIG. 14 is a schematic diagram of a cross sectional view illustrating the device according to another second embodiment of the present invention.

Referring to FIG. 14, FIG. 14 is a schematic diagram of a cross sectional view illustrating the device according to another second embodiment of the present invention. As shown in FIG. 14, compared with the device 200 in FIG. 13, the first membrane 110 of the first unit U1 of the device 200' includes the first sidewall S1 and the second sidewall S2 of the slit 130 (i.e., the first membrane 110 include the first flap and the second flap). For example, as shown in FIG. 14, the first unit U1 may be similar to the device 100 shown in FIG. 1, but not limited thereto.

In some embodiment, such as illustrated in FIG. 14, the design of the first unit U1 (the first membrane 110, the first actuator 120 and the slit 130) may have the same cross-section, from a particular perspective, as the design of the second unit U2 (the second membrane 210, the second actuator 220, the slit 230).

Figure 15:
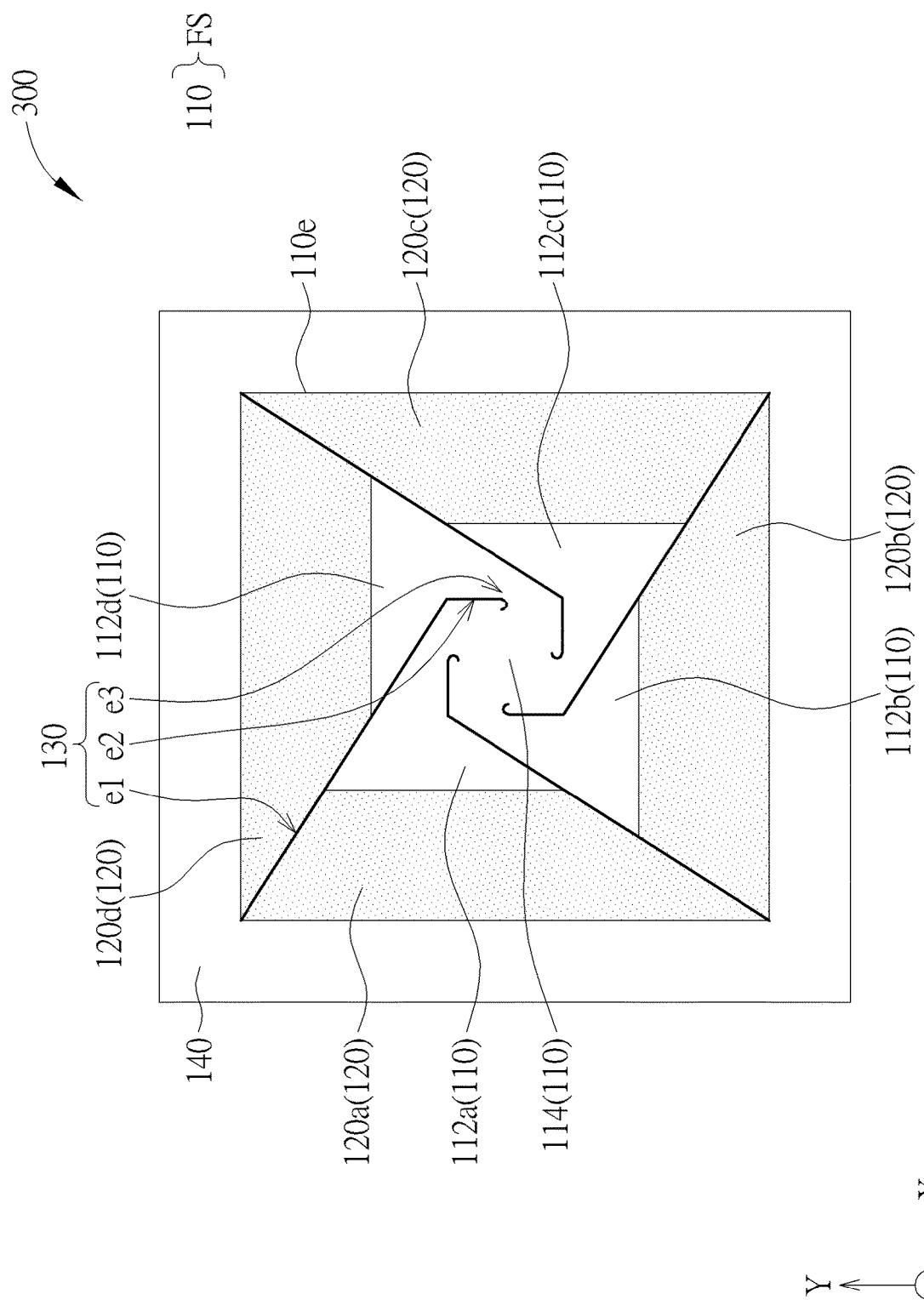
FIG. 15 is a schematic diagram of a top view illustrating a device according to a third embodiment of the present invention.

Referring to FIG. 15, FIG. 15 is a schematic diagram of a top view illustrating a device according to a third embodiment of the present invention. Note that the design of the membrane, the actuator, the slit(s) and the anchor structure of the device 300 of the third embodiment may be applied to the first unit U1 and/or the second unit U2.

As shown in FIG. 15, a difference between the first embodiment and this embodiment is the arrangement of the slits 130 and the first actuator 120. In this embodiment, the slit 130 may be a combination of straight slits and curved slits. In FIG. 15, the slit 130 of this embodiment may include a first portion e1, a second portion e2 connected to the first portion e1 and a third portion e3 connected to the second portion e2, and the first portion e1, the second portion e2 and the third portion e3 are arranged in sequence from the outer edge 110e to the inner of the first membrane 110. In the slit 130, the first portion e1 and the second portion e2 may be straight slits extending different direction, and the third portion e3 may be a curved slit, but not limited thereto. The third portion e3 might have a hook-shaped curved end of the slit 130, wherein the hook-shaped curved ends surround the coupling plate 114 of the first membrane 110. The hook-shaped curved end implies that, a curvature at the curved end or at the third portion e3 is larger than curvature(s) at the first portion e1 or the second portion e2, from a top view perspective. In addition, the slit 130 with the hook shape extends toward the center of the first membrane 110, or toward the coupling plate 114 within the first membrane 110. The slit 130 may be carving out a fillet in the first membrane 110.

The curved end of the third portion e3 may be configured to minimize stress concentration near the end of the slit 130.

Figure 16:
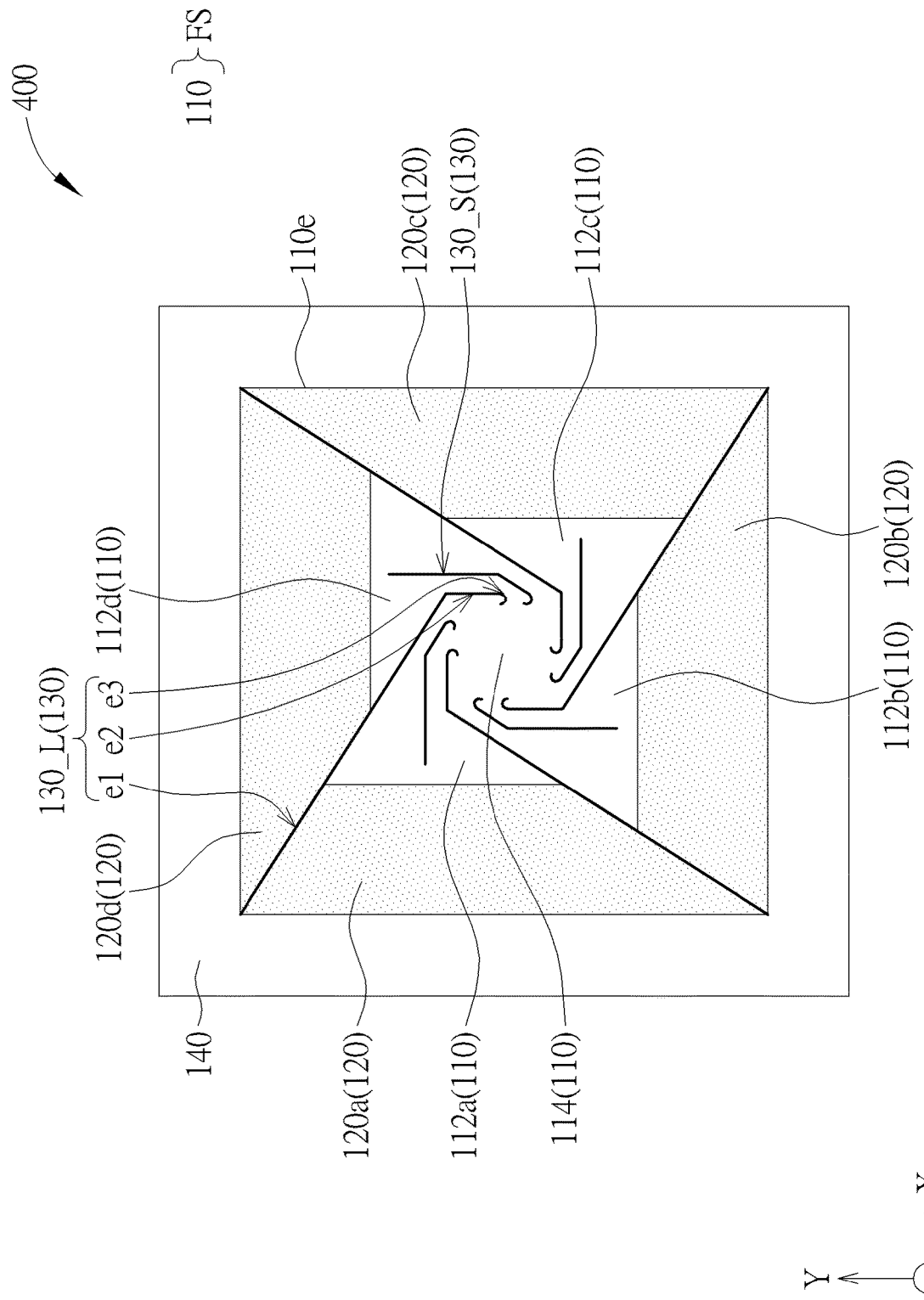
FIG. 16 is a schematic diagram of a top view illustrating a device according to a fourth embodiment of the present invention.

Referring to FIG. 16, FIG. 16 is a schematic diagram of a top view illustrating a device according to a fourth embodiment of the present invention. Note that the design of the membrane, the actuator, the slit(s) and the anchor structure of the device 400 of the fourth embodiment may be applied to the first unit U1 and/or the second unit U2.

As shown in FIG. 16, a difference between the third embodiment and this embodiment is the arrangement of the slits 130. In this embodiment, some slits 130 may be shorter, and each shorter slit 130_S is between two longer slits 130_L, but not limited thereto. In FIG. 16, the shorter slit 130_S may not be connected to the outer edge 110e of the first membrane 110, but not limited thereto.

The shorter slit 130_S may be a combination of straight slits and curved slits, and the pattern of the shorter slit 130_S may be similar to the pattern of the longer slit 130_L. Moreover, in FIG. 16, the shorter slit 130_S may not be situated in the region on which the first actuator 120 is disposed, but not limited thereto.

Figure 17:
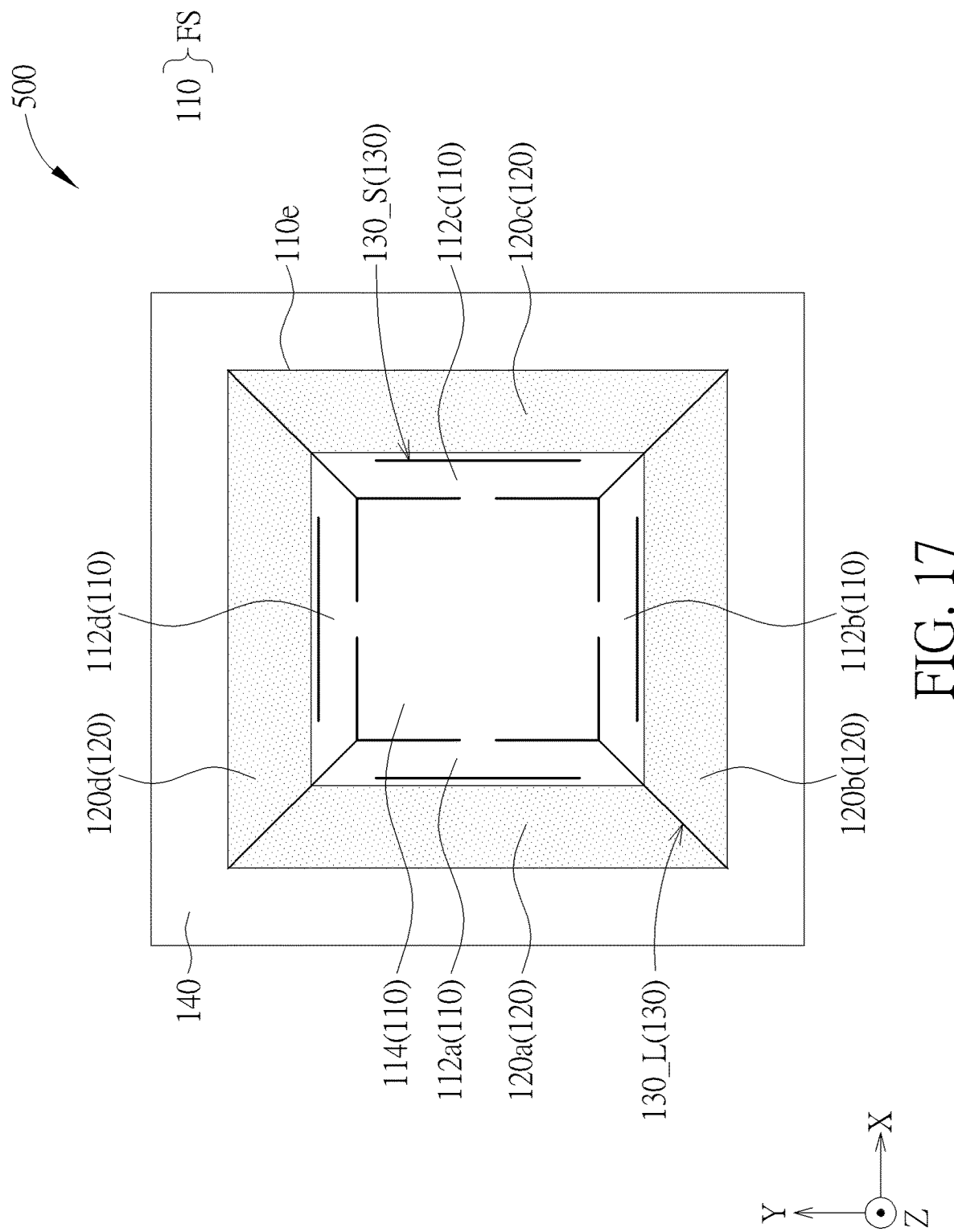
FIG. 17 is a schematic diagram of a top view illustrating a device according to a fifth embodiment of the present invention.

Referring to FIG. 17, FIG. 17 is a schematic diagram of a top view illustrating a device according to a fifth embodiment of the present invention. Note that the design of the membrane, the actuator, the slit(s) and the anchor structure of the device 500 of the fifth embodiment may be applied to the first unit U1 and/or the second unit U2.

As shown in FIG. 17, a difference between the first embodiment and this embodiment is the arrangement of the slits 130 and the first actuator 120. In this embodiment, the longer slit 130_L may be a combination of straight slits (e.g., three straight slits forming a Y-shape), but not limited thereto. In this embodiment, the shorter slit 130_S may be between two longer slits 130_L, and the shorter slit 130_S may not be connected to the outer edge 110e of the first membrane 110, but not limited thereto. In FIG. 17, the shorter slit 130_S may be a straight slit, and the shorter slit 130_S may be parallel to a portion of the longer slit 130_L, but not limited thereto.

Figure 18:
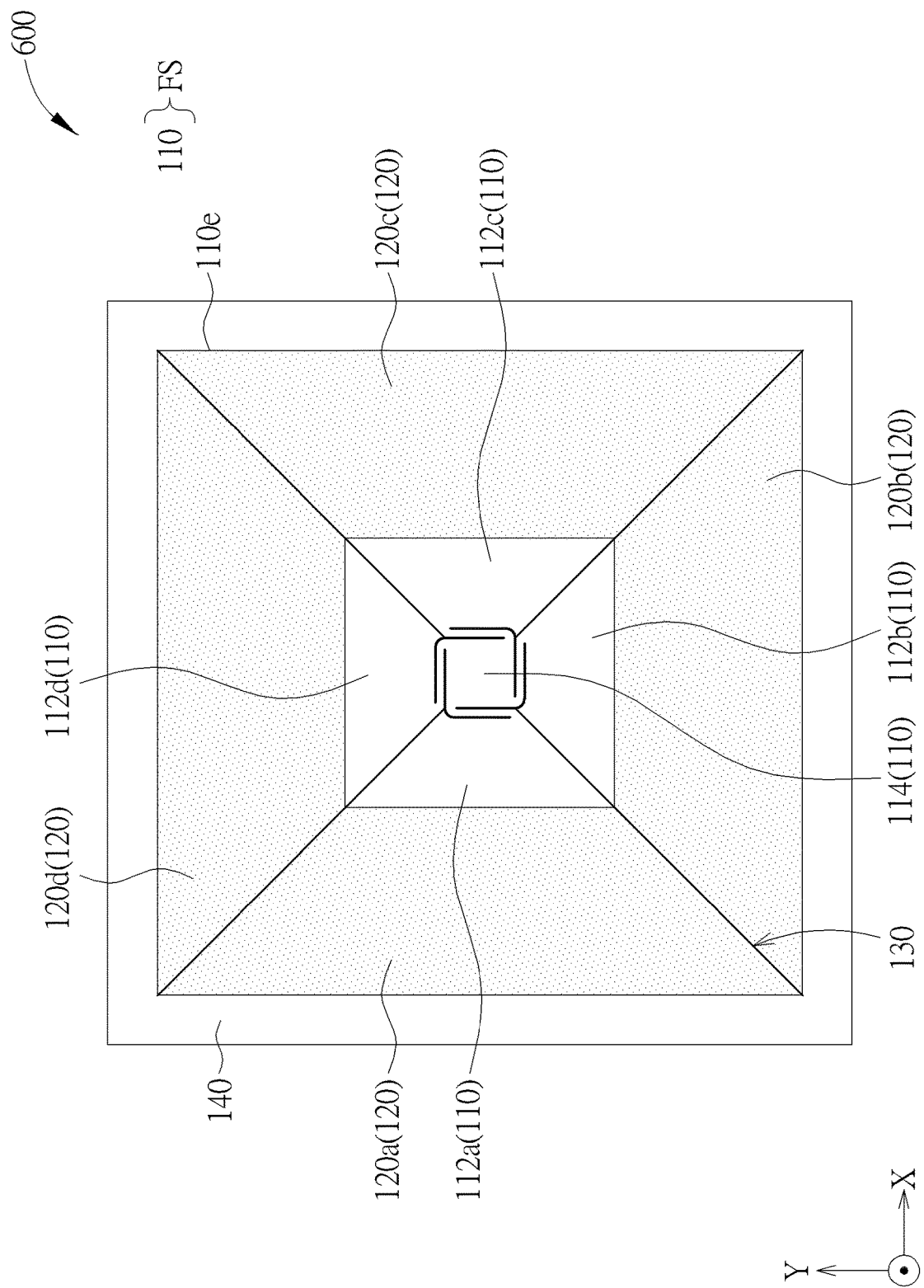
FIG. 18 is a schematic diagram of a top view illustrating a device according to a sixth embodiment of the present invention.

Referring to FIG. 18, FIG. 18 is a schematic diagram of a top view illustrating a device according to a sixth embodiment of the present invention. Note that the design of the membrane, the actuator, the slit(s) and the anchor structure of the device 600 of the sixth embodiment may be applied to the first unit U1 and/or the second unit U2.

As shown in FIG. 18, a difference between the first embodiment and this embodiment is the arrangement of the slits 130 and the first actuator 120. In this embodiment, the slit 130 may be a combination of straight slits and curved slits (e.g., two straight slits and a combined slit formed of one curved slit and one straight slit, and these slits forming a Y-shape), but not limited thereto.

Referring to the upper portion of FIG. 18 which substantially shows a quarter of the first membrane 110, a straight slit of one slit 130 and a straight slit of a combined slit of another slit 130 are parallel to each other and overlap along the direction Y, but not limited thereto.

Figure 19:
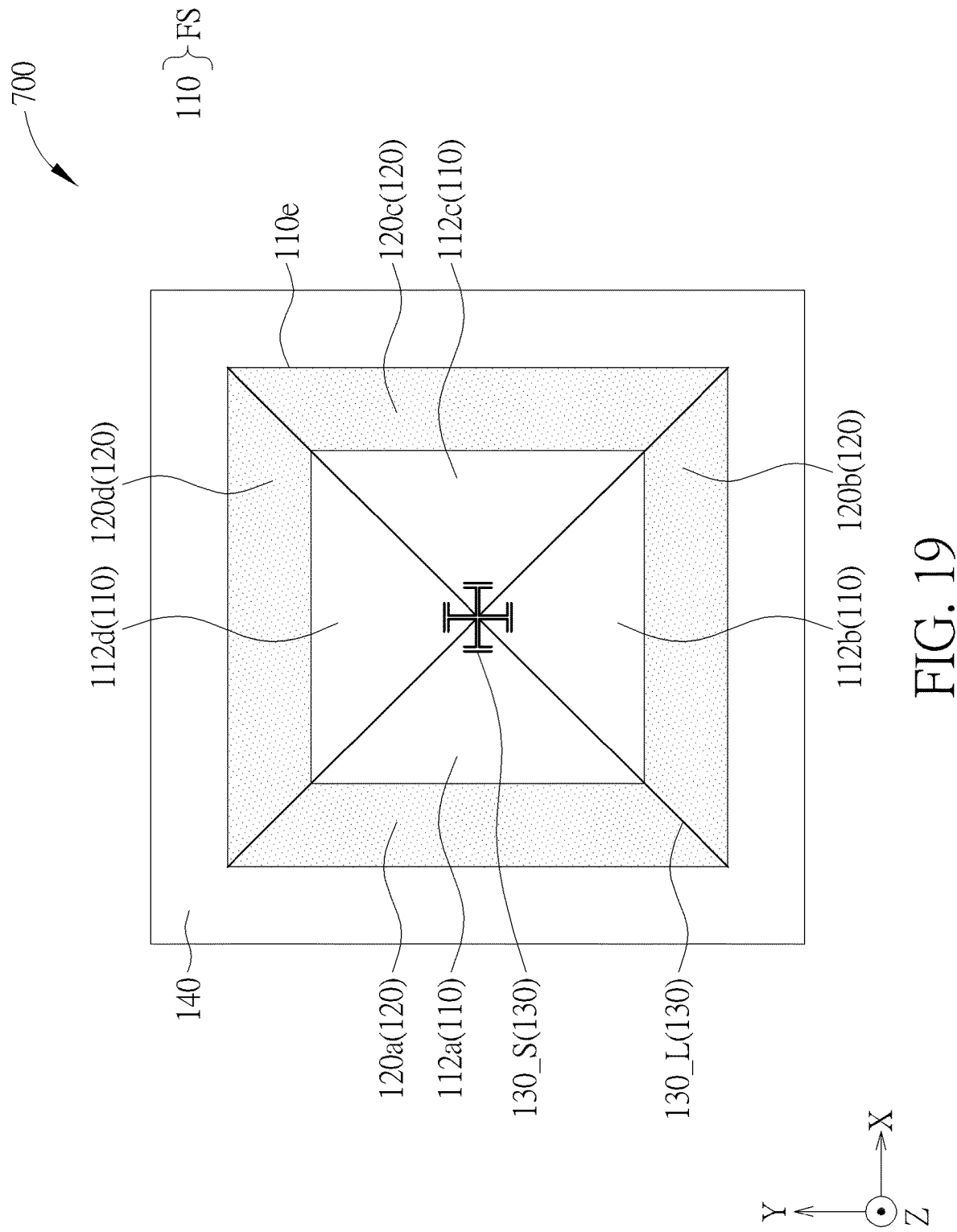
FIG. 19 is a schematic diagram of a top view illustrating a device according to a seventh embodiment of the present invention.
Figure 20:
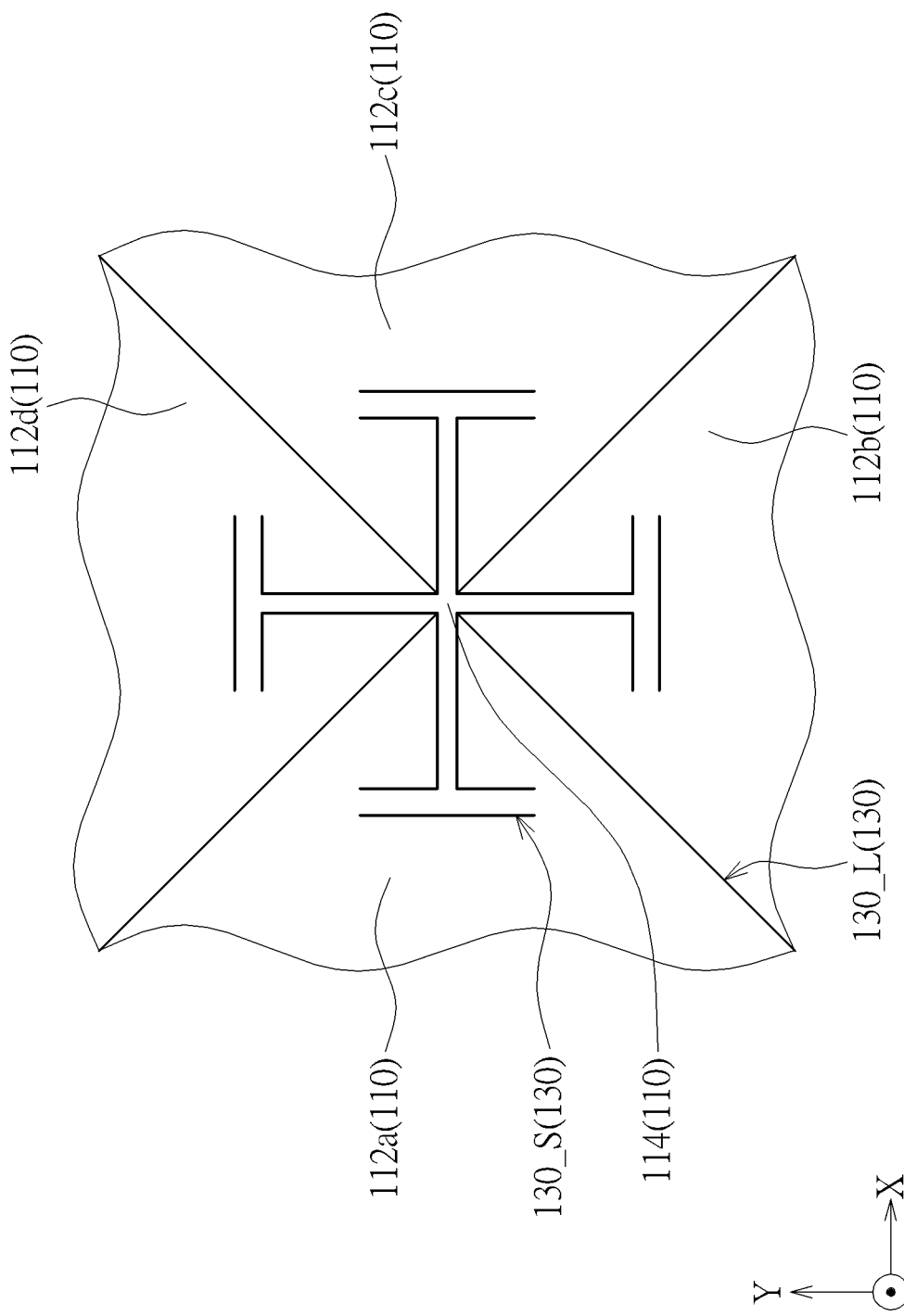
FIG. 20 is an enlarge diagram illustrating a center part of FIG. 19.

Referring to FIG. 19 and FIG. 20, FIG. 19 is a schematic diagram of a top view illustrating a device according to a seventh embodiment of the present invention, and FIG. 20 is an enlarge diagram illustrating a center part of FIG. 19. Note that the design of the membrane, the actuator, the slit(s) and the anchor structure of the device 700 of the seventh embodiment may be applied to the first unit U1 and/or the second unit U2.

As shown in FIG. 19 and FIG. 20, a difference between the first embodiment and this embodiment is the arrangement of the slits 130 and the first actuator 120. In this embodiment, the longer slit 130_L may be a combination of straight slits (e.g., three straight slits), but not limited thereto. In this embodiment, the shorter slit 130_S which is not connected to the outer edge 110e of the first membrane 110 may be a straight slit, wherein the shorter slit 130_S may be parallel to a portion of the longer slit 130_L, but not limited thereto.

Moreover, as shown in FIG. 19 and FIG. 20, a ratio of the area of the coupling plate 114 to the area of the first membrane 110 may be much small, but not limited thereto.

Figure 21:
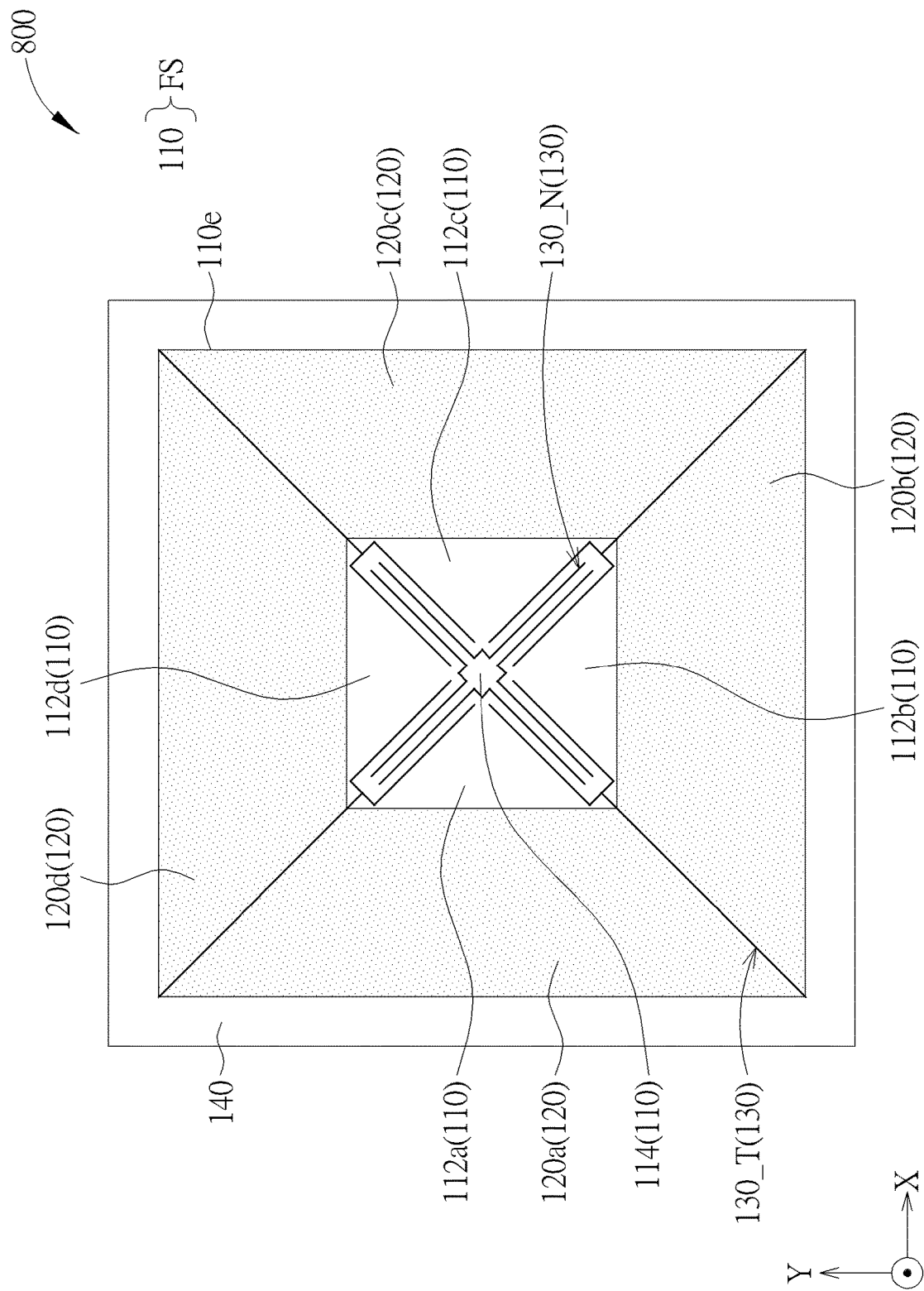
FIG. 21 is a schematic diagram of a top view illustrating a device according to an eighth embodiment of the present invention.

Referring to FIG. 21, FIG. 21 is a schematic diagram of a top view illustrating a device according to an eighth embodiment of the present invention. Note that the design of the membrane, the actuator, the slit(s) and the anchor structure of the device 800 of the eighth embodiment may be applied to the first unit U1 and/or the second unit U2.

As shown in FIG. 21, a difference between the first embodiment and this embodiment is the arrangement of the slits 130 and the first actuator 120. In this embodiment, the outer slit 130_T may be a combination of straight slits forming a Y-shape, but not limited thereto. In this embodiment, the inner slit 130_N which is not connected to the outer edge 110e of the first membrane 110 may be a combination of straight slits forming a W-shape. In FIG. 21, a portion of the inner slit 130_N is parallel to a portion of the outer slit 130_T, but not limited thereto.

Moreover, in FIG. 21, a ratio of the area of the coupling plate 114 to the area of the first membrane 110 may be much small, but not limited thereto.

Note that, the arrangements of the slit(s) 130 described in the above embodiments are examples. Any suitable arrangement of the slit(s) 130 can be used in the present invention.

Figure 22:
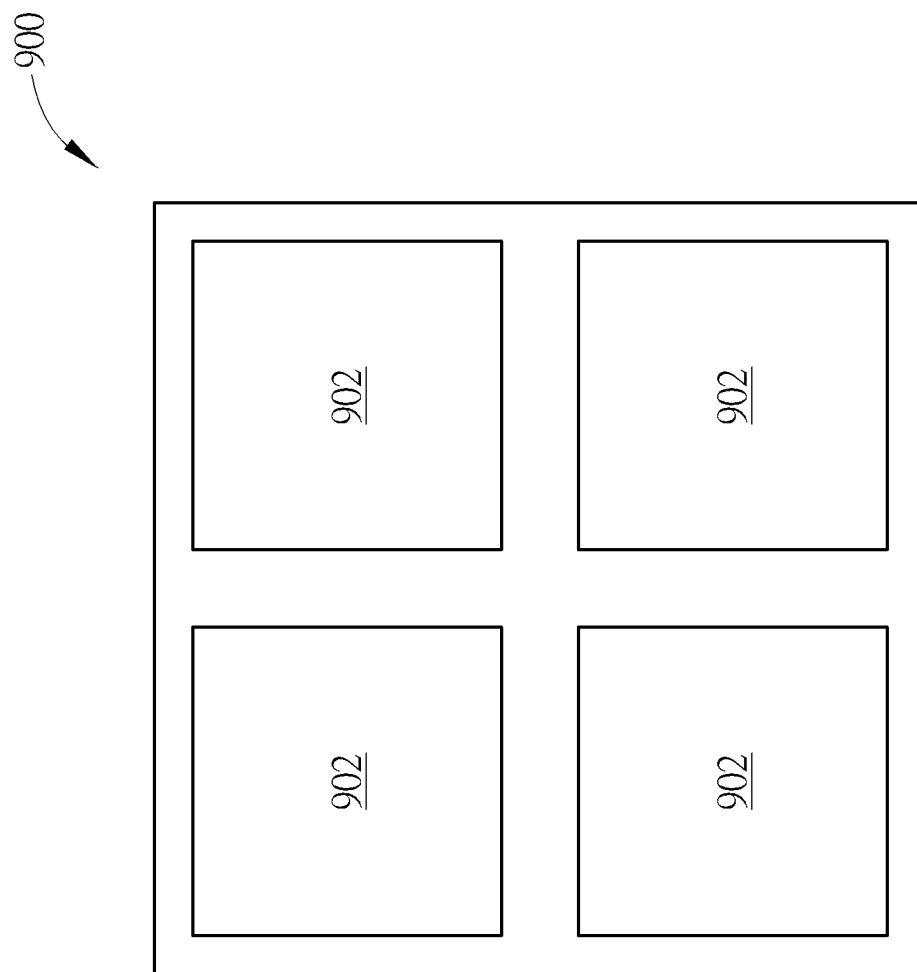
FIG. 22 is a schematic diagram of a top view illustrating a device according to a ninth embodiment of the present invention.

Referring to FIG. 22, FIG. 22 is a schematic diagram of a top view illustrating a device according to a ninth embodiment of the present invention. As shown in FIG. 22, the device 900 may include a plurality of units 902 (i.e., the first unit(s) U1, the second unit(s) U2 or a combination thereof), so as to include a plurality of membranes. In FIG. 22, the device 900 includes four units 902 to form the 2×2 array, but not limited thereto. In the present invention, the device 900 may include one single chip including all units 902, or the device 900 may include a plurality of chips (the chips may be the same or different) to achieve a plurality of units 902.

Note that, FIG. 22 is for illustrative purpose, which demonstrates a concept of the device 900 including multiple sound producing units 902. Construct of each membrane is not limited, and the membranes are the same or different.

Because of the plurality of units 902 included in the device 900, the acoustic wave may be generated by these units 902 with any suitable manner. In some embodiments, the units 902 may generate the acoustic wave at the same time, such that the SPL of the acoustic wave may be greater, but not limited thereto.

In some embodiments, the units 902 may generate the acoustic wave in a temporally interleaved manner. Regarding to the temporally interleaved manner, the sound producing units 902 are divided into a plurality of groups and generate air pulses, air pulses generated by different groups may be temporally interleaved, and these air pulses are combined to be the overall air pulses reproducing the acoustic wave. If the units 902 are divided into M groups, and the array of the air pulses generated by each group has the pulse rate PRG, the overall pulse rate of the overall air pulses is M·PRG. Namely, the pulse rate of the array of the air pulses generated by one group (i.e., one or some unit(s)) is less than the overall pulse rate of the overall air pulses generated by all group (i.e., all of the units 902) if the number of the group is greater than 1.

Figure 23:
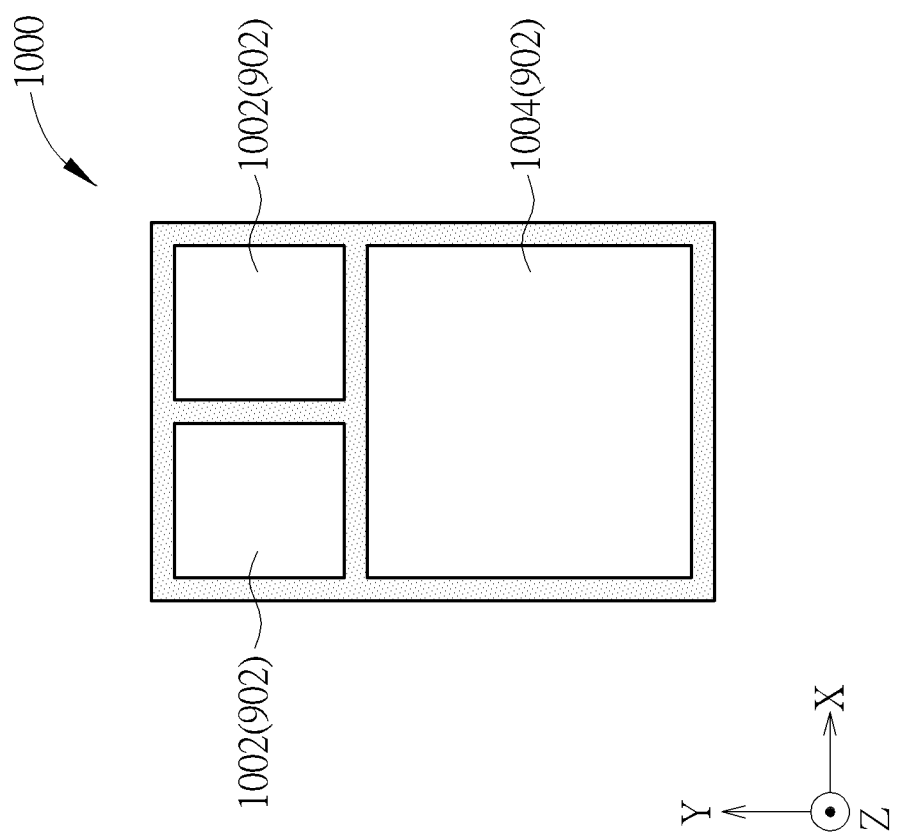
FIG. 23 is a schematic diagram of a top view illustrating a device according to a tenth embodiment of the present invention.

Referring to FIG. 23, FIG. 23 is a schematic diagram of a top view illustrating a device according to a tenth embodiment of the present invention. As shown in FIG. 23, a difference between the ninth embodiment and this embodiment is that the units 902 of the device 1000 of this embodiment may have different sizes, wherein the smaller unit 902 may be a high frequency sound unit (tweeter) 1002, and the greater unit 902 may be a low frequency sound unit (woofer) 1004. Note that the design of the high frequency sound unit 1002 may be the aforementioned first unit U1, the aforementioned second unit U2 or a combination thereof, and the design of the low frequency sound unit 1004 may be the aforementioned first unit U1, the aforementioned second unit U2 or a combination thereof.

In the device 1000, the high frequency sound unit 1002 configured to the high frequency acoustic transformation, the low frequency sound unit 1004 configured to the low frequency acoustic transformation, but not limited thereto.

In the following, the details of a manufacturing method of the device will be further exemplarily explained. Note that the manufacturing method is not limited by the following embodiments which are exemplarily provided, and the manufacturing method may manufacture the device including the first unit(s) U1 and/or the second unit(s) U2. Note that in the following manufacturing method, the actuator (e.g., the first actuator 120 and/or the second actuator 220) in the device may be a piezoelectric actuator for example, but not limited thereto. Any suitable type actuator can be used in the device.

In the following manufacturing method, the forming process may include atomic layer deposition (ALD), a chemical vapor deposition (CVD) and other suitable process (es) or a combination thereof. The patterning process may include such as a photolithography, an etching process, any other suitable process(es) or a combination thereof.

Figure 24:
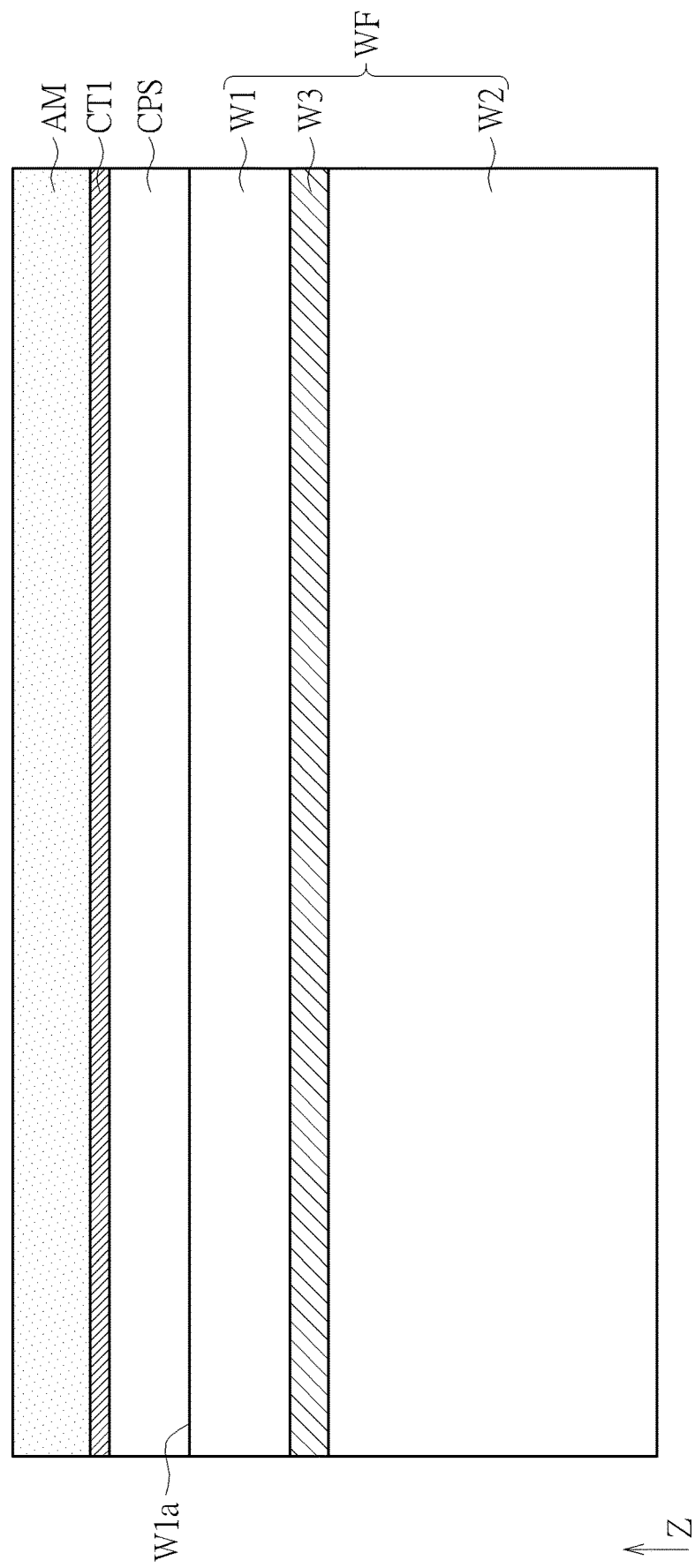
FIG. 24 to FIG. 30 are schematic diagrams illustrating structures at different stages of a manufacturing method of a device according to an embodiment of the present invention.

Referring to FIG. 24 to FIG. 30, FIG. 24 to FIG. 30 are schematic diagrams illustrating structures at different stages of a manufacturing method of a device according to an embodiment of the present invention. In this embodiment, the device may be manufactured by at least one semiconductor process, but not limited thereto. As shown in FIG. 24, a wafer WF is provided, wherein the wafer WF includes a first layer W1, an electrical insulating layer W3 and a second layer W2, wherein the insulating layer W3 is formed between the first layer W1 and the second layer W2.

The first layer W1, the insulating layer W3 and the second layer W2 may individually include any suitable material, such that the wafer WF may be any suitable type. For instance, the first layer W1 and the second layer W2 may individually include silicon (e.g., single crystalline silicon or poly-crystalline silicon), silicon carbide, germanium, gallium nitride, gallium arsenide, stainless steel, and other suitable high stiffness material or a combination thereof. In some embodiments, the first layer W1 may include single crystalline silicon, such that the wafer WF is a silicon on insulator (SOI) wafer, but not limited thereto. In some embodiments, the first layer W1 may include poly-crystalline silicon, such that the wafer WF is a polysilicon on insulator (POI) wafer, but not limited thereto. For instance, the insulating layer W3 may include oxide, such as silicon oxide (e.g., silicon dioxide), but not limited thereto.

The thicknesses of the first layer W1, the insulating layer W3 and the second layer W2 may be individually adjusted based on requirement(s). For example, the thickness of the first layer W1 may be 5 µm, and the thickness of the second layer W2 may be 350 µm, but not limited thereto.

In FIG. 24, a compensation oxide layer CPS may be optionally formed on a first side of the wafer WF, wherein the first side is upper than a top surface W1a of the first layer W1 opposite to the second layer W2, such that the first layer W1 is between the compensation oxide layer CPS and the second layer W2. The material of oxide contained in the compensation oxide layer CPS and the thickness of the compensation oxide layer CPS may be designed based on requirement(s).

In FIG. 24, a first conductive layer CT1 and an actuating material AM may be formed on the first side of the wafer WF (on the first layer W1) in sequence, such that the first conductive layer CT1 may be between the actuating material AM and the first layer W1 (e.g., and/or between the actuating material AM and the compensation oxide layer CPS). In some embodiments, the first conductive layer CT1 is in contact with the actuating material AM.

The first conductive layer CT1 may include any suitable conductive material, and the actuating material AM may include any suitable material. In some embodiment, the first conductive layer CT1 may include metal (such as platinum), and the actuating material AM may include a piezoelectric material, but not limited thereto. For example, the piezoelectric material may include such as a lead-zirconate-titanate (PZT) material, but not limited thereto. Moreover, the thicknesses of the first conductive layer CT1 and the actuating material AM may be individually adjusted based on requirement(s).

Figure 25:
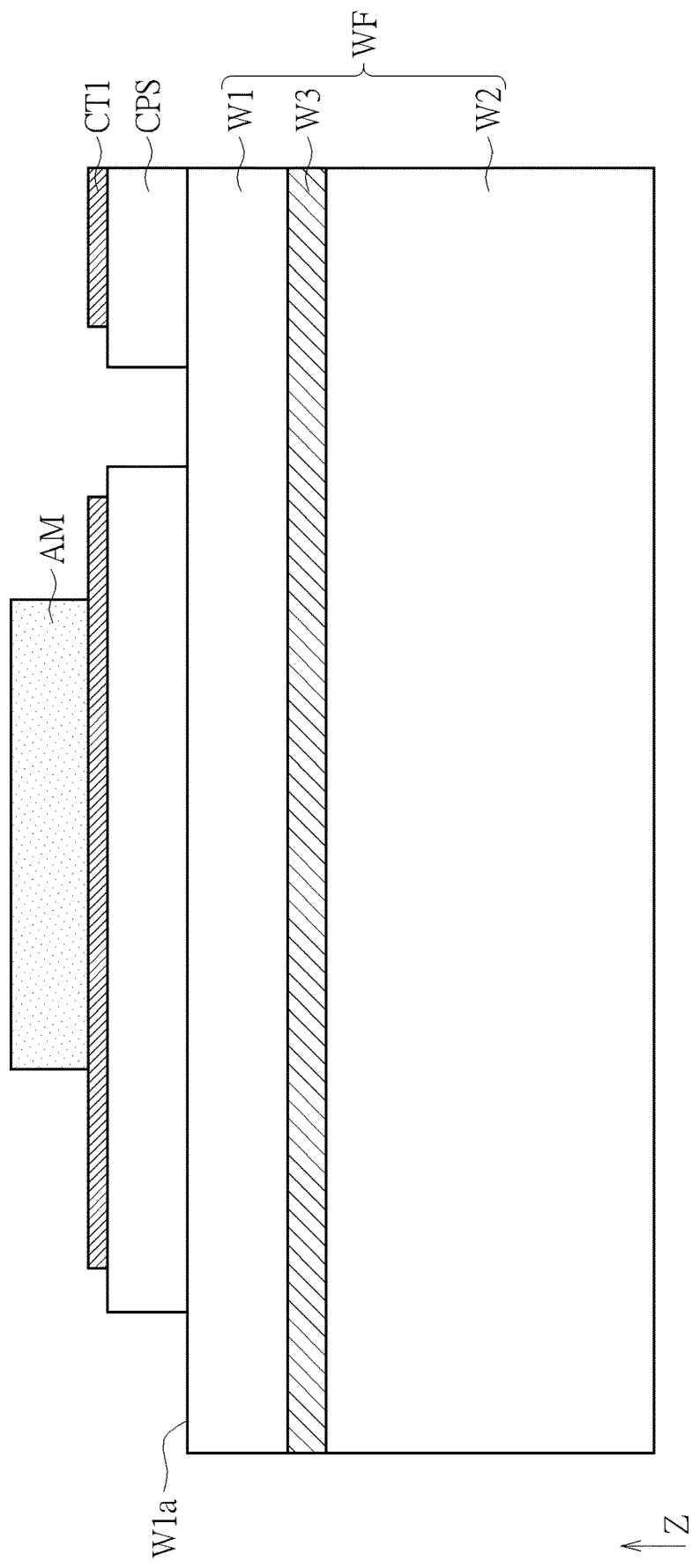

As shown in FIG. 25, the actuating material AM, the first conductive layer CT1 and the compensation oxide layer CPS may be patterned. In some embodiments, the actuating material AM, the first conductive layer CT1 and the compensation oxide layer CPS may be patterned in sequence.

Figure 26:
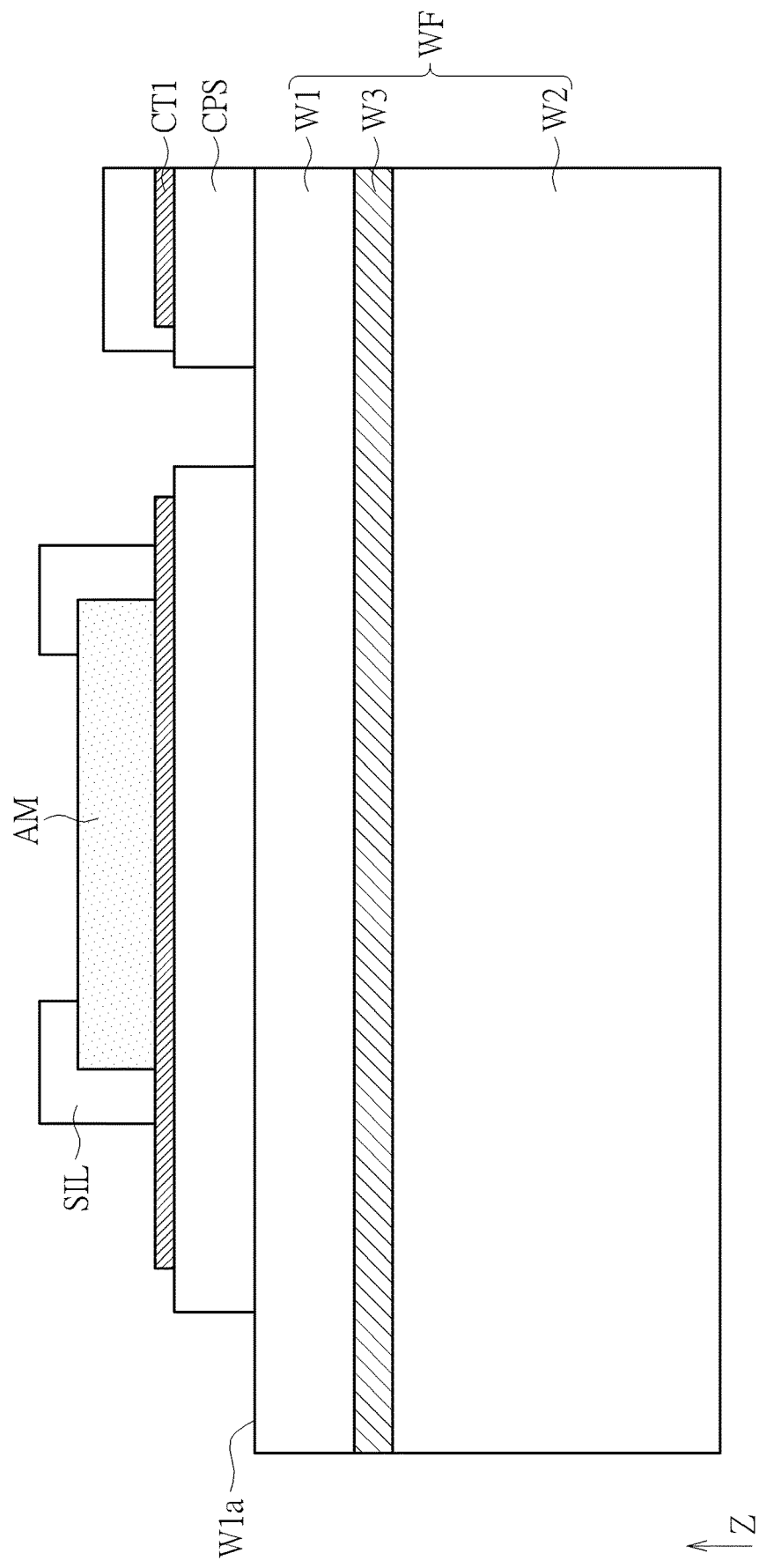

As shown in FIG. 26, a separating insulating layer SIL may be formed on the actuating material AM and be patterned. The thickness of the separating insulating layer SIL and the material of the separating insulating layer SIL may be designed based on requirement(s). For instance, the material of the separating insulating layer SIL may be oxide, but not limited thereto.

Figure 27:
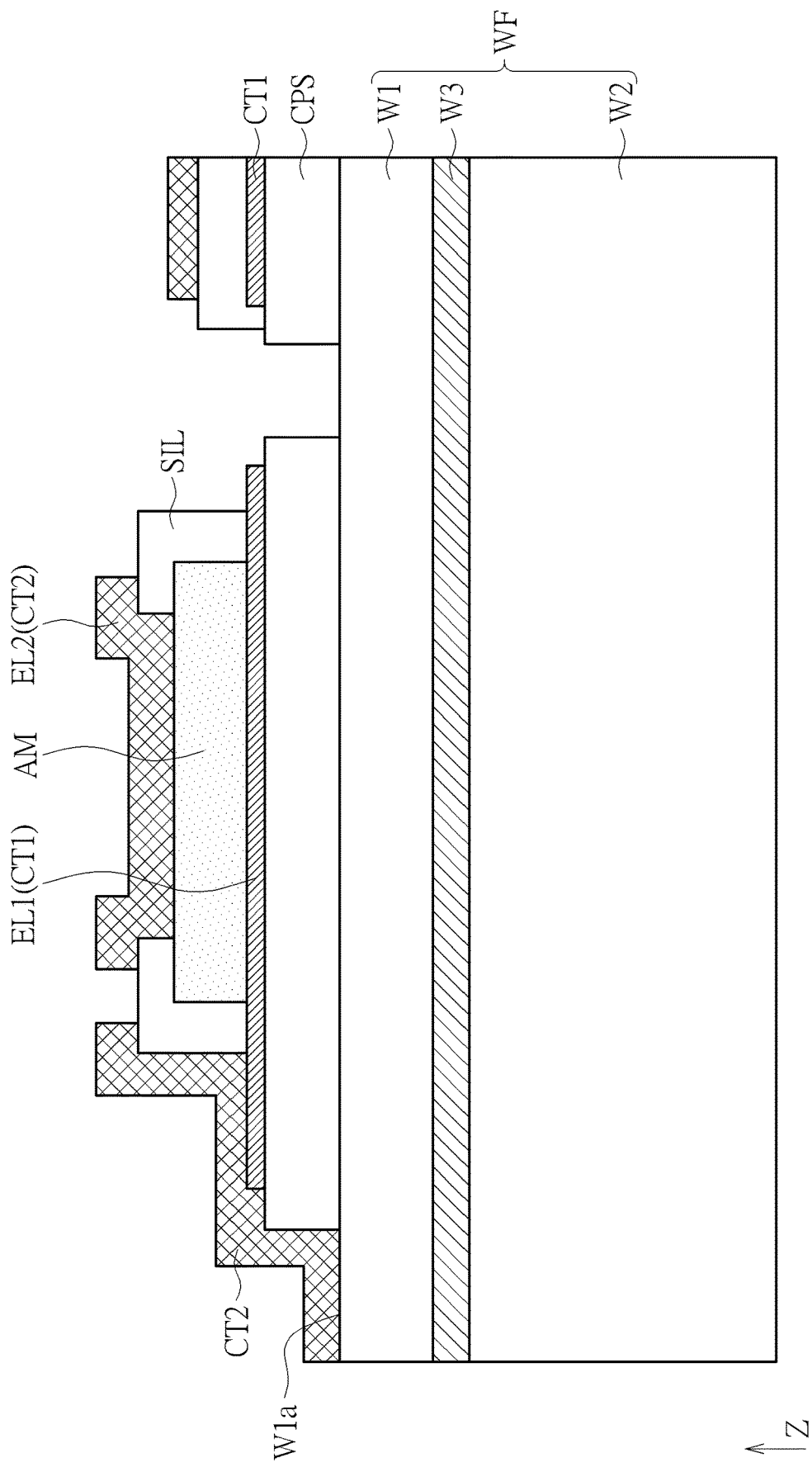

As shown in FIG. 27, a second conductive layer CT2 may be formed on the actuating material AM and the separating insulating layer SIL, and then, the second conductive layer CT2 may be patterned. The thickness of the second conductive layer CT2 and the material of the second conductive layer CT2 may be designed based on requirement(s). For instance, the second conductive layer CT2 may include metal (such as aurum), but not limited thereto.

The patterned first conductive layer CT1 functions as the first electrode EL1 for the actuator, the patterned second conductive layer CT2 functions as the second electrode EL2 for the actuator, and the actuating material AM, the first electrode EL1 and the second electrode EL2 may be components in the actuator (e.g., the first actuator 120 and/or the second actuator 220) in the device, so as to make the actuator be a piezoelectric actuator. For example, the first electrode EL1 and the second electrode EL2 are in contact with the actuating material AM, but not limited thereto.

In FIG. 27, the separating insulating layer SIL may be configured to separate at least a portion of the first conductive layer CT1 from at least a portion of the second conductive layer CT2.

Figure 28:
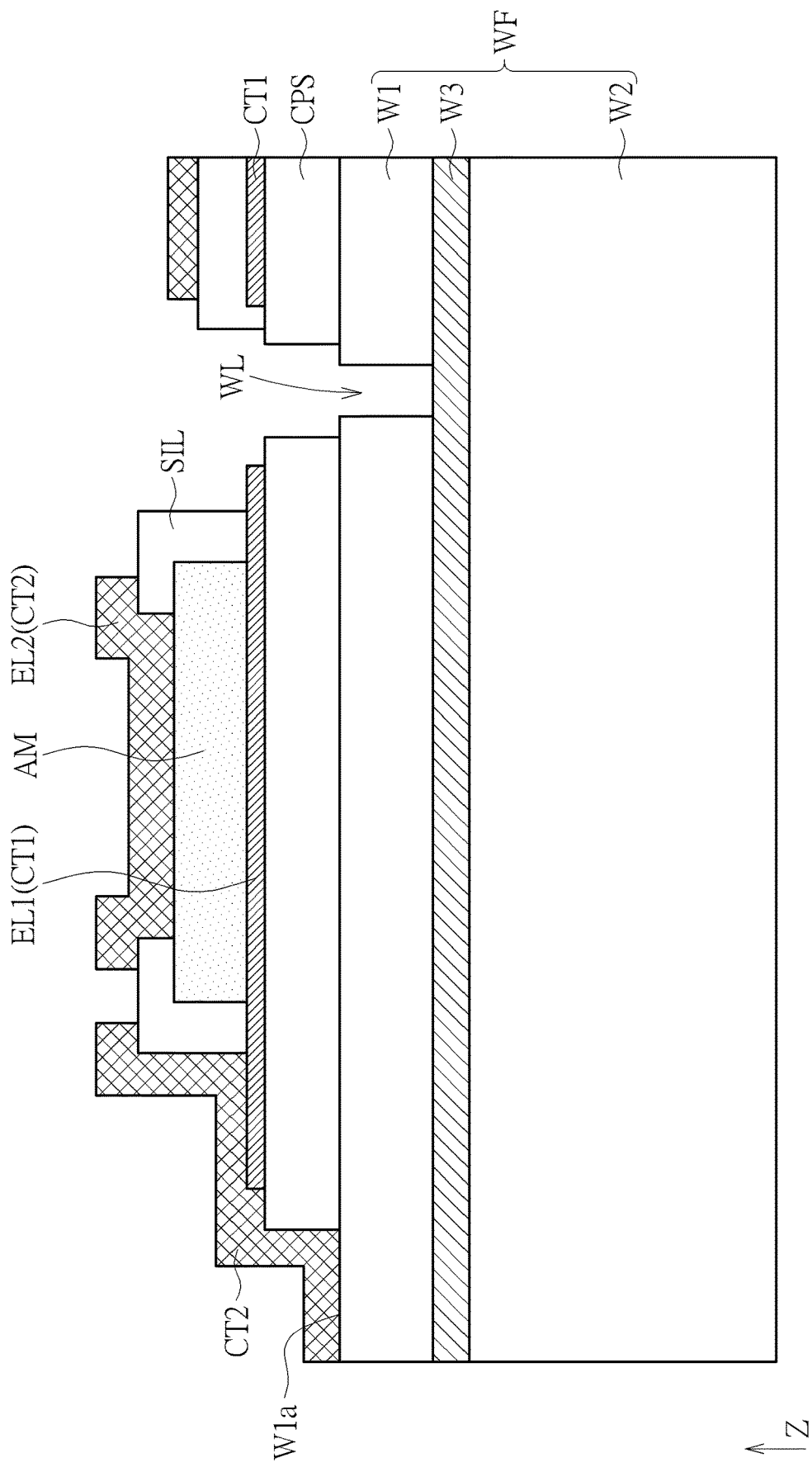

As shown in FIG. 28, the first layer W1 of the wafer WF may be patterned, so as to form a trench line WL. In FIG. 28, the trench line WL is a portion where the first layer W1 is removed. That is to say, the trench line WL is between two parts of the first layer W1.

Figure 29:
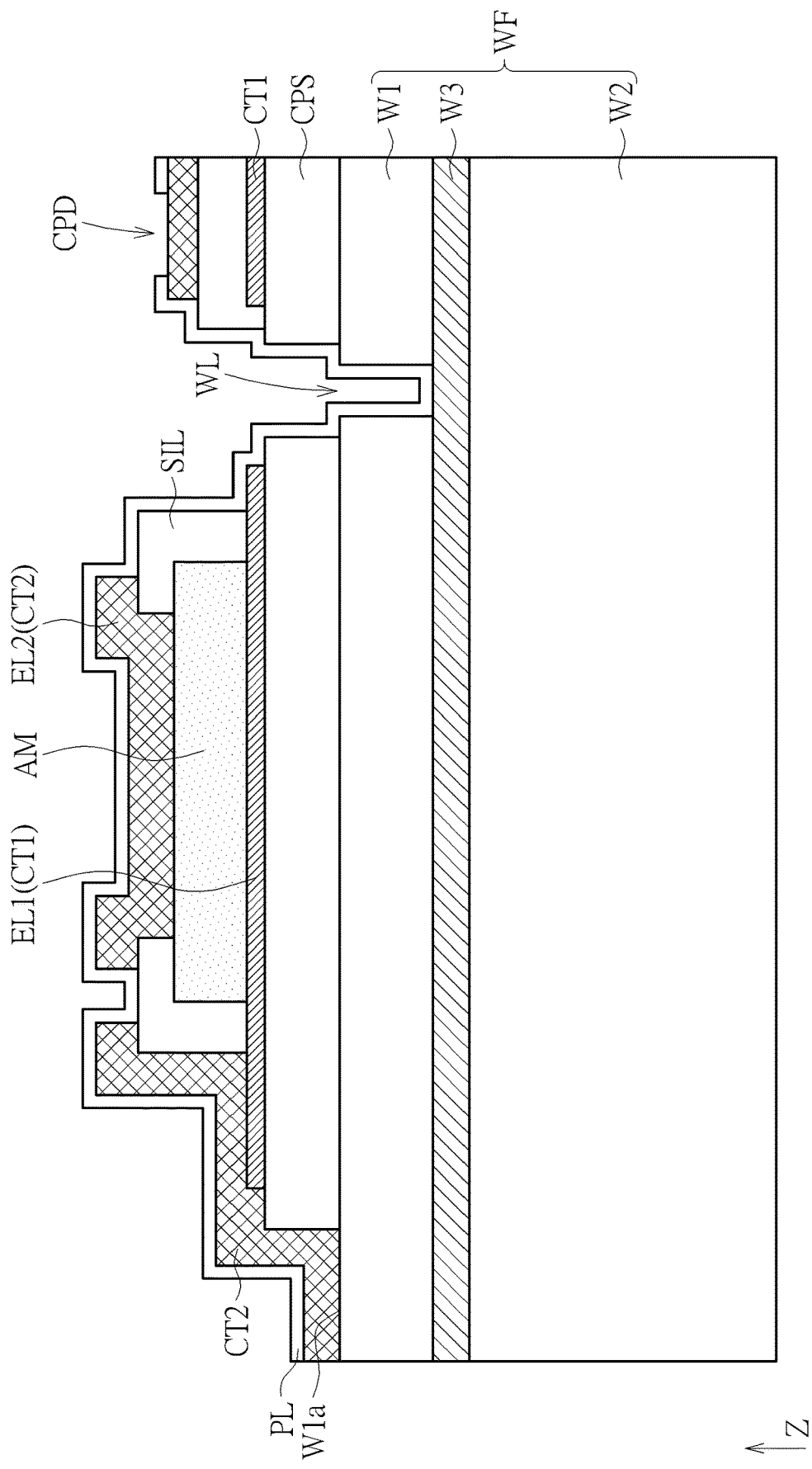

As shown in FIG. 29, a protection layer PL may be optionally formed on the second conductive layer CT2, so as to cover the wafer WF, the first conductive layer CT1, the actuating material AM, the separating insulating layer SIL and the second conductive layer CT2. The protection layer PL may include any suitable material, and may have suitable thickness.

In some embodiments, the protection layer PL may be configured to protect the actuator 120 from ambient exposure and to ensure the reliability/stability of the actuator 120, but not limited thereto. As shown in FIG. 29, a portion of the protection layer PL may be disposed inside the trench line WL.

Optionally, in FIG. 29, the protection layer PL may be patterned for exposing a portion of the second conductive layer CT2 and/or a portion of the first conductive layer CT1, so as to form a connecting pad CPD to be electrically connected to outer device.

Figure 30:
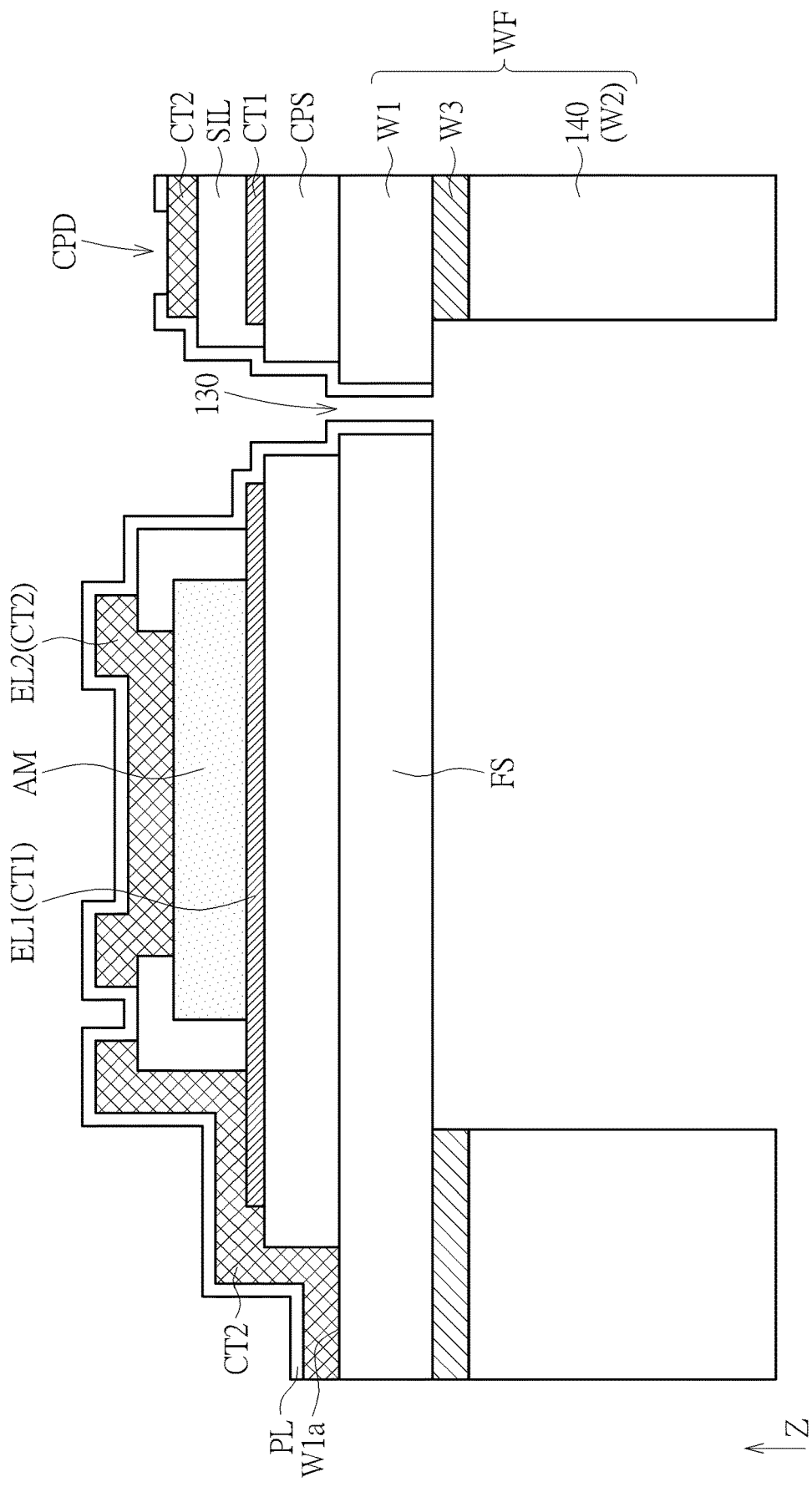

As shown in FIG. 30, the second layer W2 of the wafer WF may be patterned, so as to make the second layer W2 form at least one anchor structure 140 (and/or 240) and to make the first layer W1 form the film structure FS (e.g., including the first membrane 110 and/or the second membrane 210) anchored by the anchor structure(s) 140 (and/or 240), wherein the film structure FS includes the first membrane 110 and/or the second membrane 210. In another aspect, the film structure FS includes the first flap (the first portion) and the second flap (the second portion). In detail, the second layer W2 of the wafer WF may have a first part and a second part, the first part of the second layer W2 may be removed, and the second part of the second layer W2 may form the anchor structure 140 (and/or 240). Since the first part of the second layer W2 is removed, the first layer W1 forms the film structure FS. Namely, the components included in the film structure FS, such as the first membrane 110, the second membrane 210, the first flap and/or the second flap may be fabricated by the same process, where the same process represents the same sequence of steps illustrated in FIG. 24 to FIG. 30.

Optionally, in FIG. 30, since the insulating layer W3 of the wafer WF exists, after the second layer W2 of the wafer WF is patterned, a part of the insulating layer W3 corresponding to the first part of the second layer W2 may be removed also, so as to make the first layer W1 form the film structure FS, but not limited thereto.

In FIG. 30, since the first part of the second layer W2 is removed to make the first layer W1 form the film structure FS, the slit 130 is formed within and penetrates through the film structure FS because of the trench line WL. Since the slit 130 is formed because of the trench line WL, the width of the trench line WL may be designed based on the requirement of the slit 130. For example, the width of the trench line WL may be less than or equal to 5 less than or equal to 3 μm, or less than or equal to 2 μm, so as to make the slit 130 have the gap 130P with desire width, but not limited thereto. Moreover, since a portion of the protection layer PL may be disposed inside the trench line WL, the protection layer PL may make the width of the gap 130P of the slit 130 less than the width of the trench line WL.

Figure 31:
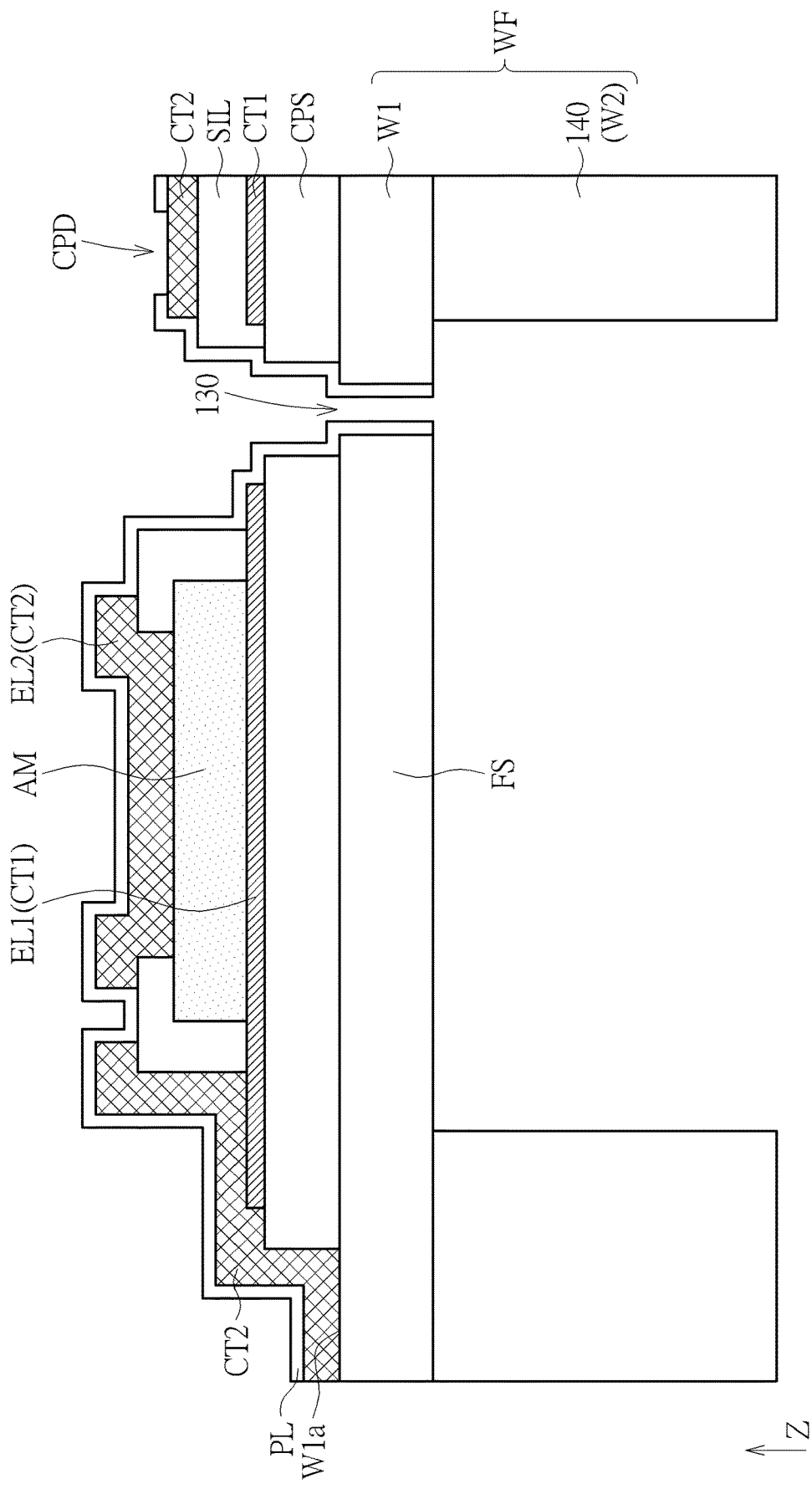
FIG. 31 is a schematic diagram illustrating a cross sectional view of a device according to an embodiment of the present invention.

FIG. 31 is a schematic diagram illustrating a cross sectional view of a device according to another embodiment of the present invention. In another embodiment, compared with the structure shown in FIG. 30, the structure shown in FIG. 31 does not have the insulating layer W3 of the wafer WF. Namely, the first layer W1 is directly formed on (in contact with) the second layer W2. As the result, the film structure FS is direct formed of the first layer W1 of the wafer WF owing to patterning the second layer W2 of the wafer WF. In this case, the first layer W1 (i.e., the film structure FS) may include an insulation layer including oxide, such as silicon dioxide, but not limited thereto.

Then, a base BS is provided, and the structure shown in FIG. 30 or the structure shown in FIG. 31 may be disposed on the base BS, so as to complete the manufacture of the device.

In the following, the details of package structures of the device(s) and their manufacturing method will be further exemplarily explained. Note that the device(s) in the package structure may be one of the aforementioned embodiments, a combination of different aforementioned embodiments or a combination of aforementioned embodiment(s) and other feature(s). Note that, the package structure may be disposed within the wearable sound device or to be disposed within the wearable sound device, such that the device disposed in the package structure may be disposed within the wearable sound device or to be disposed within the wearable sound device.

Figure 32:
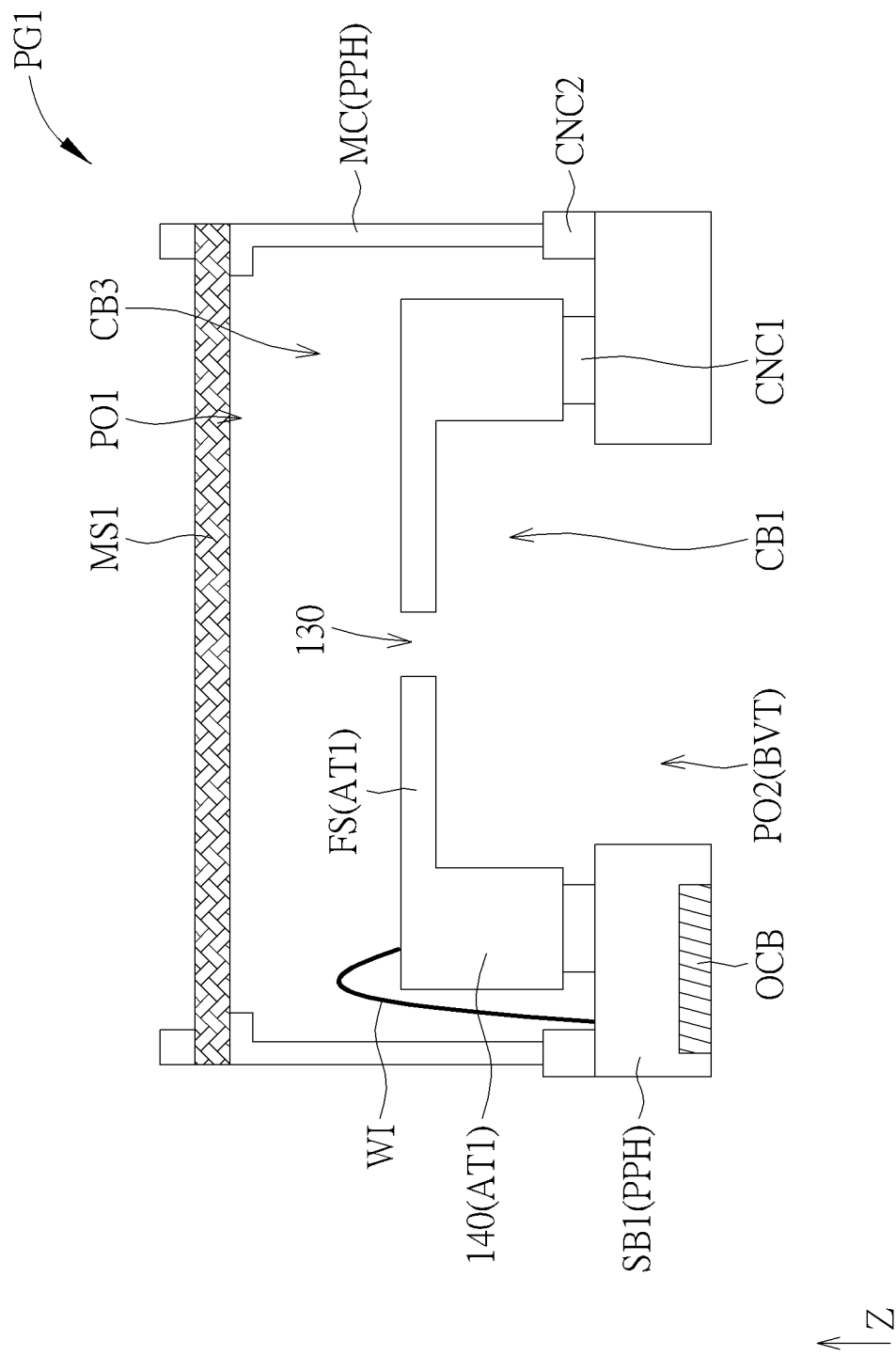
FIG. 32 is a schematic diagram illustrating a cross sectional view of a package structure of a device according to an embodiment of the present invention.

Referring to FIG. 32, FIG. 32 is a schematic diagram illustrating a cross sectional view of a package structure of a device according to an embodiment of the present invention. As shown in FIG. 32, the package structure PG1 includes at least one device (e.g., the device AT1). Note that the details of the device can be referred to the above, and thus, these will not be redundantly described.

The package structure PG1 may include a packaging housing PPH configured to protect the device AT1, and the device AT1 is disposed within the packaging housing PPH. In the present invention, the packaging housing PPH may be formed of at least one structure.

As shown in FIG. 32, the packaging housing PPH may include a first substrate SB1 serving as a bottom structure of the packaging housing PPH, wherein the device AT1 may be disposed on the first substrate SB1. The first substrate SB1 may be hard or flexible, wherein the first substrate SB1 may include silicon, germanium, glass, plastic, quartz, sapphire, metal, polymer (e.g., PI, PET), any other suitable material or a combination thereof. As an example, the first substrate SB1 may be a circuit board including a laminate (e.g., CCL), a LGA board or any other suitable board containing conductive material, but not limited thereto.

The device AT1 may be disposed on the first substrate SB1 through any suitable material. As shown in FIG. 32, at least one connecting component CNC1 may be disposed between the device AT1 and the first substrate SB1 for the connection between the device AT1 and the first substrate SB1. The connecting component CNC1 may include an insulating adhesive material and/or a conductive adhesive material, such as glue, epoxy, die attach film (DAF), dry film and/or solder, but not limited thereto.

For example (as shown in FIG. 32), the connecting component CNC1 may include the insulating adhesive material, and the device AT1 may be electrically connected to a conductive component (e.g., an inner bonding pad) of the first substrate SB1 by a conductive wire WI (i.e., the conductive wire WI is formed by a wire bonding process), but not limited thereto. For example (not shown in figures), the connecting component CNC1 may include the conductive adhesive material, and the device AT1 may be electrically connected to the conductive component (e.g., the inner bonding pad) of the first substrate SB1 by the connecting component CNC1 (e.g., a flip chip package), but not limited thereto.

As shown in FIG. 32, the packaging housing PPH may include a cap MC serving as a top structure and a sidewall structure of the packaging housing PPH, wherein the cap MC may be disposed on the first substrate SB1 to form and surround a cavity, and the device AT1 may be disposed in the cavity. The cap MC may include any suitable material such as metal, glass, silicon, germanium, plastic, polymer or a combination thereof, but not limited thereto. As shown in FIG. 32, the cap MC may be a one-piece structure, but not limited thereto.

Furthermore, the cap MC may be disposed on the first substrate SB1 through any suitable material. As shown in FIG. 32, at least one connecting component CNC2 may be disposed between the cap MC and the first substrate SB1 for the connection between the cap MC and the first substrate SB1. The connecting component CNC2 may include an insulating adhesive material and/or a conductive adhesive material, such as glue, epoxy, die attach film (DAF), dry film and/or solder, but not limited thereto.

Note that the film structure FS of the device AT1 may partition the cavity into two chambers CB1 and CB3, wherein the chamber CB1 may be between the film structure FS of the device AT1 and the bottom structure of the packaging housing PPH (i.e., the first substrate SB1), the chamber CB3 may be between the film structure FS of the device AT1 and the top structure of the packaging housing PPH (i.e., the cap MC).

The packaging housing PPH of the package structure PG1 may include a first packaging opening PO1 configured to be connected to the ear canal of the wearable sound device user. As shown in FIG. 32, the chamber CB3 may be connected to the ear canal of the wearable sound device user through the first packaging opening PO1. For example, a top part of the cap MC (i.e., the top structure of the packaging housing PPH) may have the first packaging opening PO1, but not limited thereto. For example, in FIG. 32, the film structure FS of the device AT1 may be between the first packaging opening PO1 and the first substrate SB1. For example, in FIG. 32, a normal direction of the first packaging opening PO1 may be parallel to the normal direction (e.g. direction Z) of the first substrate SB1, but not limited thereto.

The packaging housing PPH of the package structure PG1 may include a second packaging opening PO2 configured to be connected to the ambient of the wearable sound device. For example, the first substrate SB1 may have the second packaging opening PO2, but not limited thereto. The second packaging opening PO2 shown in FIG. 32 may be equivalent to the back vent BVT shown in FIG. 3A.

In the present invention, the vent 130T (e.g., the vent 130T shown in FIG. 4, FIG. 6, FIG. 8A, FIG. 11 or FIG. 12) of the device AT1 may be formed because of the slit 130 and the actuation of the actuator. In FIG. 32, two chambers CB1 and CB3 may be connected (i.e., the first packaging opening PO1 and the second packaging opening PO2 may be connected) when the vent 130T is formed, such that the ear canal of the wearable sound device user may be connected to the ambient of the wearable sound device through the vent 130T.

As shown in FIG. 32, the first substrate SB1 may have at least one outer connecting pad OCB situated on a side of the first substrate SB1 opposite to the device AT1, and the device AT1 is electrically connected to the outer connecting pad OCB. In the present invention, an outer device outside the package structure PG1 may transmit the signal(s) into the package structure PG1 through the outer connecting pad OCB.

Moreover, the package structure PG1 may optionally include at least one mesh coving the packaging opening, so as to reduce the adverse impact of the dust and/or the liquid on the device AT1 and/or other structures within the package structure PG1, but not limited thereto. As shown in FIG. 32, the package structure PG1 may include a first mesh MS1 covering the first packaging opening PO1, but not limited thereto. Furthermore, the package structure PG1 may further include a second mesh covering the second packaging opening PO2, but not limited thereto.

In addition, the package structure PG1 may be disposed in the housing structure HSS shown in FIG. 3A. Therefore, as shown in FIG. 3A and FIG. 32, the chamber CB3 may be a portion of the first volume VL1 in the housing structure HSS, and the chamber CB1 may be a portion of the second volume VL2 in the housing structure HSS.

Figure 33:
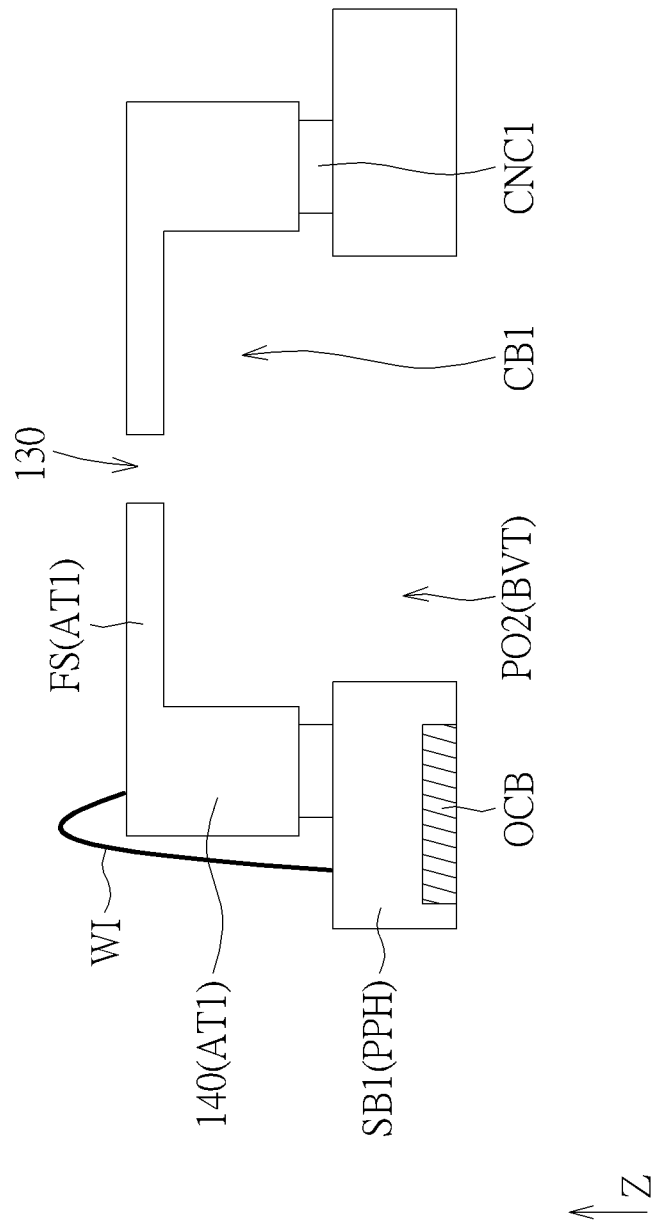
FIG. 33 to FIG. 34 are schematic diagrams illustrating structures at different stages of a method of manufacturing a package structure of a device according to the embodiment shown in FIG. 32.
Figure 34:
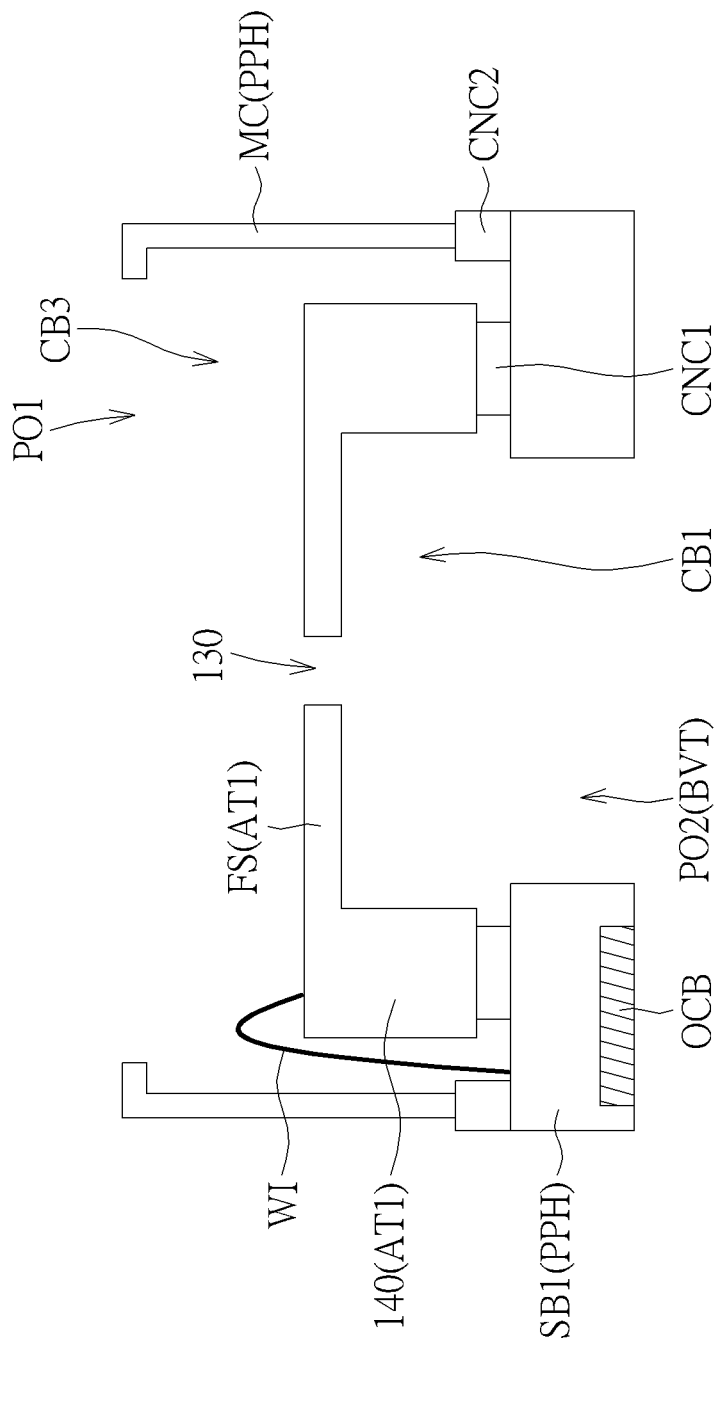

Referring to FIG. 32 to FIG. 34, FIG. 33 to FIG. 34 are schematic diagrams illustrating structures at different stages of a method of manufacturing a package structure of a device according to the embodiment shown in FIG. 32, and FIG. 32 shows the accomplished package structure of the device produced by this manufacturing method. As shown in FIG. 33, the first substrate SB1 (i.e., the bottom structure of the packaging housing PPH) is provided, and the device AT1 is disposed on the first substrate SB1 through the connecting component CNC1. Optionally, the wire bonding process may be performed, such that the conductive wire WI configured to be electrically connected between the device AT1 and the conductive component of the first substrate SB1 may be formed.

Note that the second packaging opening PO2 of the first substrate SB1 may be formed at any suitable step. For example, the second packaging opening PO2 may be formed within the first substrate SB1 before disposing the device AT1 on the first substrate SB1, but not limited thereto.

As shown in FIG. 34, the cap MC (i.e., the top structure and the sidewall structure of the packaging housing PPH) is disposed on the first substrate SB1 through the connecting component CNC2, so as to form the packaging housing PPH. In FIG. 34, the device AT1 is disposed within the packaging housing PPH.

Note that the first packaging opening PO1 of the cap MC may be formed at any suitable step. For example, the first packaging opening PO1 may be formed within the cap MC before disposing the cap MC on the first substrate SB1, but not limited thereto.

As shown in FIG. 32, the mesh is disposed to cover the packaging opening, so as to complete the manufacture of the package structure PG1. For example, in FIG. 32, the first mesh MS1 may be disposed to cover the first packaging opening PO1.

Figure 35:
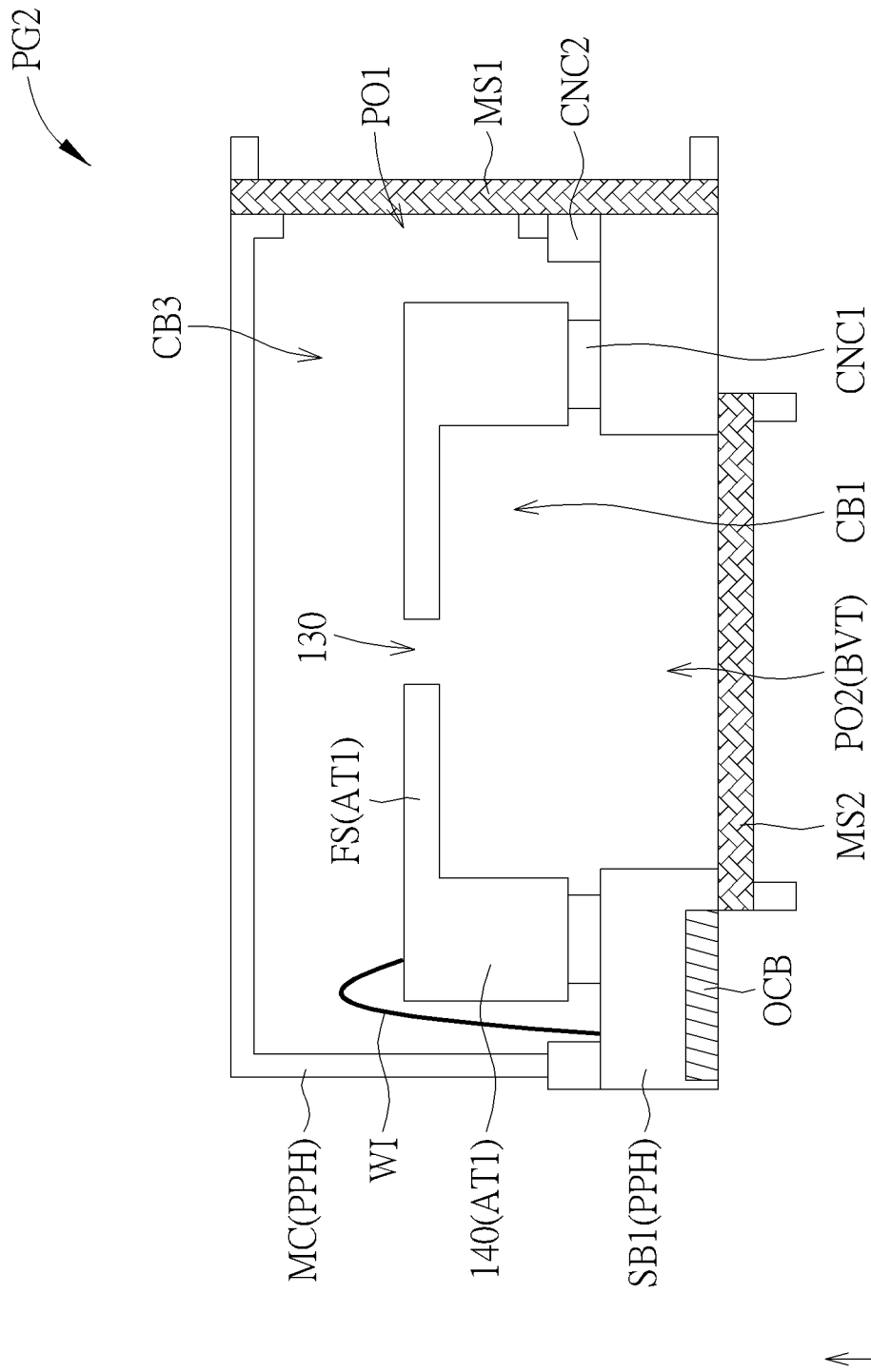
FIG. 35 is a schematic diagram illustrating a cross sectional view of a package structure of a device according to an embodiment of the present invention.

Referring to FIG. 35, FIG. 35 is a schematic diagram illustrating a cross sectional view of a package structure of a device according to an embodiment of the present invention. As shown in FIG. 35, compared with the package structure PG1 shown in FIG. 32, a different is the design of the first packaging opening PO1. In FIG. 35, a sidewall part of the cap MC (i.e., the sidewall structure of the packaging housing PPH) of the package structure PG2 may have the first packaging opening PO1, and the normal direction of the first packaging opening PO1 may be not parallel to the normal direction of the first substrate SB1, but not limited thereto.

As the embodiment shown in FIG. 35, a second mesh MS2 is disposed on the first substrate SB1 to cover the second packaging opening PO2, but not limited thereto.

Figure 36:
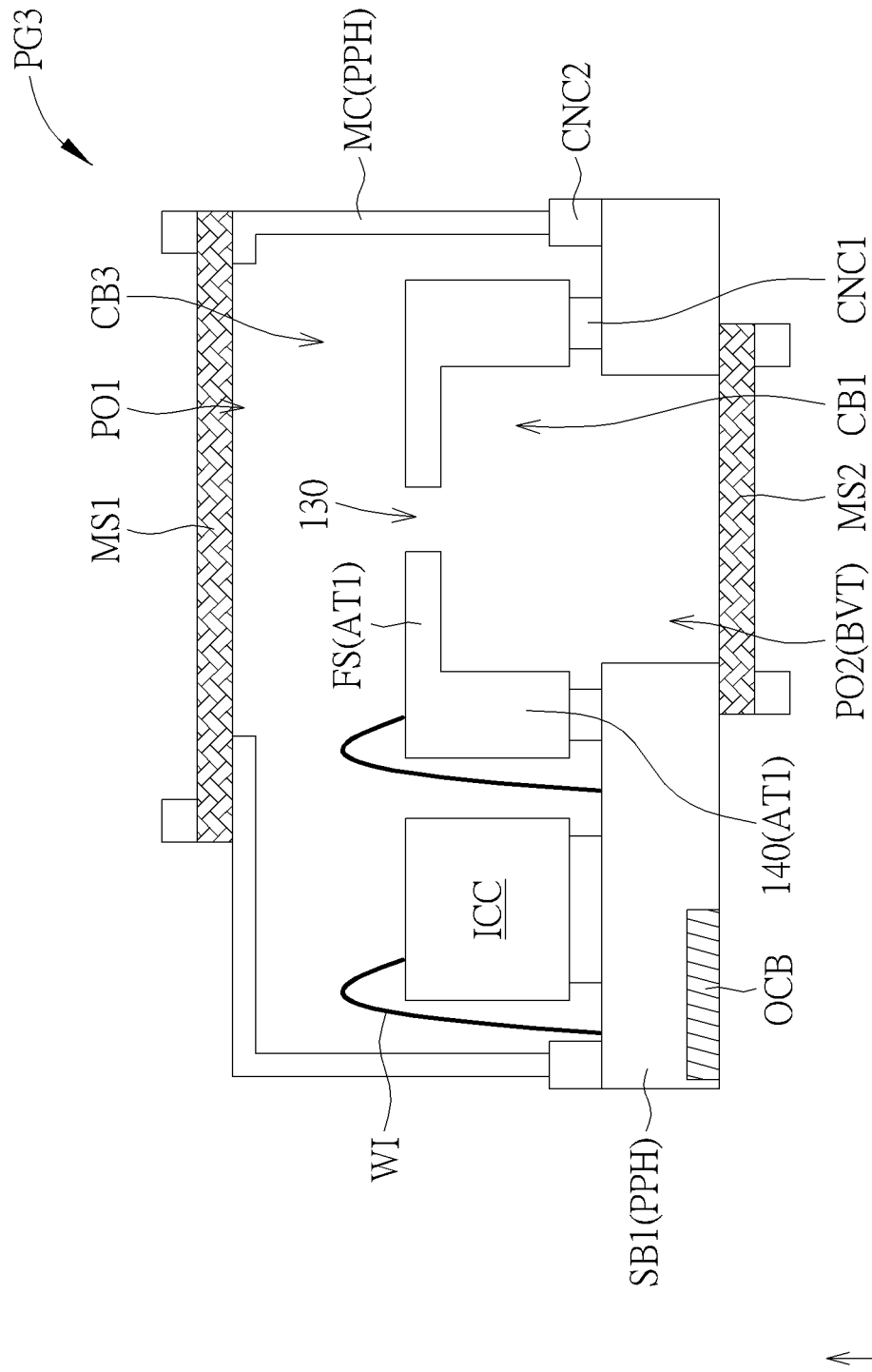
FIG. 36 is a schematic diagram illustrating a cross sectional view of a package structure of a device according to an embodiment of the present invention.

Referring to FIG. 36, FIG. 36 is a schematic diagram illustrating a cross sectional view of a package structure of a device according to an embodiment of the present invention. As shown in FIG. 36, compared with the package structure PG1 shown in FIG. 32, the package structure PG3 may further include an integrated circuit chip ICC disposed on the first substrate SB1. In FIG. 36, the integrated circuit chip ICC and the device AT1 may be disposed on the same side of the first substrate SB1, and the integrated circuit chip ICC does not overlap the device AT1 in the normal direction of the first substrate SB1, but not limited thereto. The integrated circuit chip ICC may have any suitable function. For instance, the integrated circuit chip ICC may be an application-specific integrated circuit (ASIC) chip, but not limited thereto.

Figure 37:
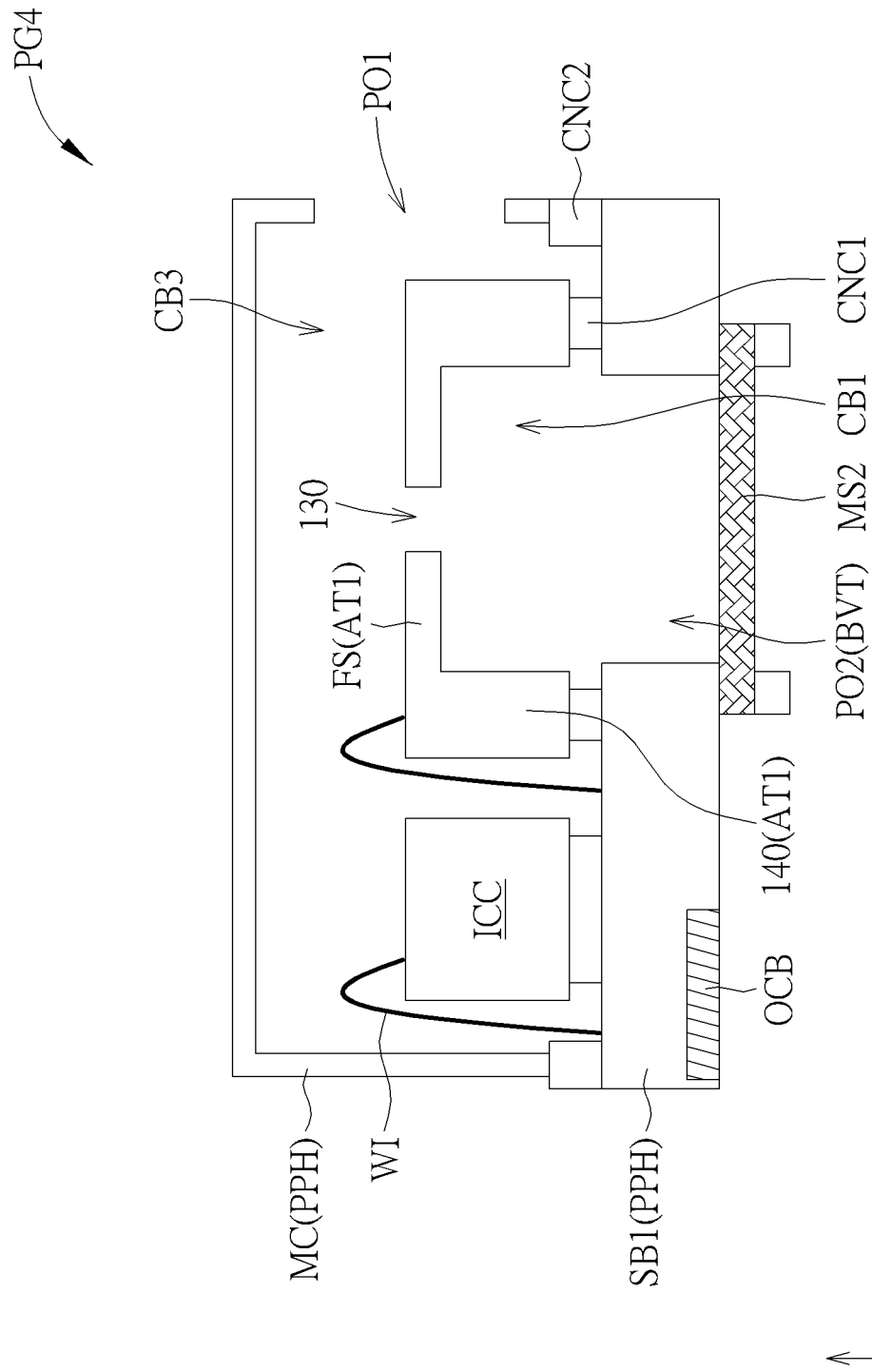
FIG. 37 is a schematic diagram illustrating a cross sectional view of a package structure of a device according to an embodiment of the present invention.

Referring to FIG. 37, FIG. 37 is a schematic diagram illustrating a cross sectional view of a package structure of a device AT1 according to an embodiment of the present invention. As shown in FIG. 37, compared with the package structure PG3 shown in FIG. 36, a different is the design of the first packaging opening PO1. In FIG. 37, the sidewall part of the cap MC (i.e., the sidewall structure of the packaging housing PPH) of the package structure PG4 may have the first packaging opening PO1, and the normal direction of the first packaging opening PO1 may be not parallel to the normal direction of the first substrate SB1, but not limited thereto.

Figure 38:
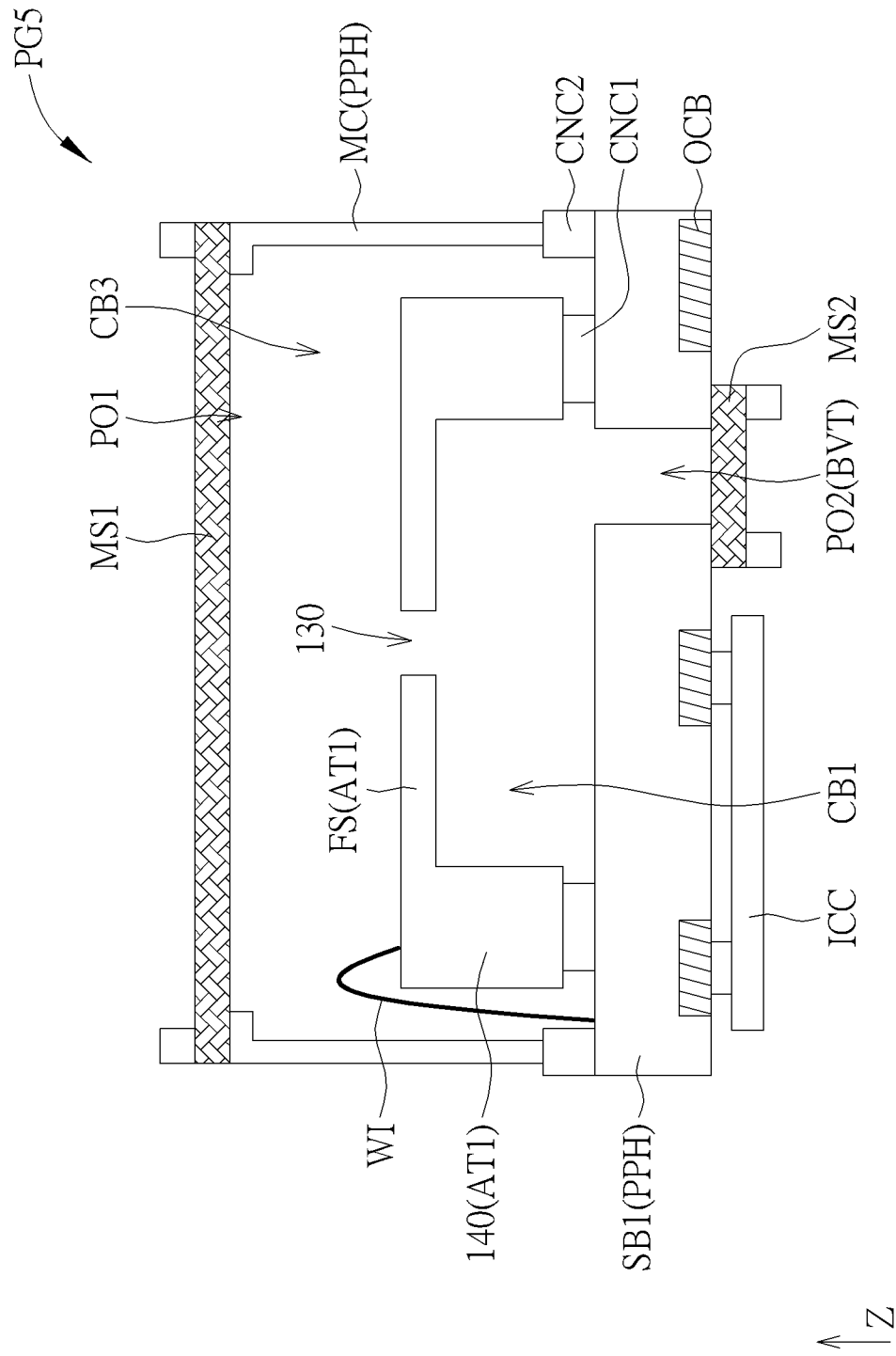
FIG. 38 is a schematic diagram illustrating a cross sectional view of a package structure of a device according to an embodiment of the present invention.

Referring to FIG. 38, FIG. 38 is a schematic diagram illustrating a cross sectional view of a package structure of a device according to an embodiment of the present invention. As shown in FIG. 38, compared with the package structure PG3 shown in FIG. 36, a different is the position of the integrated circuit chip ICC. The integrated circuit chip ICC of the package structure PG5 may overlap the device AT1 in the normal direction of the first substrate SB1. For example, in FIG. 38, the integrated circuit chip ICC and the device AT1 may be disposed on different sides of the first substrate SB1, but not limited thereto. Since the integrated circuit chip ICC of the package structure PG5 overlaps the device AT1 in the normal direction of the first substrate SB1, the lateral size of the package structure PG5 may be reduced.

Figure 39:
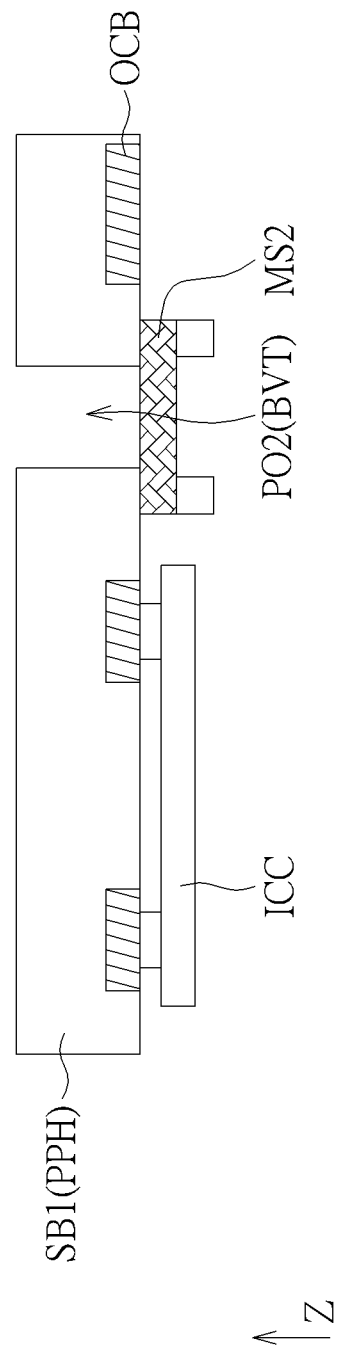
FIG. 39 to FIG. 43 are schematic diagrams illustrating structures at different stages of a method of manufacturing a package structure of a device according to the embodiment shown in FIG. 38.

Referring to FIG. 39 to FIG. 43, FIG. 39 to FIG. 43 are schematic diagrams illustrating structures at different stages of a method of manufacturing a package structure of a device according to the embodiment shown in FIG. 38, and FIG. 38 shows the accomplished package structure of the device produced by this manufacturing method. As shown in FIG. 39, the first substrate SB1 (i.e., the bottom structure of the packaging housing PPH) is provided, and the integrated circuit chip ICC and the second mesh MS2 are disposed on a side (e.g., a first side) of the first substrate SB1.

Note that the second packaging opening PO2 of the first substrate SB1 may be formed at any suitable step. For example, the second packaging opening PO2 may be formed within the first substrate SB1 before disposing the integrated circuit chip ICC and the second mesh MS2 on the first substrate SB1, but not limited thereto.

Figure 40:
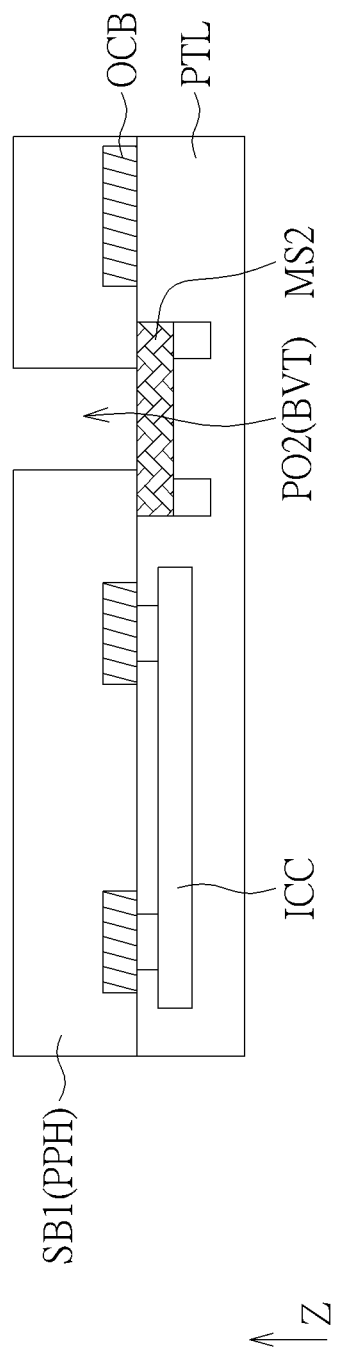

As shown in FIG. 40, a protecting layer PTL is disposed on the first side to cover the integrated circuit chip ICC and the second mesh MS2. The protecting layer PTL may be configured to protect the components covered by the protecting layer PTL, so as to reduce the damage on these components due to the subsequent manufacturing step(s). In addition, the protecting layer PTL may further provide a flat surface, so as to advantage the subsequent manufacturing step(s).

Figure 41:
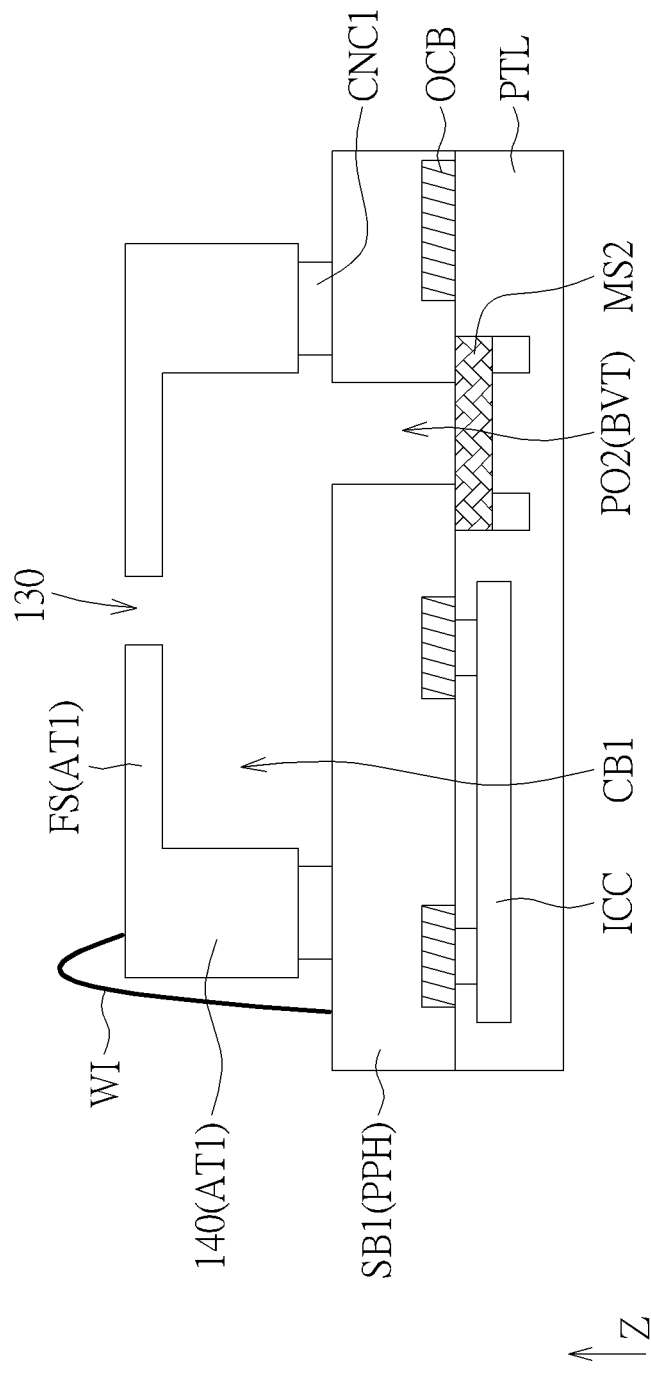

As shown in FIG. 41, the device AT1 is disposed on a second side of the first substrate SB1 through the connecting component CNC1. Optionally, the wire bonding process may be performed, such that the conductive wire WI configured to be electrically connected between the device AT1 and the conductive component of the first substrate SB1 may be formed.

Figure 42:
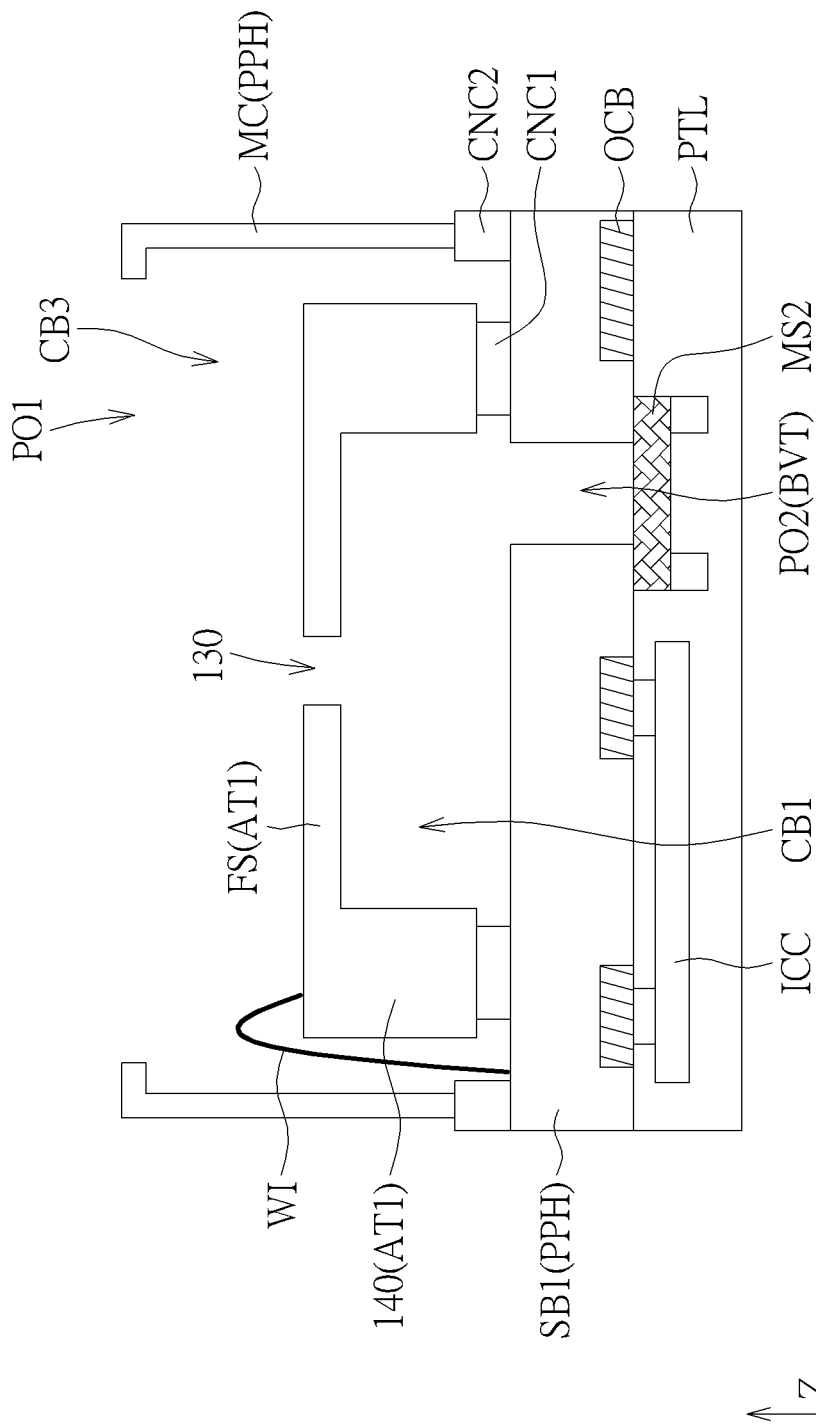

As shown in FIG. 42, the cap MC (i.e., the top structure and the sidewall structure of the packaging housing PPH) is disposed on the first substrate SB1 through the connecting component CNC2, so as to form the packaging housing PPH. In FIG. 42, the device AT1 is disposed within the packaging housing PPH.

Figure 43:
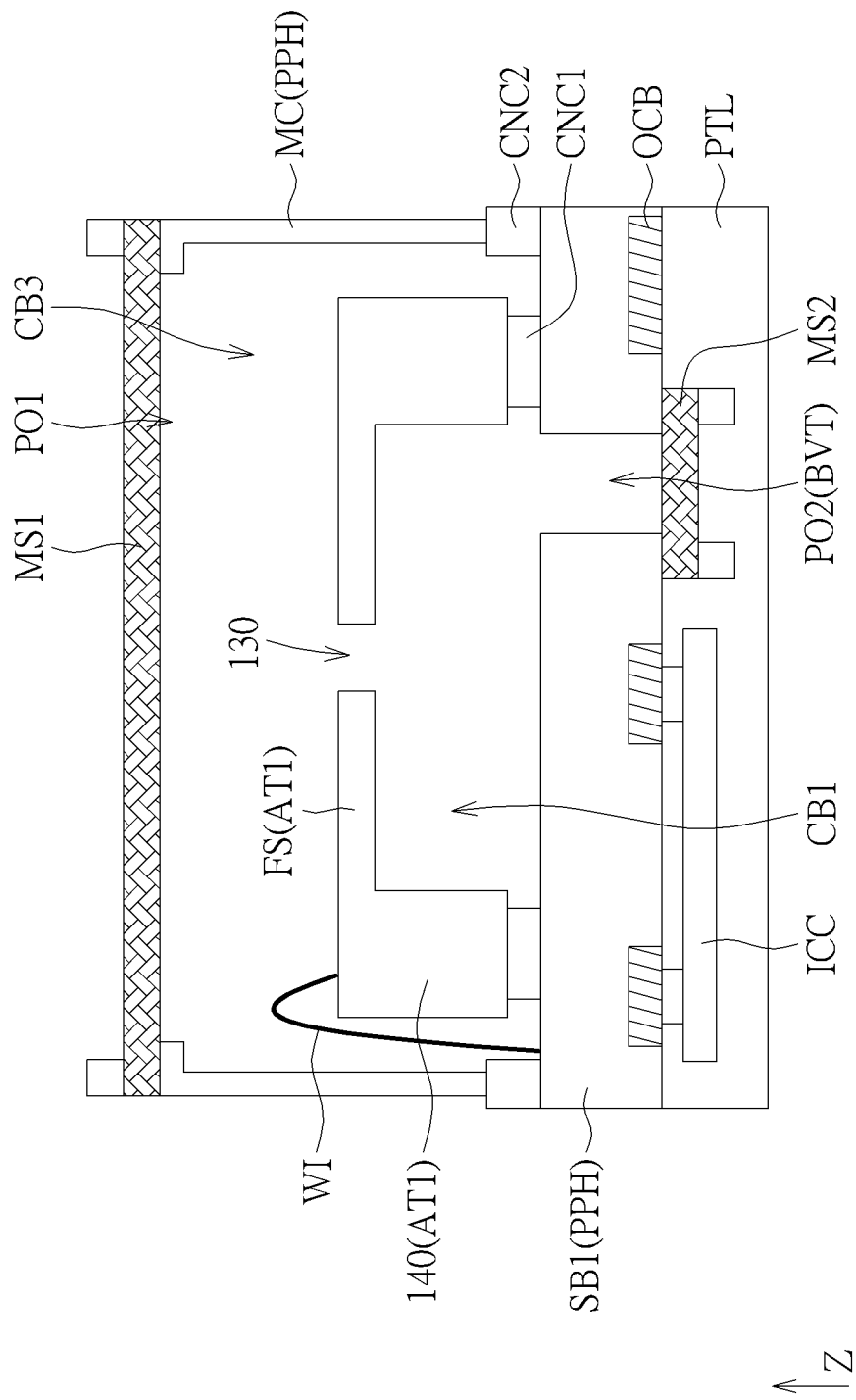

As shown in FIG. 43, the first mesh MS1 is disposed to cover the first packaging opening PO1.

As shown in FIG. 38, the protecting layer PTL is removed, so as to complete the manufacture of the package structure PG5.

In another embodiment (not shown in figures), the integrated circuit chip ICC of the package structure PG5 may overlap the device AT1 in the normal direction of the first substrate SB1, and the integrated circuit chip ICC and the device AT1 may be disposed on the same side of the first substrate SB1. For example, the device AT1 may be disposed on the bottom structure of the packaging housing PPH, and the integrated circuit chip ICC may be disposed on the top structure of the packaging housing PPH, but not limited thereto. For example, the device AT1 may be disposed on the integrated circuit chip ICC, but not limited thereto.

Figure 44:
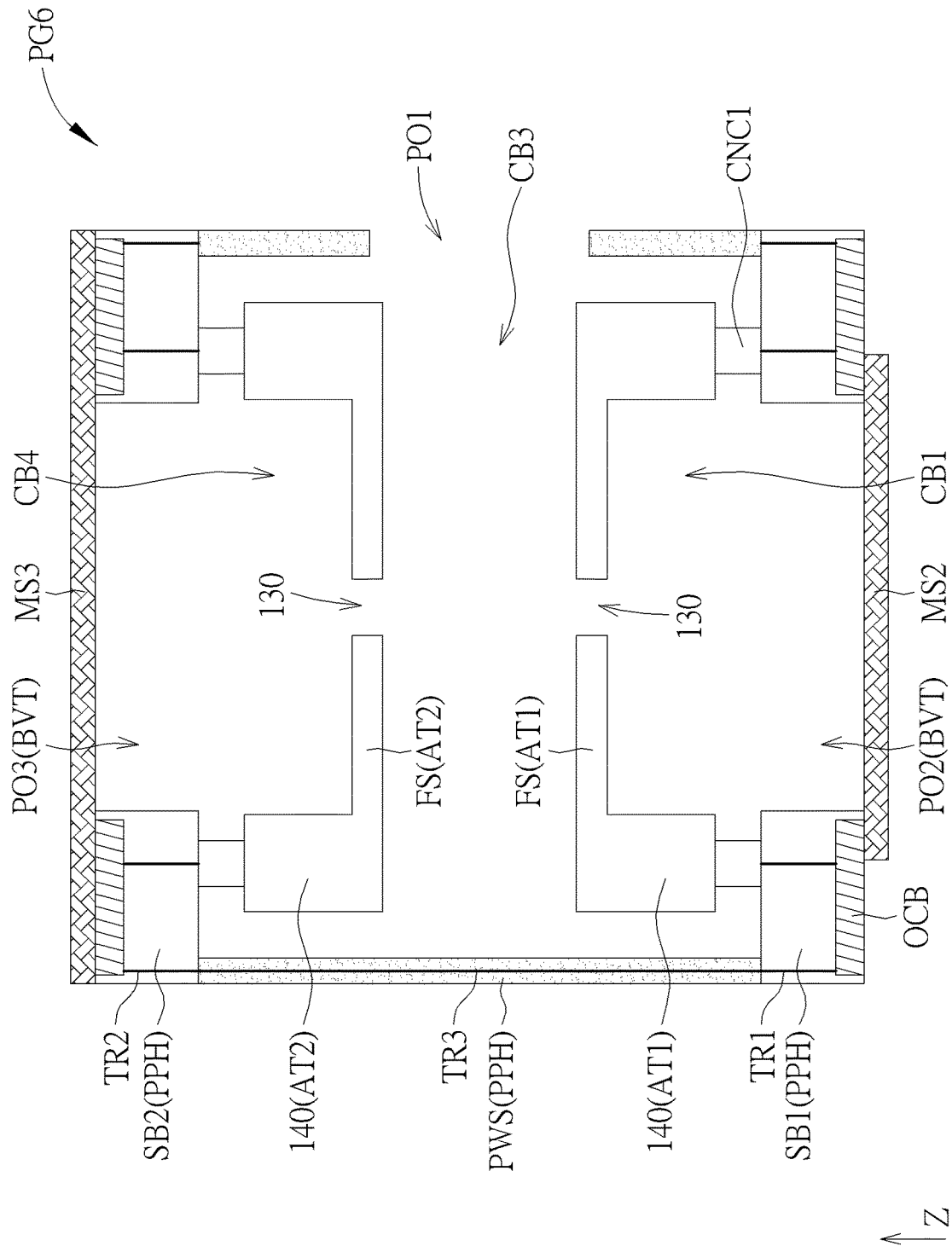
FIG. 44 is a schematic diagram illustrating a cross sectional view of a package structure of a device according to an embodiment of the present invention.

Referring to FIG. 44, FIG. 44 is a schematic diagram illustrating a cross sectional view of a package structure of a device according to an embodiment of the present invention. As shown in FIG. 44, compared with the package structure PG1 shown in FIG. 32, a difference is the design of the packaging housing PPH. In the package structure PG6 shown in FIG. 44, the packaging housing PPH includes a first substrate SB1, a second substrate SB2 opposite to the first substrate SB1 and at least one wall PWS disposed between the first substrate SB1 and the second substrate SB2, wherein the first substrate SB1 may serve as the bottom structure of the packaging housing PPH, the second substrate SB2 may serve as the top structure of the packaging housing PPH, and the wall PWS may serve as the sidewall structure of the packaging housing PPH.

The second substrate SB2 and the wall PWS may be hard or flexible, wherein the second substrate SB2 and the wall PWS may individually include silicon, germanium, glass, plastic, quartz, sapphire, metal, polymer (e.g., PI, PET), any other suitable material or a combination thereof. As an example, the second substrate SB2 and the wall PWS may be a circuit board including a laminate (e.g., CCL), a LGA board or any other suitable board containing conductive material, but not limited thereto.

Moreover, as shown in FIG. 44, the package structure PG6 may further include another device AT2 disposed within the packaging housing PPH, such that two devices AT1 and AT2 may be between the first substrate SB1 and the second substrate SB2. In FIG. 44, the device AT2 may be disposed on the second substrate SB2.

In some embodiments (as shown in FIG. 44), two devices AT1 and AT2 may be overlapped with each other in the normal direction of the first substrate SB1.

In FIG. 44, the first packaging opening PO1 may be formed within the wall PWS to be connected to a chamber CB3 between two devices AT1 and AT2, and a third packaging opening PO3 may be formed within the second substrate SB2 to be connected to a chamber CB4 between the device AT2 and the second substrate SB2, but not limited thereto. As shown in FIG. 44, the chamber CB3 may be connected to the ear canal of the wearable sound device user through the first packaging opening PO1, and the chamber CB1 and the chamber CB4 may be connected to the ambient of the wearable sound device through the second packaging opening PO2 and the third packaging opening PO3 respectively. Note that the second packaging opening PO2 and the third packaging opening PO3 shown in FIG. 44 may be equivalent to the back vent BVT shown in FIG. 3A.

As shown in FIG. 44, the vent 130T of the device AT1 and the vent of the device AT2 (e.g., the vent 130T shown in FIG. 4, FIG. 6, FIG. 8A, FIG. 11 or FIG. 12) may be formed because of the slit 130 and the actuation of the actuator. In FIG. 44, three chambers CB1, CB3 and CB4 may be connected (i.e., the first packaging opening PO1, the second packaging opening PO2 and the third packaging opening PO3 may be connected) when the vents 130T are formed simultaneously, such that the ear canal of the wearable sound device user may be connected to the ambient of the wearable sound device through the vent 130T.

As shown in FIG. 44, the package structure PG6 may optionally include a third mesh MS3 covering the third packaging opening PO3, but not limited thereto.

In addition, the conductive component of the first substrate SB1 may be electrically connected to the conductive component of the second substrate SB2 through the conductive component of the wall PWS. For example, a conductive trace TR1 of the first substrate SB1 may be electrically connected to a conductive trace TR2 of the second substrate SB2 through a conductive trace TR3 of the wall PWS, and the electrical connection between the conductive traces TR1, TR2 and TR3 may be achieved by a conductive element (not shown in figures), such as solder.

In some embodiments, two devices AT1 and AT2 may be electrically connected to the outer connecting pad OCB of the first substrate SB1. For example, in FIG. 44, the device AT1 may be electrically connected to the outer connecting pad OCB through the conductive trace TR1 of the first substrate SB1, and the device AT2 may be electrically connected to the outer connecting pad OCB through the conductive trace TR2 of the second substrate SB2, the conductive trace TR3 of the wall PWS and the conductive trace TR1 of the first substrate SB1, but not limited thereto.

Figure 45:
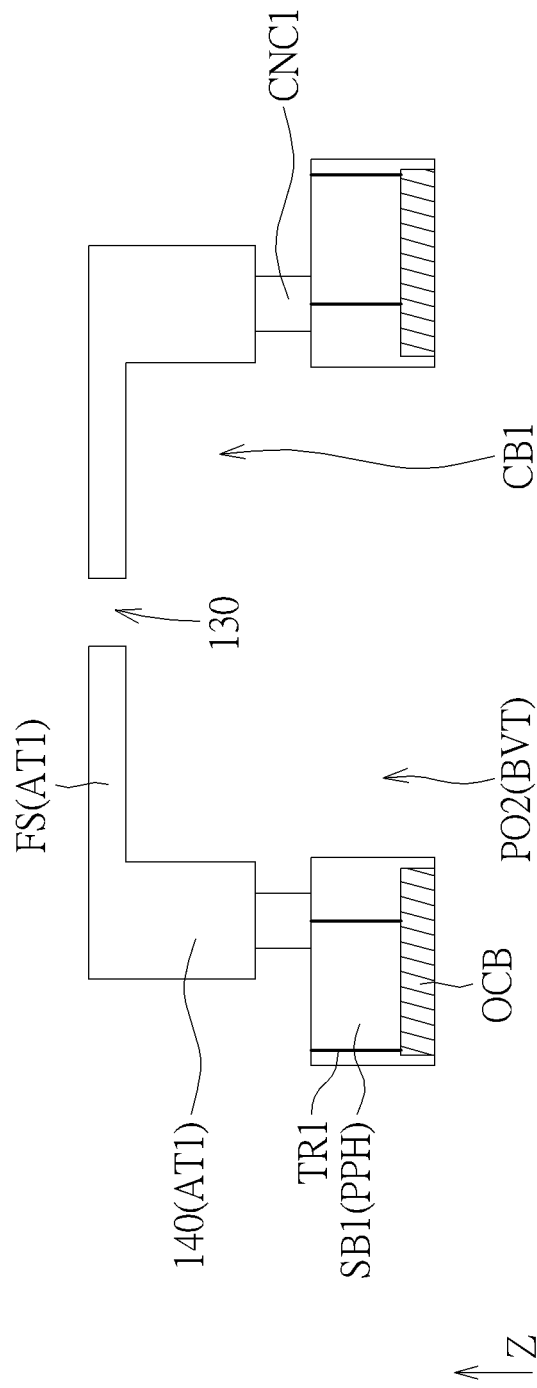
FIG. 45 to FIG. 47 are schematic diagrams illustrating structures at different stages of a method of manufacturing a package structure of a device according to the embodiment shown in FIG. 44.
Figure 46:
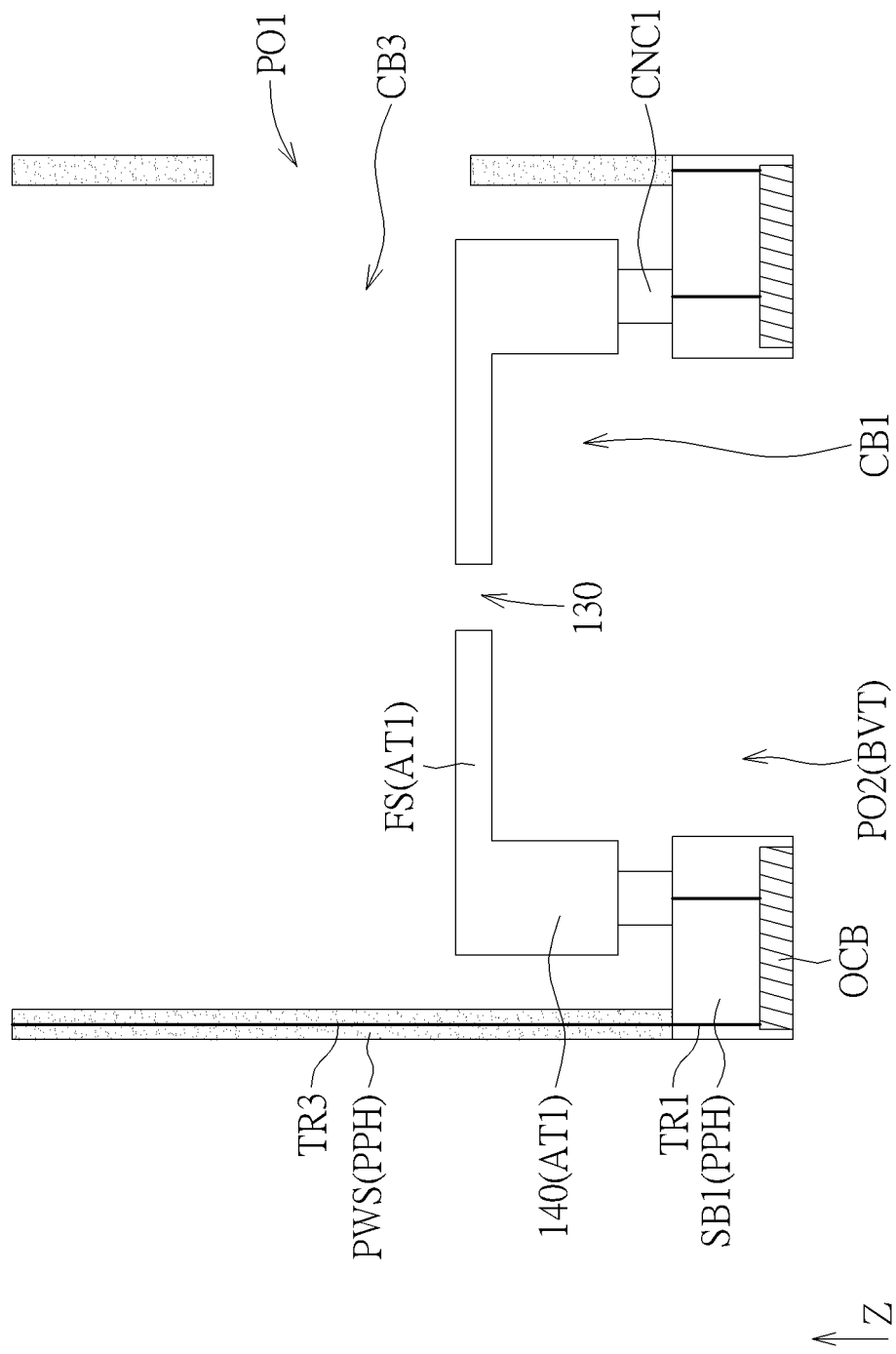
Figure 47:
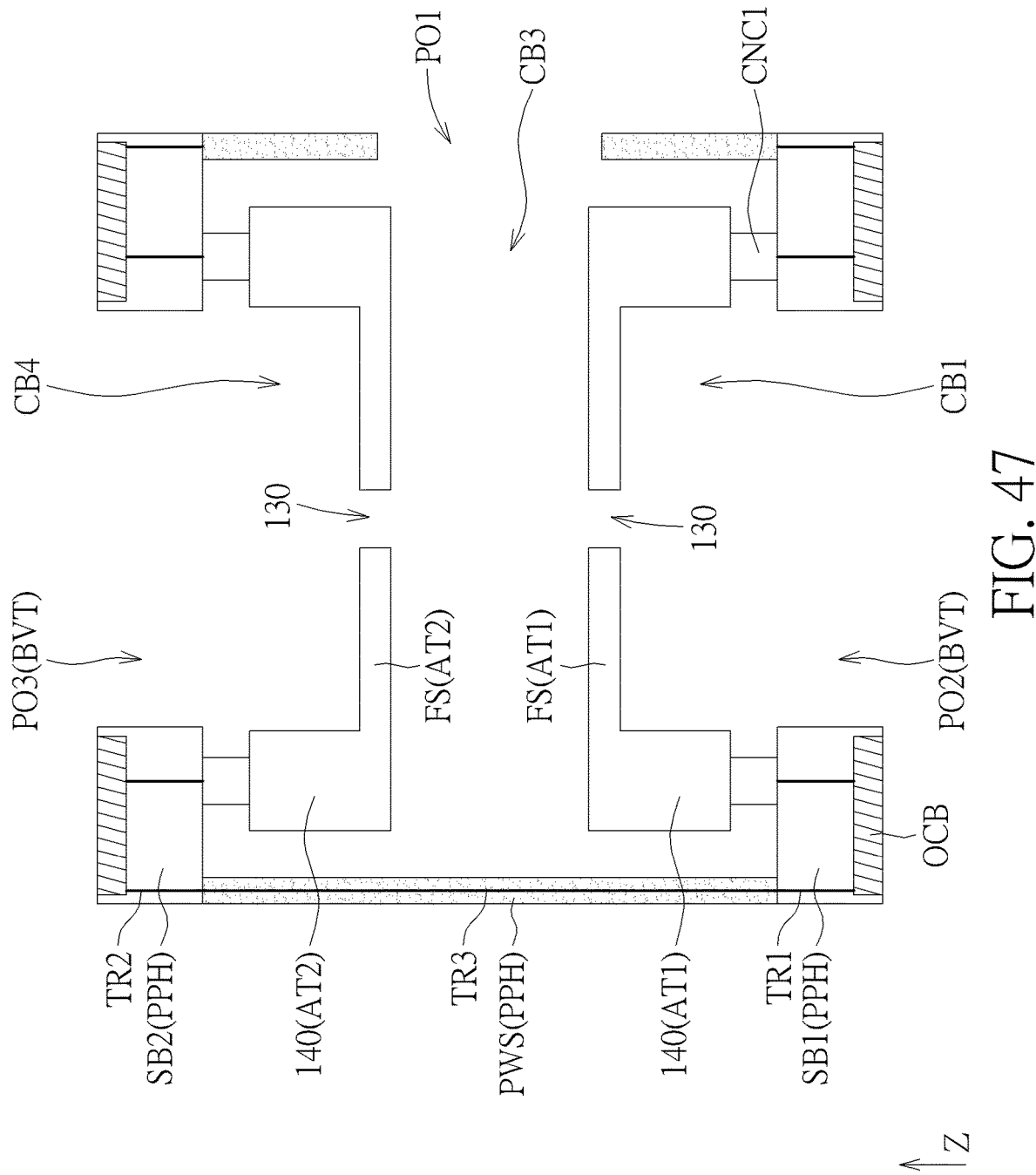

Referring to FIG. 45 to FIG. 47, FIG. 45 to FIG. 47 are schematic diagrams illustrating structures at different stages of a method of manufacturing a package structure PG6 of a device according to the embodiment shown in FIG. 44, and FIG. 44 shows the accomplished package structure of the device produced by this manufacturing method. As shown in FIG. 45, the first substrate SB1 (i.e., the bottom structure of the packaging housing PPH) is provided, and the device AT1 is disposed on the first substrate SB1 through the connecting component CNC1. Similarly, the second substrate SB2 (i.e., the top structure of the packaging housing PPH) is provided, and the device AT2 is disposed on the second substrate SB2 through the connecting component CNC1.

Note that the second packaging opening PO2 of the first substrate SB1 and the third packaging opening PO3 of the second substrate SB2 may be formed at any suitable step. For example, the second packaging opening PO2 may be formed within the first substrate SB1 before disposing the device AT1 on the first substrate SB1, and the third packaging opening PO3 may be formed within the second substrate SB2 before disposing the device AT2 on the second substrate SB2, but not limited thereto.

As shown in FIG. 46, the wall PWS (i.e., the sidewall structure of the packaging housing PPH) is disposed on the first substrate SB1. For example, the wall PWS may be disposed on the first substrate SB1 through the conductive element (not shown in figures), such as solder.

Note that the first packaging opening PO1 of the wall PWS may be formed at any suitable step. For example, the first packaging opening PO1 may be formed within the wall PWS before disposing the wall PWS on the first substrate SB1, but not limited thereto.

As shown in FIG. 47, the second substrate SB2 and the device AT2 is disposed on the first substrate SB1 and the wall PWS, such that two devices AT1 and AT2 are between the first substrate SB1 and the second substrate SB2.

As shown in FIG. 44, the second mesh MS2 and the third mesh MS3 are disposed to cover the second packaging opening PO2 and the third packaging opening PO3 respectively.

In summary, because of the existence of the slit, the device may generate the acoustic wave and form the vent for suppressing the occlusion effect in the first mode, and the device may not form the vent in the second mode. That is to say, the slit serves as the dynamic front vent of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for a device, comprising:
providing a wafer, wherein the wafer comprises a first layer and a second layer;
forming and patterning an actuating material formed on a first side of the wafer;
patterning the first layer of the wafer, so as to form a trench line; and
removing a first part of the second layer of the wafer,
wherein a second part of the second layer forms at least one anchor structure, the patterned first layer forms a film structure anchored by the at least one anchor structure, and the film structure comprises a membrane,
wherein a slit is formed within and penetrates through the membrane because of the trench line,
wherein the film structure is configured to be actuated to form a vent temporarily, and the vent is formed because of the slit,
wherein the device is disposed within a wearable sound device or to be disposed within the wearable sound device, and the film structure partitions a space into a first volume to be connected to an ear canal of a wearable sound device user and a second volume to be connected to an ambient of the wearable sound device,
wherein the ear canal and the ambient are to be connected via the vent temporarily opened,
wherein the slit divides the membrane into a first membrane portion and a second membrane portion, the first membrane portion is actuated to have a first displacement, and the second membrane portion is actuated to have a second displacement, and
wherein over a segment of the slit, a difference between the first displacement of the first membrane portion and the second displacement of the second membrane portion is larger than a thickness of the membrane, and the vent is formed over the segment of the slit.

2. The manufacturing method of claim 1, wherein an insulating layer is formed between the first layer and the second layer within the wafer, and the manufacturing method further comprises
removing a part of the insulating layer, such that the slit penetrates through the film structure.

3. The manufacturing method of claim 1, wherein the first layer is directly formed on the second layer.

4. The manufacturing method of claim 3, wherein the first layer comprises an insulation layer.

5. The manufacturing method of claim 1, further comprising:
forming and patterning a first conductive layer between the actuating material and the first layer of the wafer,
wherein the patterned first conductive layer functions as a first electrode for an actuator.

6. The manufacturing method of claim 1, further comprising:
forming and patterning a second conductive layer on the actuating material,
wherein the patterned second conductive layer functions as a second electrode for an actuator.

7. The manufacturing method of claim 1, wherein a net air movement produced due to forming the vent is substantially zero.

8. The manufacturing method of claim 1, wherein the device is disposed within a packaging housing comprising a first substrate to form a package structure, and the device is disposed on the first substrate.

9. The manufacturing method of claim 8, wherein the packaging housing further comprises at least one wall and a second substrate, the second substrate is opposite to the first substrate, and at least one wall is between the first substrate and the second substrate.

10. The manufacturing method of claim 8, wherein another device is disposed within the packaging housing, the packaging housing comprises a second substrate opposite to the first substrate, and the another device is disposed on the second substrate.

* * * * *